(12) United States Patent
Adkisson et al.

(10) Patent No.: US 7,759,755 B2
(45) Date of Patent: Jul. 20, 2010

(54) ANTI-REFLECTION STRUCTURES FOR CMOS IMAGE SENSORS

(75) Inventors: James W. Adkisson, Jericho, VT (US); John J. Ellis-Monaghan, Grand Isle, VT (US); Jeffrey P. Gambino, Westford, VT (US); Charles F. Musante, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 12/120,413

(22) Filed: May 14, 2008

(65) Prior Publication Data

US 2009/0283807 A1  Nov. 19, 2009

(51) Int. Cl.
  *H01L 31/112* (2006.01)
  *H01L 31/0216* (2006.01)
(52) U.S. Cl. ............... 257/436; 257/59; 257/72; 257/222; 257/229; 257/258; 257/292; 257/E31.079; 257/E31.123
(58) Field of Classification Search .......... 257/59, 257/72, 222, 229, 258, 292, 436, E31.079, 257/E31.123
See application file for complete search history.

(56) References Cited

U.S. PATENT DOCUMENTS

| 4,478,873 A | 10/1984 | Masso et al. |
| 4,842,824 A | 6/1989 | Ono |
| 4,866,696 A | 9/1989 | Longman et al. |
| 4,928,132 A | 5/1990 | Pettigrew et al. |
| 5,007,689 A | 4/1991 | Kelly et al. |
| 5,334,342 A | 8/1994 | Harker et al. |
| 5,548,257 A | 8/1996 | Caplan et al. |
| 5,573,339 A | 11/1996 | Woskov et al. |
| 5,779,924 A | 7/1998 | Krames et al. |
| 5,785,426 A | 7/1998 | Woskov et al. |
| 6,023,063 A | 2/2000 | Norton |
| 6,088,505 A | 7/2000 | Hobbs |
| 6,175,442 B1 | 1/2001 | Booth, Jr. et al. |

(Continued)

FOREIGN PATENT DOCUMENTS

EP  0288140 A2  2/1988

(Continued)

OTHER PUBLICATIONS

C.G. Bernhard, "Structural and functional adaptation in a visual system", Endeavor, 26, 1967, pp. 79-84.

(Continued)

*Primary Examiner*—Victor A Mandala
(74) *Attorney, Agent, or Firm*—Scully, Scott, Murphy & Presser, P.C.; Anthony J Canale

(57) ABSTRACT

Optical structures having an array of protuberances between two layers having different refractive indices are provided. The array of protuberances has vertical and lateral dimensions less than the wavelength range of lights detectable by a photodiode of a CMOS image sensor. The array of protuberances provides high transmission of light with little reflection. The array of protuberances may be provided over a photodiode, in a back-end-of-line interconnect structure, over a lens for a photodiode, on a backside of a photodiode, or on a window of a chip package.

16 Claims, 38 Drawing Sheets

U.S. PATENT DOCUMENTS

| | | | |
|---|---|---|---|
| 6,185,019 B1 | 2/2001 | Hobbs et al. | |
| 6,201,257 B1 * | 3/2001 | Stettner et al. | 257/10 |
| 6,255,038 B1 | 7/2001 | Hobbs | |
| 6,285,817 B1 | 9/2001 | Hobbs | |
| 6,326,723 B1 | 12/2001 | Raj et al. | |
| 6,356,389 B1 | 3/2002 | Nilsen et al. | |
| 6,388,372 B2 * | 5/2002 | Raj et al. | 313/461 |
| 6,570,710 B1 | 5/2003 | Nilsen et al. | |
| 6,750,912 B1 | 6/2004 | Tennant et al. | |
| 6,891,677 B2 | 5/2005 | Nilsen et al. | |
| 7,164,514 B2 | 1/2007 | Raguin | |
| 7,268,948 B2 | 9/2007 | Matsuo et al. | |
| 7,400,439 B2 * | 7/2008 | Holman | 359/298 |
| 7,576,361 B2 * | 8/2009 | Agranov et al. | 257/66 |
| 2002/0044351 A1 | 4/2002 | Nilsen | |
| 2004/0027676 A1 | 2/2004 | Nilsen | |
| 2004/0169791 A1 | 9/2004 | Nilsen | |
| 2005/0179962 A1 | 8/2005 | Williamson | |
| 2007/0090419 A1 | 4/2007 | Lee | |
| 2009/0286346 A1 * | 11/2009 | Adkisson et al. | 438/65 |

FOREIGN PATENT DOCUMENTS

| | | |
|---|---|---|
| EP | 0288140 A3 | 2/1988 |
| EP | 0288140 B1 | 2/1988 |
| JP | 62114139 A | 5/1987 |
| JP | 2003275230 A | 9/2003 |
| JP | 2003302532 A | 10/2003 |
| JP | 2003344855 A | 12/2003 |
| JP | 2004258364 A | 9/2004 |
| JP | 2005099467 A | 4/2005 |
| JP | 2004184298 | 7/2006 |
| JP | 2007156017 | 6/2007 |

OTHER PUBLICATIONS

S.A. Boden et al., "Bio-Mimetic Subwavelength Surfaces for Near-Zero Reflection Sunrise to Sunset", 2006 IEEE, pp. 1358-1361.

C. Max Hsieh et al., "Fabrication of Wafer-level Antireflective Structures in Optoelectronic Applications", 2007 IEEE, pp. 185-186.

Paul F. Nealey et al., "Self-assembling resists for nanlithography", IEDM Technical Digest, 2005, Digital Object Identifier 10.1109/IEDM.2005.1609349.

S. J. Wilson et al., "The optical properties of 'moth eye' antireflection surfaces", Optica Acta, 192, vol. 29, No. 7, 1982, pp. 993-1009.

IBM Technical Disclosure Bulletin, "Mechanically Produced Anti-Reflection Surface", Feb. 1979, p. 3793.

IBM Technical Disclosure Bulletin, "Solar Energy Absorber", Jul. 1978, p. 834.

* cited by examiner

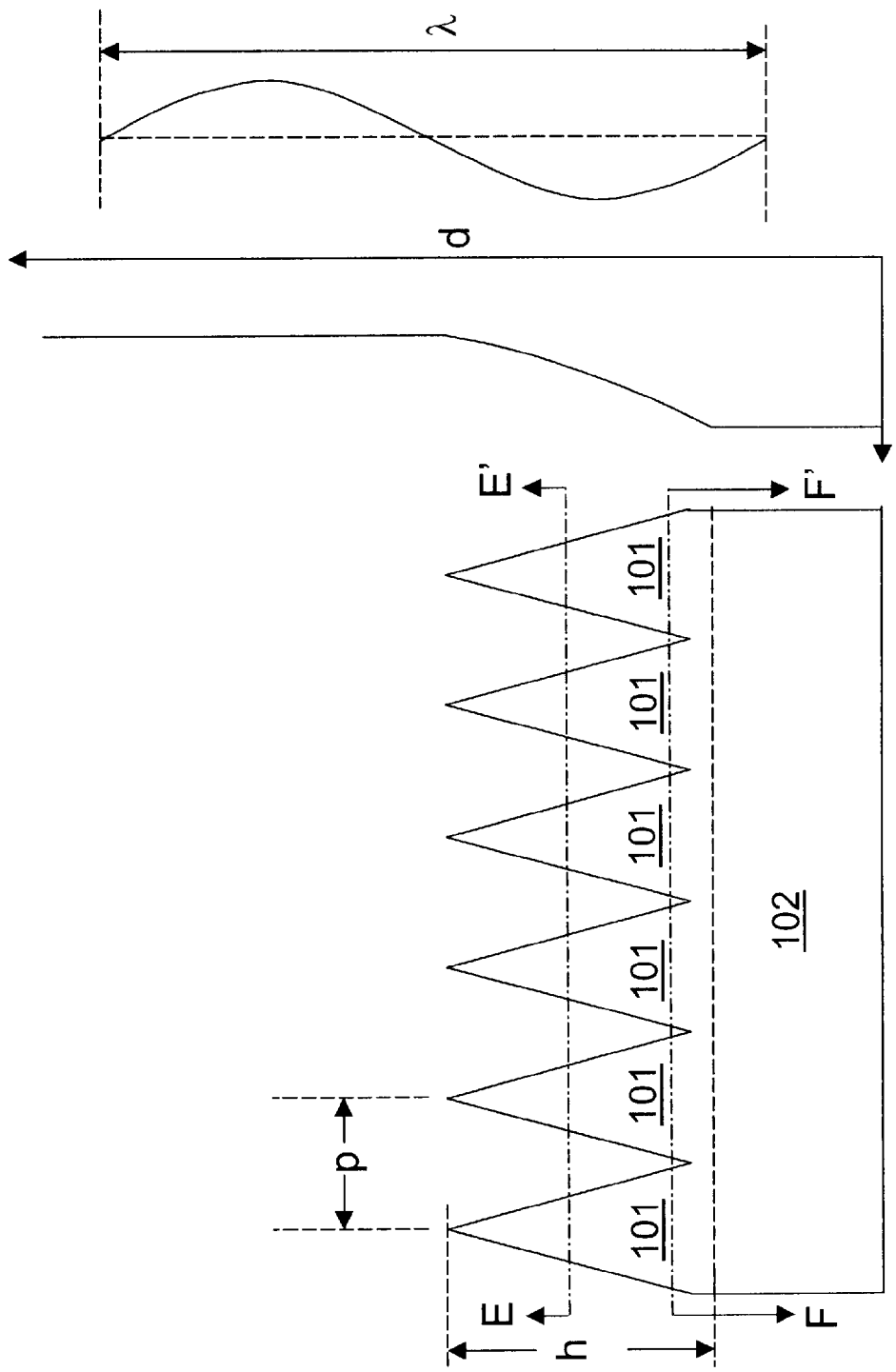

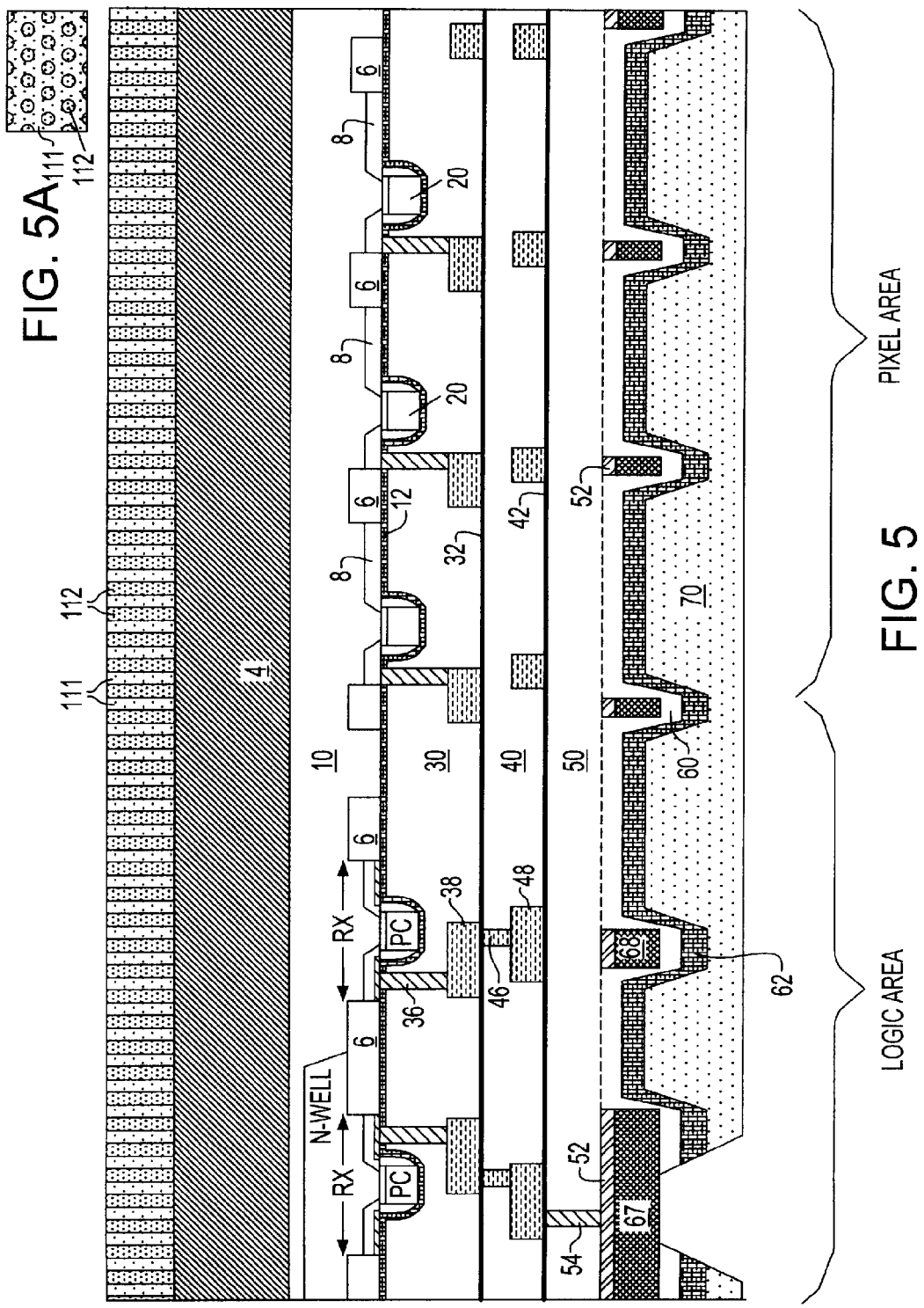

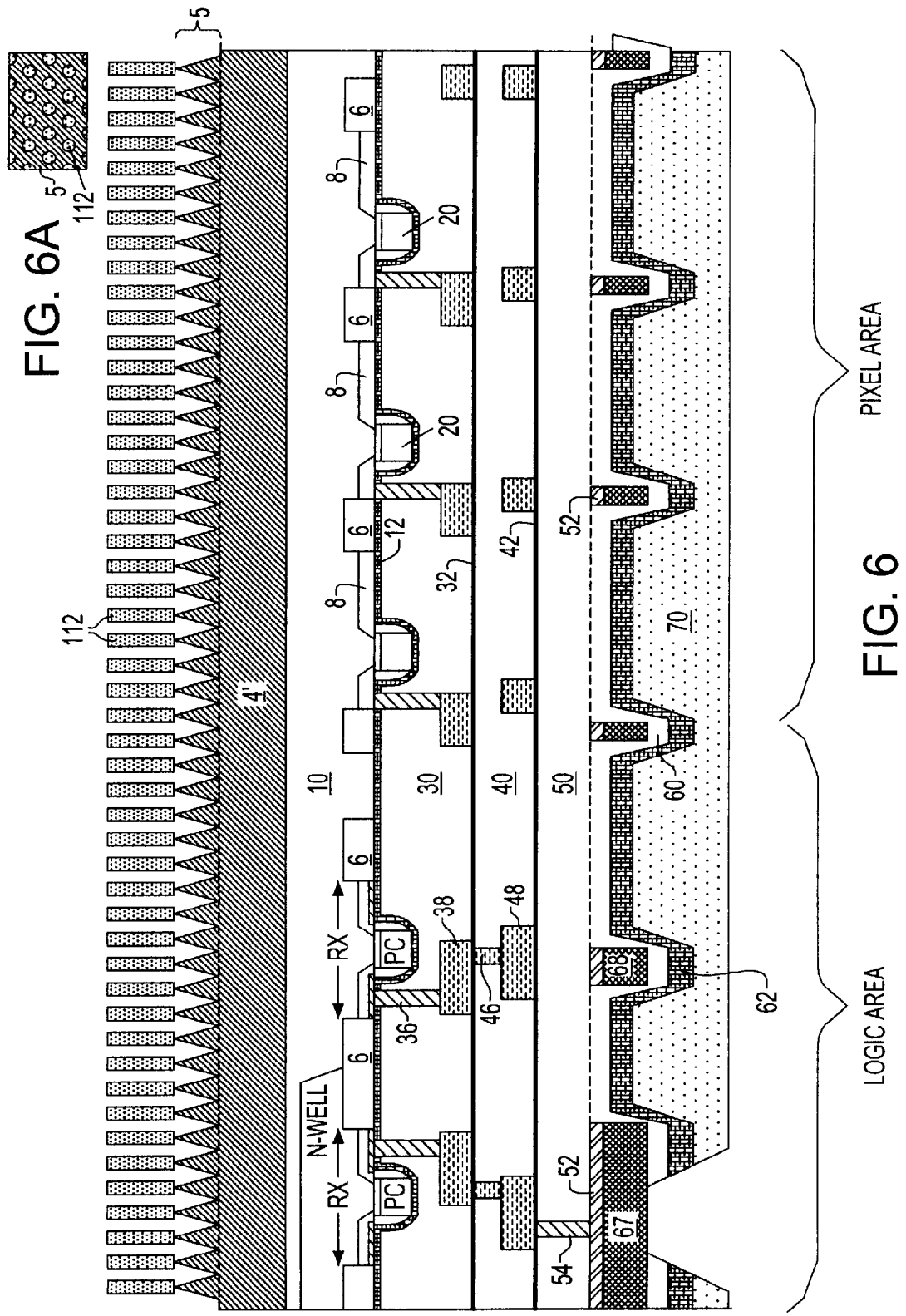

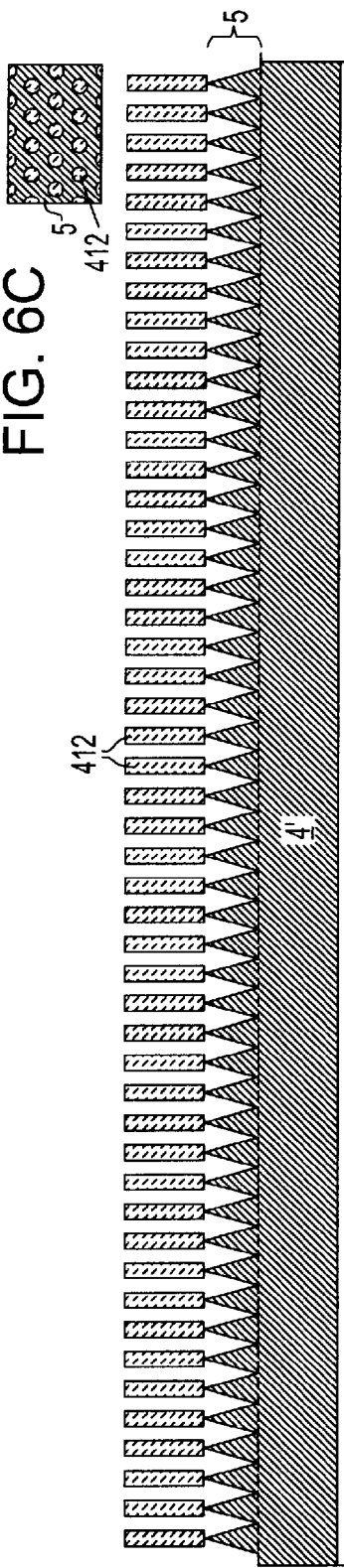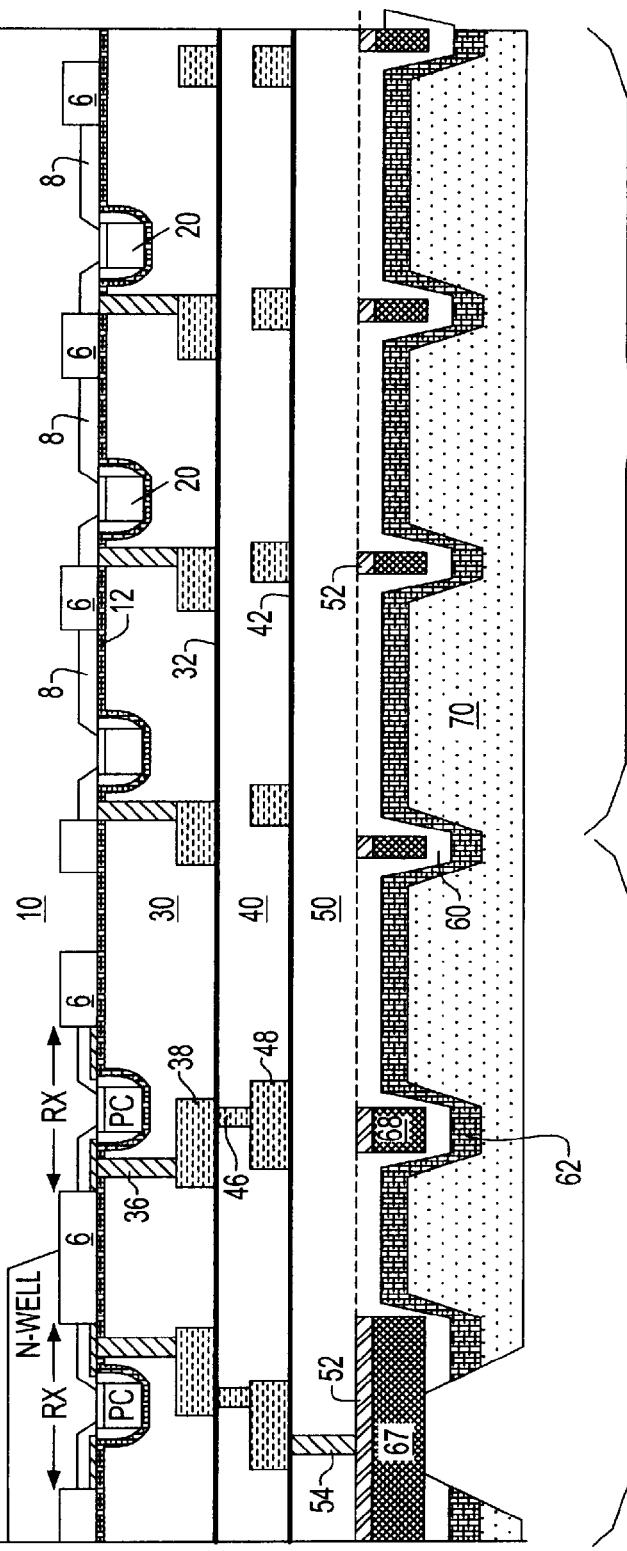

ANTI-REFLECTION STRUCTURES FOR CMOS IMAGE SENSORS

RELATED APPLICATIONS

The present application is related to a U.S. patent application Ser. No. 12/120,459 concurrently filed with the present application, which is incorporated herein by reference.

FIELD OF THE INVENTION

The present invention relates to semiconductor structures, and particularly to anti-reflection structures for complementary metal-oxide-semiconductor image sensors.

BACKGROUND OF THE INVENTION

An image sensor converts a visual image to digital data that may be represented by a picture. The image sensor comprises an array of pixels, which are unit devices for the conversion of the visual image into digital data. Digital cameras and optical imaging devices employ an image sensor. Image sensors include charge-coupled devices (CCDs) or complementary metal oxide semiconductor (CMOS) image sensors.

While CMOS image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

The CMOS image sensor unit cell comprises a pixel area and a logic area. The pixel area typically contains one of each type of active pixel, e.g., a red pixel having a first photodiode underneath a red optical filter, a green pixel having a second photodiode underneath a green optical filter, and a blue pixel having a third photodiode underneath a blue optical filter. The pixel area may also contain a dark pixel, which is covered with an opaque layer such as an aluminum light shield and employed to measure a background output level in the absence of illumination so that the output of other pixels may be referenced and calibrated. U.S. Pat. No. 6,750,912 to Tennant et al. describes use of a dark pixel and is incorporated herein by reference.

Each photodiode generates charges upon exposure to light. Logic devices connected to the photodiode detect and amplify the charges to generate signals proportional to the incident light. Each pixel comprises at least one photodiode to convert incident photons into electrical charges. Since the area of the photodiode is less than the area of each pixel, a convex-top flat-bottom lens, i.e., an optical lens having a convex surface at the top and a substantially flat surface at the bottom, is typically formed over each photodiode so that photons incident upon a convex-top flat-bottom lens are focused onto the photodiode located underneath. Typically, a color filter is formed between the convex-top flat-bottom lens and the photodiodes to make each pixel color-sensitive, i.e., responsive to photons within a certain wavelength range. The convex-top flat-bottom lens thus acts to focus light over a wide area onto the area of the photodiodes.

The efficiency of each pixel depends on the amount of transmitted light through the light path as well as the quality of the lens system thereabove in focusing the transmitted light. Many technological advances in the lens system, such as composite lens systems having multiple lenses in the light path, have been made to provide more effective focusing of lights that impinge on the outer surface of a pixel area on a semiconductor chip. Transmission of light through the light paths is maximized by providing as few optical interfaces in the light path, as well as employing material providing as small a difference as possible at each optical interface. In many cases, unnecessary optical interfaces are eliminated from a semiconductor to improve light transmission. In some cases, optical interfaces are eliminated even at the expense of adverse effects such as degradation of process control or reliability. For example, openings in cap dielectric layers are formed within a pixel area despite the degraded protection of underlying metal lines and/or degraded process uniformity and topography in metal interconnect structures thereabove.

Despite such structural modifications introduced into a pixel structure, loss of light due to reflection in the optical path is still significant, and thus, is a limiting factor on the efficiency of image sensor pixel structures.

In view of the above, there is a need for a structure reducing reflection of light in the optical path of a CMOS image sensor pixel, thereby enhancing transmission of light to a photodiode and increasing the overall efficiency of the image sensor pixel, and methods of manufacturing the same.

SUMMARY OF THE INVENTION

The present invention addresses the needs described above by providing anti-reflection structures including "moth eye type structures," or nanoscale protuberances having dimensions less than the wavelength of the light that a CMOS image sensor is designed to detect, which provide a graded refractive index region between two materials having different refractive indices and thereby reduce reflection at the optical interface, and methods of manufacturing the same.

In the present invention, optical structures having an array of protuberances between two layers having different refractive indices are provided. The array of protuberances has vertical and lateral dimensions less than the wavelength range of lights detectable by a photodiode of a CMOS image sensor. The array of protuberances provides high transmission of light with little reflection. The array of protuberances may be provided over a photodiode, in a back-end-of-line interconnect structure, over a lens for a photodiode, on a backside of a photodiode, or on a window of a chip package.

According to an aspect of the present invention, a semiconductor structure is provided, which comprises:

a photodiode located on a first surface of a semiconductor layer;

a metal interconnect layer located on the first surface of the semiconductor layer; and an insulator layer located on a second surface of the semiconductor layer, wherein the second surface is located on an opposite side of the first surface, and wherein the insulator layer includes an array of protuberances at an interface with an ambient gas or vacuum.

The array of protuberances may have a hexagonal symmetry with surfaces having a constant concave curvature. Thus, the array of protuberances of the present invention may be a regular hexagonal array, but is not limited to a regular hexagonal array. The array of protuberances has a shape of a block matrix with an array of cavities therein, in which each cavity has a shape of an inverted circular cone.

According to another aspect of the present invention, another semiconductor structure is provided, which comprises:

a photodiode located in a semiconductor layer;

a transistor located on the semiconductor layer, wherein a source of the transistor is of integral construction with the photodiode;

an interconnect level dielectric layer embedding a metal line and located on the semiconductor layer; and a protuberance-containing dielectric portion located directly on the interconnect level dielectric layer, wherein the protuberance-containing dielectric portion comprises an array of an array of protuberances.

The semiconductor structure may further comprise an optical lens configured to focus light on the photodiode.

The array of protuberances may have a hexagonal symmetry with surfaces having a constant concave curvature. The array of protuberances has a shape of a block matrix with an array of cavities therein, in which each cavity has a shape of an inverted circular cone.

The protuberance-containing dielectric portion may comprise silicon nitride and the interconnect level dielectric layer may comprise silicon oxide.

The semiconductor structure may comprise a logic area and a pixel area, wherein the logic area includes the flat dielectric portion and the pixel area includes the protuberance-containing dielectric portion.

The height of the cone may be from about 40 nm to about 480 nm, and the first thickness may be from about 50 nm to about 600 nm.

According to even another aspect of the present invention, even another semiconductor structure is provided, which comprises:

a photodiode located in a semiconductor layer;

a transistor located on the semiconductor layer, wherein a source of the transistor is of integral construction with the photodiode; and a dielectric layer located overlying the photodiode, laterally surrounding and overlying a gate electrode of the transistor, and comprising a protuberance-containing dielectric portion which overlies the photodiode and includes an array of protuberances.

The dielectric layer may comprise a first silicon nitride material and the intermediate dielectric layer may comprise a second silicon nitride material.

The dielectric layer may comprise silicon nitride and the intermediate dielectric layer may comprise silicon oxide.

The array may be a regular hexagonal array. Each of the protuberances may have a shape of a cone having a monotonically decreasing cross-sectional area as a function of a vertical distance from a base of the cone. The array of protuberances may have a hexagonal symmetry with surfaces having a constant concave curvature. The array of protuberances has a shape of a block matrix with an array of cavities therein, in which each cavity has a shape of an inverted circular cone.

The height of the cone may be from about 40 nm to about 480 nm, and the first thickness may be from about 50 nm to about 600 nm.

According to yet another aspect of the present invention, yet another semiconductor structure is provided, which comprises:

a photodiode located in a semiconductor layer;

a dielectric material layer containing a lens and located over the photodiode, wherein the lens is located in an optical path of the photodiode; and a protuberance-containing dielectric portion located directly on the dielectric material layer, wherein the protuberance-containing dielectric portion comprises an array of protuberances.

The semiconductor structure may further comprise a transistor located on the semiconductor layer, wherein a source of the transistor is of integral construction with the photodiode. The semiconductor structure may further comprise an interconnect level dielectric layer embedding a metal line and located on the semiconductor layer. The lens may comprise a material having a higher refractive index than the dielectric material layer.

A pitch of the array of protuberances may be less than 270 nm. The pitch may be a sub-lithographic dimension. The array may be a regular hexagonal array. Each of the protuberances may have a shape of a cone having a monotonically decreasing cross-sectional area as a function of a vertical distance from a base of the cone. The array of protuberances may have a hexagonal symmetry with surfaces having a constant concave curvature. The array of protuberances has a shape of a block matrix with an array of cavities therein, in which each cavity has a shape of an inverted circular cone.

The protuberance-containing dielectric portion may comprise, but is not limited to, acrylate, methacrylate, epoxyacrylate, polyimide, or a combination thereof.

The semiconductor structure may comprise a logic area and a pixel area, wherein the logic includes the flat dielectric portion and the pixel area includes the protuberance-containing dielectric portion. The semiconductor structure may further comprise a metal pad area in which a metal pad located in an interconnect level dielectric layer is exposed and is free of the flat dielectric portion and the protuberance-containing dielectric portion. The height of the cone may be from about 40 nm to about 480 nm, and the first thickness may be from about 50 nm to about 600 nm.

According to still another aspect of the present invention, still another semiconductor structure is provided, which comprises:

a semiconductor chip; and a package housing encapsulating the semiconductor chip and including an optically transparent window, the window comprising a first array of protuberances on a front surface and a second set of protuberances on a back surface.

The array may be, but is not limited to, a regular hexagonal array. Optionally, the array of protuberances may have a hexagonal symmetry with surfaces having a constant concave curvature. The array of protuberances has a shape of a block matrix with an array of cavities therein, in which each cavity has a shape of an inverted circular cone.

The semiconductor chip may include at least one photodiode.

BRIEF DESCRIPTION OF THE DRAWINGS

FIG. 1A is a vertical cross-sectional view of an exemplary array of protuberances according to the present invention. FIG. 1B is a plot of the effective refractive index as a function of a vertical distance for the exemplary array of protuberances in FIG. 1A. FIG. 1C is a schematic representation of a wavelength of light impinging on the exemplary array of protuberances in FIG. 1A.

FIGS. 3-5, 6, and 7 are sequential vertical cross-sectional views of a first exemplary semiconductor structure according to a first embodiment of the present invention. FIGS. 5A and 6A are top-down views of a portion of the first exemplary semiconductor structure at a processing step corresponding to FIG. 5 and FIG. 6, respectively. FIG. 6B is a vertical cross-sectional view of a variation of the first exemplary semiconductor structure. FIG. 6C is a top-down view of a portion of the variation of the first exemplary semiconductor structure at a processing step corresponding to FIG. 6B.

DETAILED DESCRIPTION OF THE INVENTION

Figure 1D:
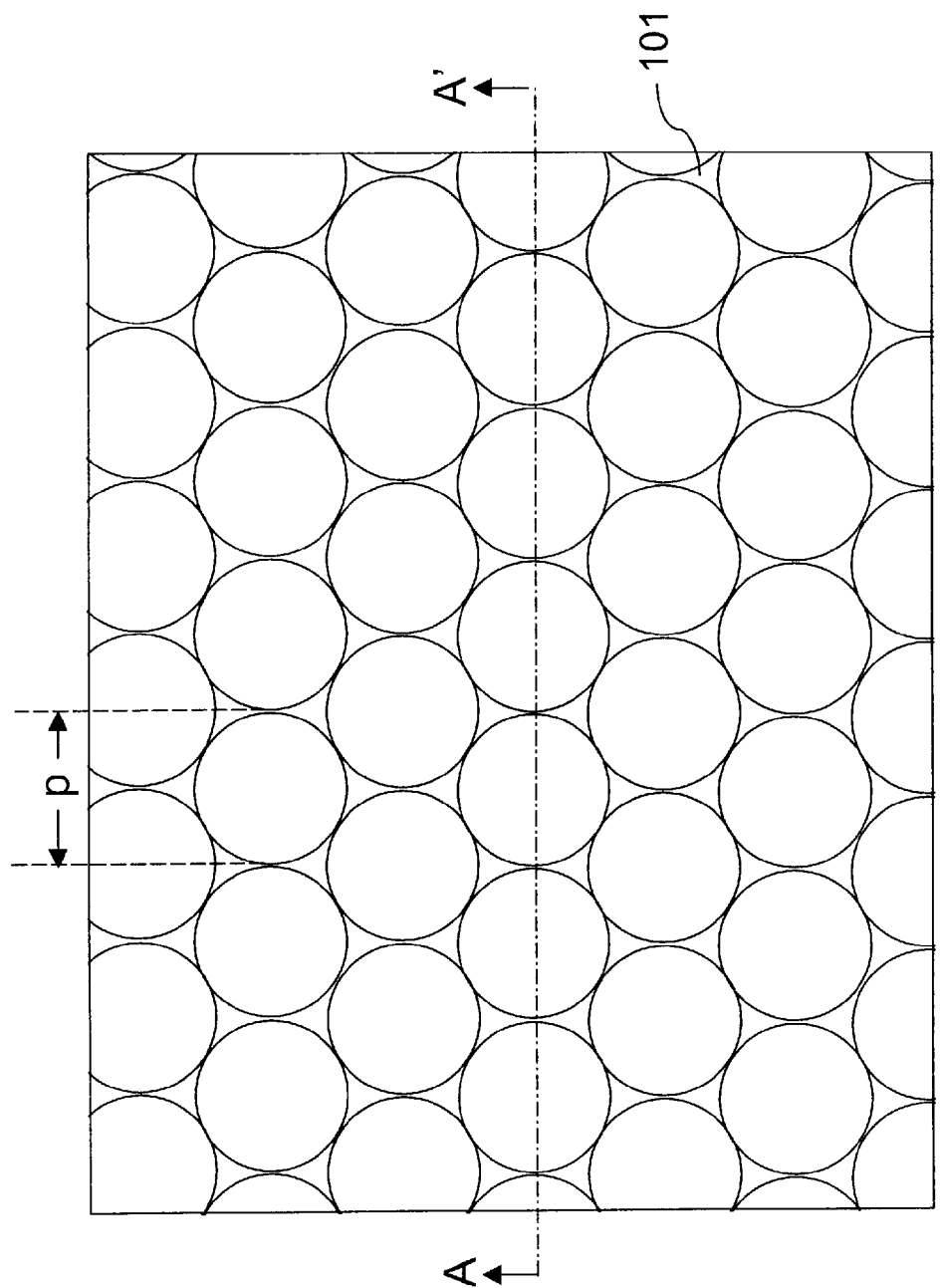
FIG. 1D is a top-down view of the exemplary array of protuberances for the case of hexagonal conical protuberances.

As stated above, the present invention relates to anti-reflection structures for complementary metal-oxide-semiconductor image sensors, which are now described in detail with accompanying figures. It is noted that like and corresponding elements are referred to by like reference numerals.

Discovery of antireflective properties of facet lenses in moth-eyes was first reported in C. G. Bernhard, "Structural and functional adaptation in a visual system," Endeavour, 26, pp. 79-84, (1967). Further research led to characterization of such facet lenses. One of such research work, S. J. Wilson, "The optical properties of 'moth eye' antireflection surfaces," Optica Acta, Vol. 29, No. 7, pp. 993-1009 (1982). A compound eye of a moth contains of an array of cuticular protuberances termed "corneal nipples." The corneal nipple array provides a significant reduction in the reflectance of the facet lens surface, and consequently, a high transmittance of light through the interface between the air and the compound eye. It has been estimated that such a corneal nipple array increases light transmittance from about 96% to more than 99%. Subsequently, corneal nipple arrays have been observed in many other insects.

The optical characteristics of a moth-eye surface is best understood as a plurality of surface layers comprising gradually varying fractions of air and a material comprising the compound eye. Instead of a sharp interface between air and the material of the compound eye, the corneal nipple array produces a graded refractive index zone which impedes light reflection and enhances light transmission.

The present invention employs structures imitating a corneal nipple array. Unlike the corneal nipple array observed in insects, the present invention employs an array of protuberances made of a non-biological optically transparent material. The array of protuberances of the present invention may be formed by self-assembling polymers that may form sub-lithographic lateral features, or may be formed by conventional lithographic methods. The array of protuberances of the present invention is employed to enhance light transmission into a semiconductor chip containing a photodiode or a complementary metal-oxide-semiconductor (CMOS) sensor.

Figure 1E:
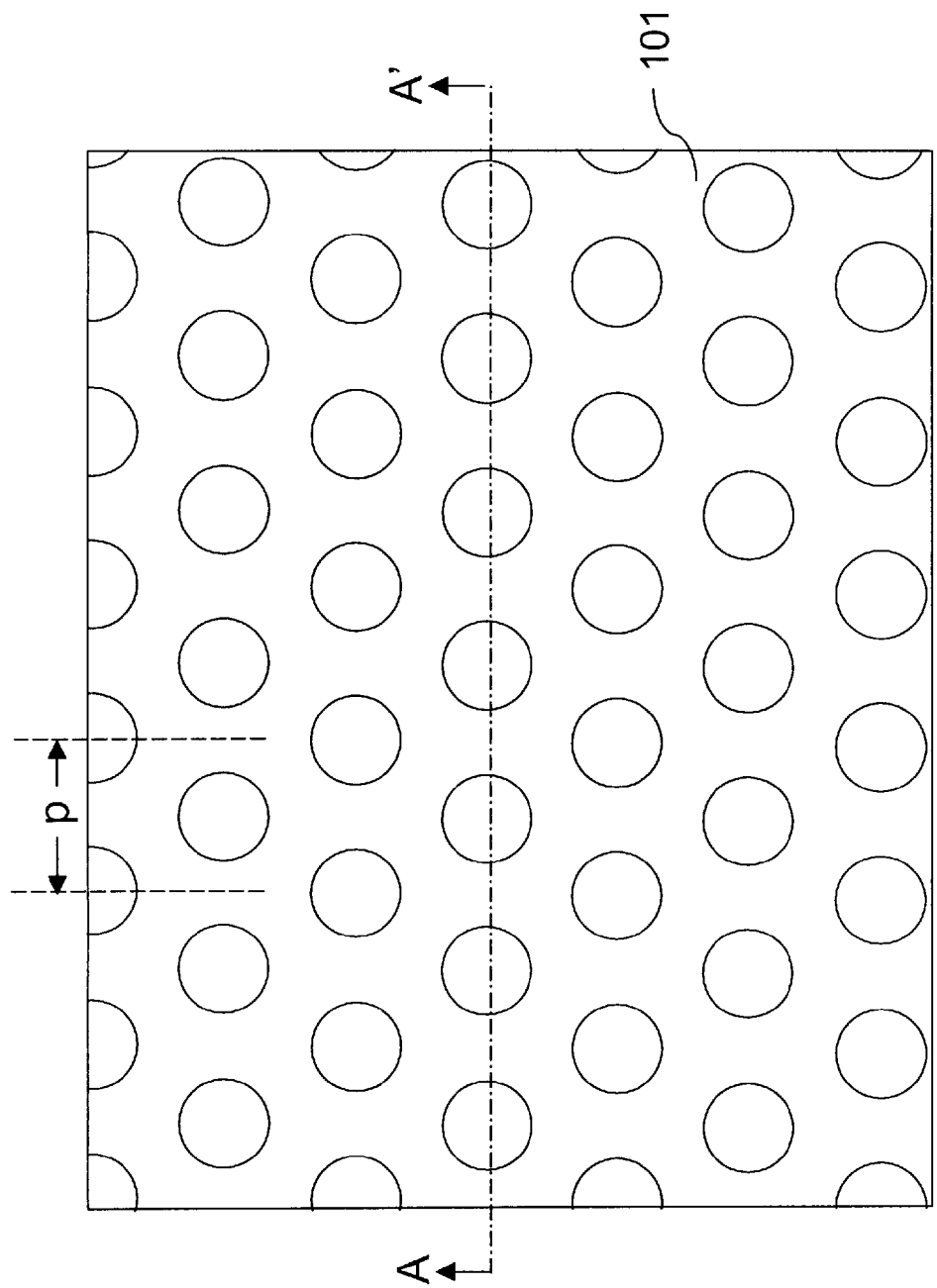
FIGS. 1E and 1F are horizontal cross-sectional views of the exemplary array of protuberances in the plane E-E' and F-F', respectively. The plane A-A' in FIGS. 1D-1F corresponds to the plane of the vertical cross-sectional view of FIG. 1A.
Figure 1F:
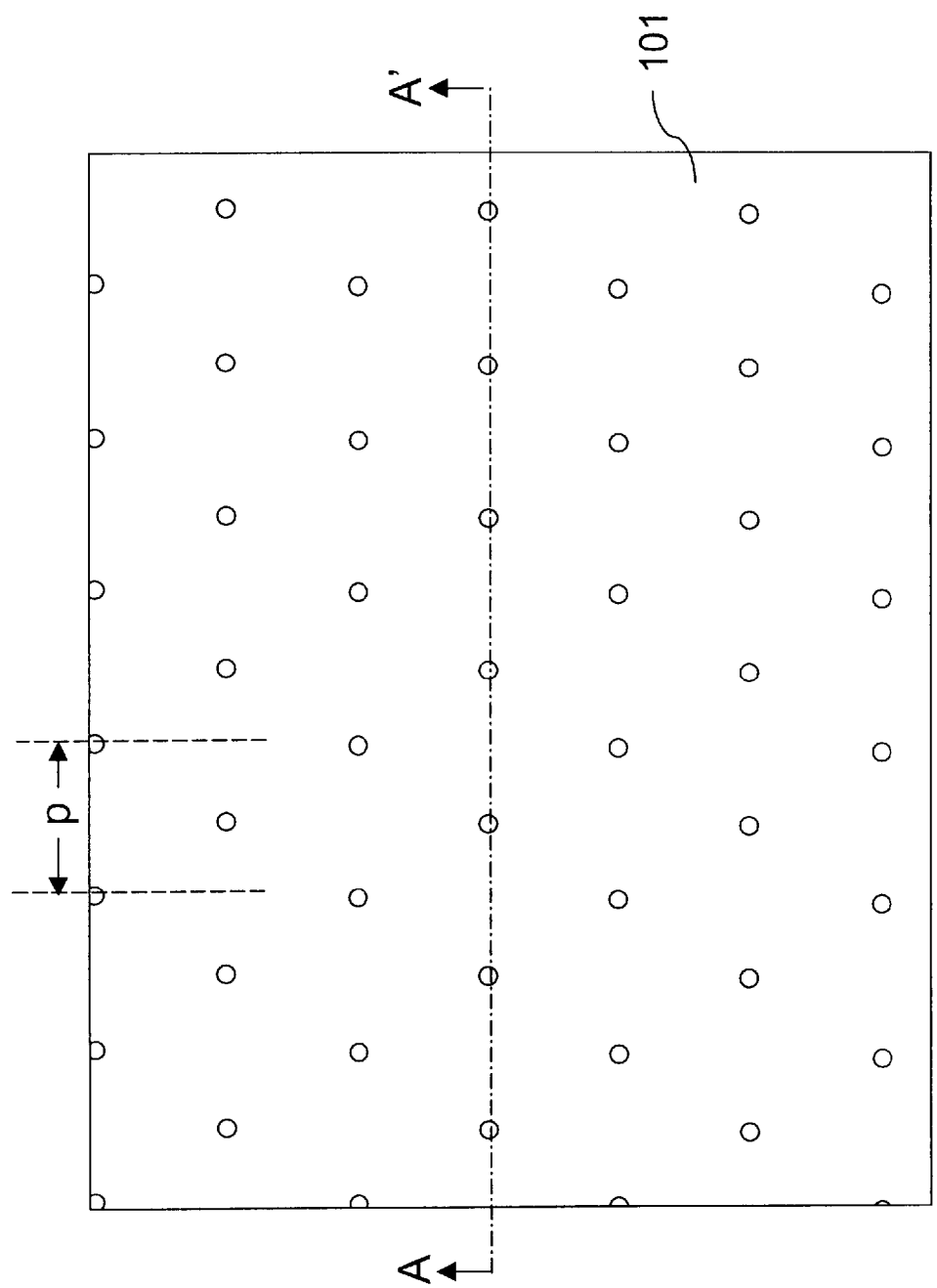

FIG. 1A is a vertical cross-sectional view of an exemplary array of protuberances 101 located over a constant thickness portion 102 according to the present invention. FIG. 1D is a top-down view and FIGS. 1E and 1F are horizontal cross-sectional views of the exemplary array of protuberances 101 in the plane E-E' or F-F' of FIG. 1A, respectively. The exemplary array of protuberances 101 and the constant thickness portion 102 comprise the same material, which is optically transparent. Preferably, the exemplary array of protuberances 101 forms a regular array, i.e., an array having a periodicity at least in one direction. Preferably, the exemplary array of protuberances 101 has a two-dimensional periodicity.

The array of protuberances has a shape of a block in which an array of cavities, each having a shape of an inverted circular cone, are formed. The array of protuberances is of integral construction since pairs of adjacent protuberances are laterally adjoined to each other. Each protuberance 101 has a decreasing horizontal cross-sectional area as a function of distance from the constant thickness portion 102. The present invention is described employing cavities each having a shape of an inverted circular cone. In general, however, the cavities may be any type of inverted cone having an arbitrary cross-sectional shape, which is determined by the shape of a block matrix formed to etch a material, out of a remaining portion of which the array of protuberances is formed as described below. Thus, the shape of the horizontal cross-sectional area of each protuberance 101 may be polygonal, elliptical, or a combination thereof, and depends on the periodicity of the exemplary array of protuberances 101. The cross-sectional are of each protuberance 101 may have curvature built therein, as may be seen in FIGS. 1G and 1H. Further, each protuberance 101 may have flat top areas, which may be a plurality of isolated areas or a single contiguous area.

For example, the horizontal cross-sectional area of the protuberances 101 may be a matrix containing an array of circular cavities. In general, horizontal cross-sectional area of the protuberances 101 is a complement of an array of shapes, which may be a rectangle or any other polygonal or elliptical shape. Such variations are effected by selecting a self-assembly material forming such cross-sectional shapes or by patterning a photoresist to lithographically form such patterns in the manufacturing steps to be subsequently described.

The pitch p of the exemplary array of protuberances 101 and the height h of the protuberances 101 may be optimized to increase transmission of light between the exemplary array of protuberances 101 and the ambient, which has a different refractive index than the exemplary array of protuberances 101 and the constant thickness portion 102 and may comprise air, vacuum, or a solid material. In case the ambient comprises air or vacuum, the height h of the protuberances 101 is ideally from about 0.1 to 0.6 times the wavelength of light in vacuum, and is preferably from about 0.25 to 0.5 times the wavelength of the light in vacuum. For optical spectrum which has a wavelength range from about 400 nm to about 800 nm, the height h of the protuberances may be from about 40 nm to about 480 nm, and preferably from about 100 nm to about 400 nm. The optimal dimension for the height h may vary depending on the refractive index of the ambient and the refractive index of the exemplary array of protuberances 101 and the constant thickness portion 102.

FIG. 1B is a plot of the effective refractive index as a function of a vertical distance for the exemplary array of protuberances in FIG. 1A. The effective refractive index is a weighted average of the refractive indices of the ambient and the exemplary array of protuberances 101 and the constant thickness portion 102 at each horizontal plane at which the effective refractive index is calculated. The effective refractive index is the same as the refractive index of the ambient above the vertical distance d exceeding the height h of the exemplary array of protuberances 101, and gradually increases as the vertical distance d decreases past the vertical distance corresponding to the apexes of the exemplary array of protuberances 101. The effective refractive index becomes the same as the refractive index of the constant thickness portion 102 when the vertical distance d is less than the distance corresponding to bottom surfaces of the protuberances 101.

FIG. 1C is a schematic representation of a wavelength of light impinging on the exemplary array of protuberances in FIG. 1A to illustrate the relative dimension of the wavelength of the light and the height h of the protuberances 101. Since the wavelength of the light may have a range, e.g., from about 400 nm to about 800 nm, the relative scale between the wavelength $\lambda$ and the height h of the exemplary array of protuberances 101 is only approximate.

Figure 1G:
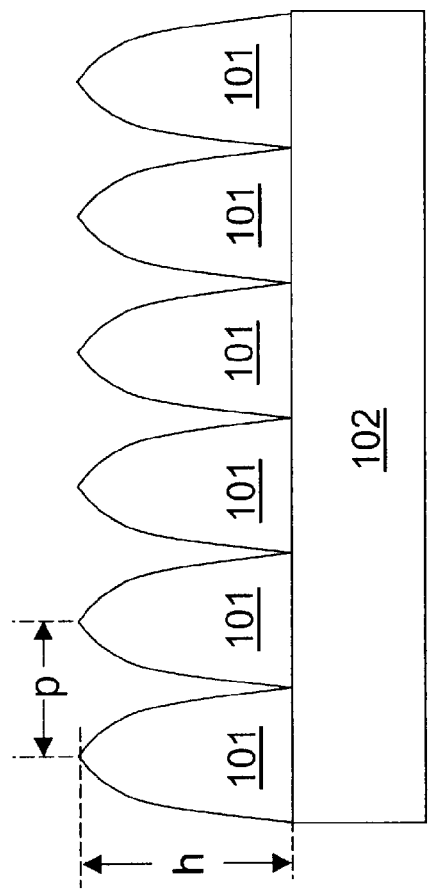
FIGS. 1G-1I are alternative vertical cross-sectional views for the exemplary array of protuberances.
Figure 1H:
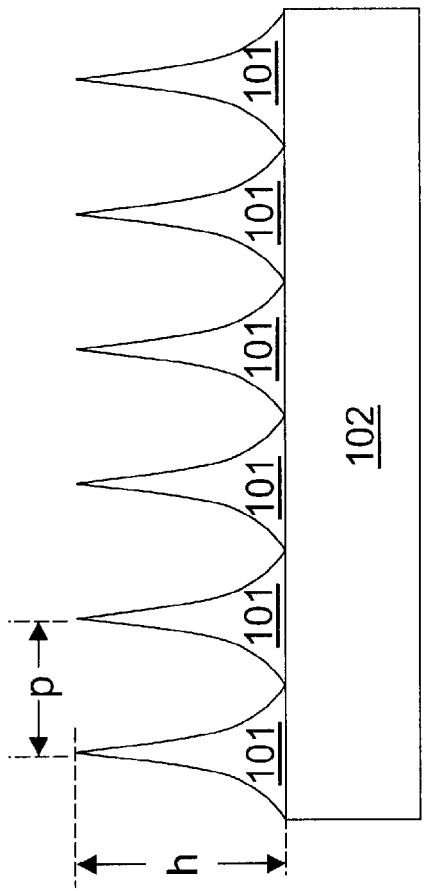
Figure 1I:
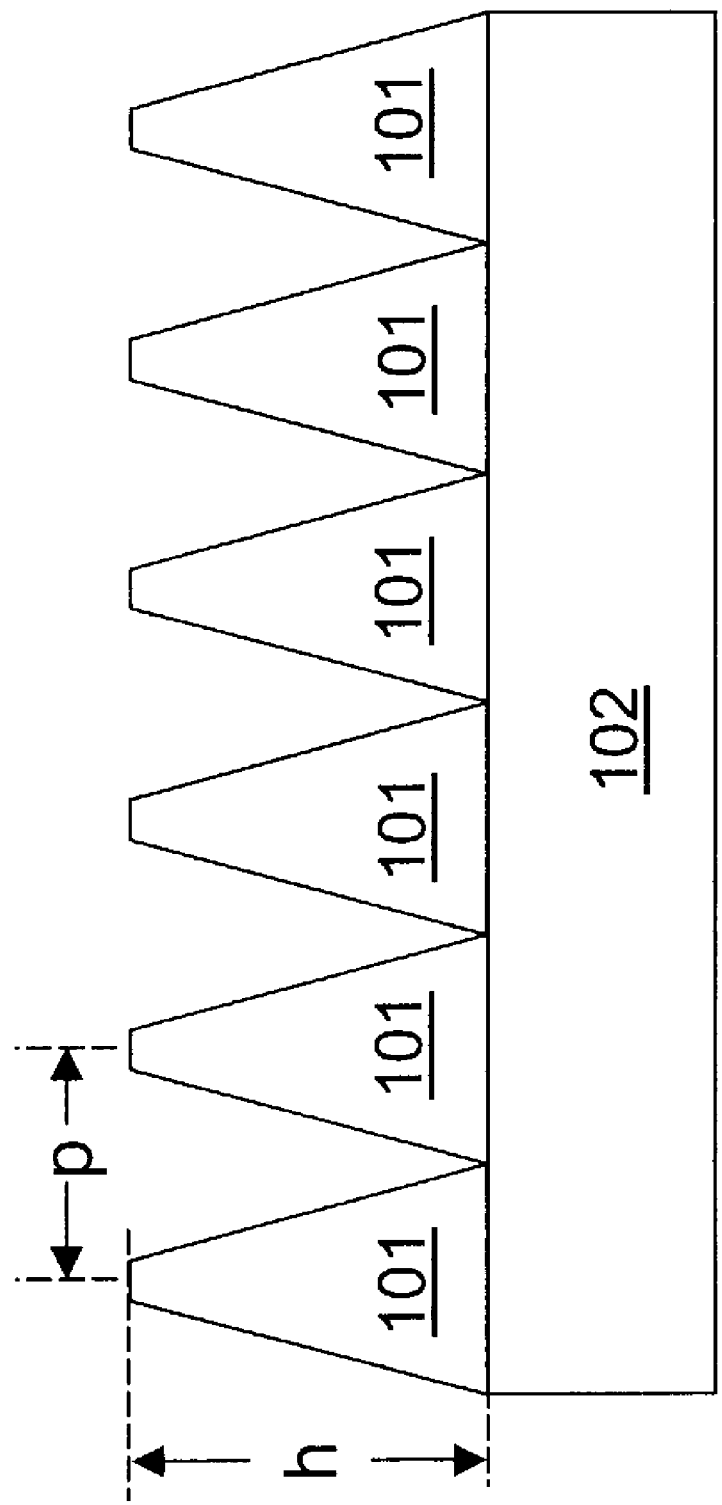

Each of the cones comprising the exemplary array of protuberances 101 may, or may not, have a constant taper. Convex and concave curvatures may be present in the individual cones in the exemplary array of protuberances 101 as illustrated in FIGS. 1G and 1H. Further, the individual "cones" may not have an apex, and may be substituted with a trapezoidal cone having a flat top surface as in FIG. 1I. Such curvatures may be introduced by manipulating an etch process during formation of the exemplary array of protuberances 101. In general, as long as the horizontal cross-sectional area of an individual protuberance decreases monotonically with the increase in the vertical distance d, the present invention may be practiced with any horizontal cross-sectional shape and/or any array configuration, which may be a regular array or an irregular array.

Figure 2:
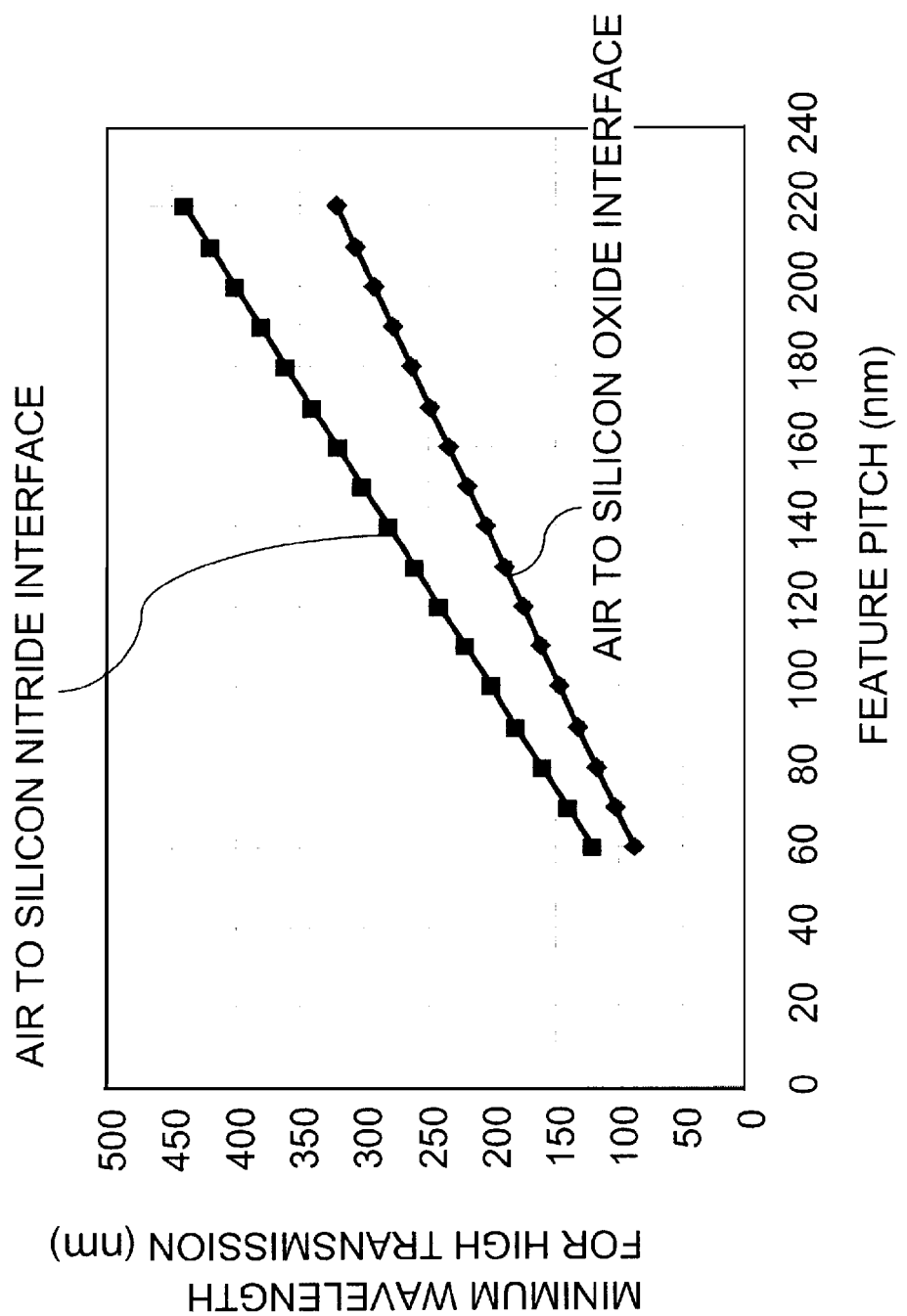
FIG. 2 is a graph of minimum wavelength for high transmission employing the array of protuberances of the present invention for an air to silicon nitride interface and for an air to silicon oxide interface.

FIG. 2 is a graph of minimum wavelength for high transmission (transmission coefficient greater than 99%) employing the array of protuberances of the present invention for an air to silicon nitride interface and for an air to silicon oxide interface. The pitch of the feature, which is the pitch of the exemplary array of protuberances 101 which may be measured from an apex of a protuberance 101 to the apex of a neighboring protuberance 101, affects the effectiveness of the exemplary array of protuberances 101. Also, the refractive index of the exemplary array of protuberances 101 affects the minimum wavelength for high transmission. The refractive index is about 2.02 for silicon nitride and about 1.46 for silicon oxide. An air to silicon nitride interface achieves high transmission for a pitch p of about or less than 200 nm. An air to silicon oxide interface achieves high transmission for a pitch p of about or less than 270 nm. Preferably, the pitch p of the exemplary array of protuberances 101 is less than 270 nm.

In general, the smaller the pitch p of the exemplary array of protuberances 101, the higher the transmission of the exemplary array of protuberances 101 of the present invention. The present invention enables arrays of protuberances having a pitch of a sublithographic dimension. While a lithographic minimum dimension, or a critical dimension, is defined only in relation to an available lithography tool, and normally changes from generation to generation of semiconductor technology, it is understood that the lithographic minimum dimension and the critical dimension are to be defined in relation to the best performance of lithography tools available at the time of semiconductor manufacturing. As of 2008, the lithographic minimum dimension is about 50 nm and is expected to shrink in the future. Any dimension less than the lithographic minimum dimension is called a "sublithographic dimension." Method of achieving such a sublithographic dimension for the pitch p of the exemplary array of protuberances 101 is described below.

Alternately, the pitch p of the exemplary array of protuberances 101 may be a lithographic dimension, i.e., a dimension equal to or greater than the lithographic minimum dimension. Method of achieving such a lithographic dimension for the pitch p of the exemplary array of protuberances 101 is also described below.

Figure 3:
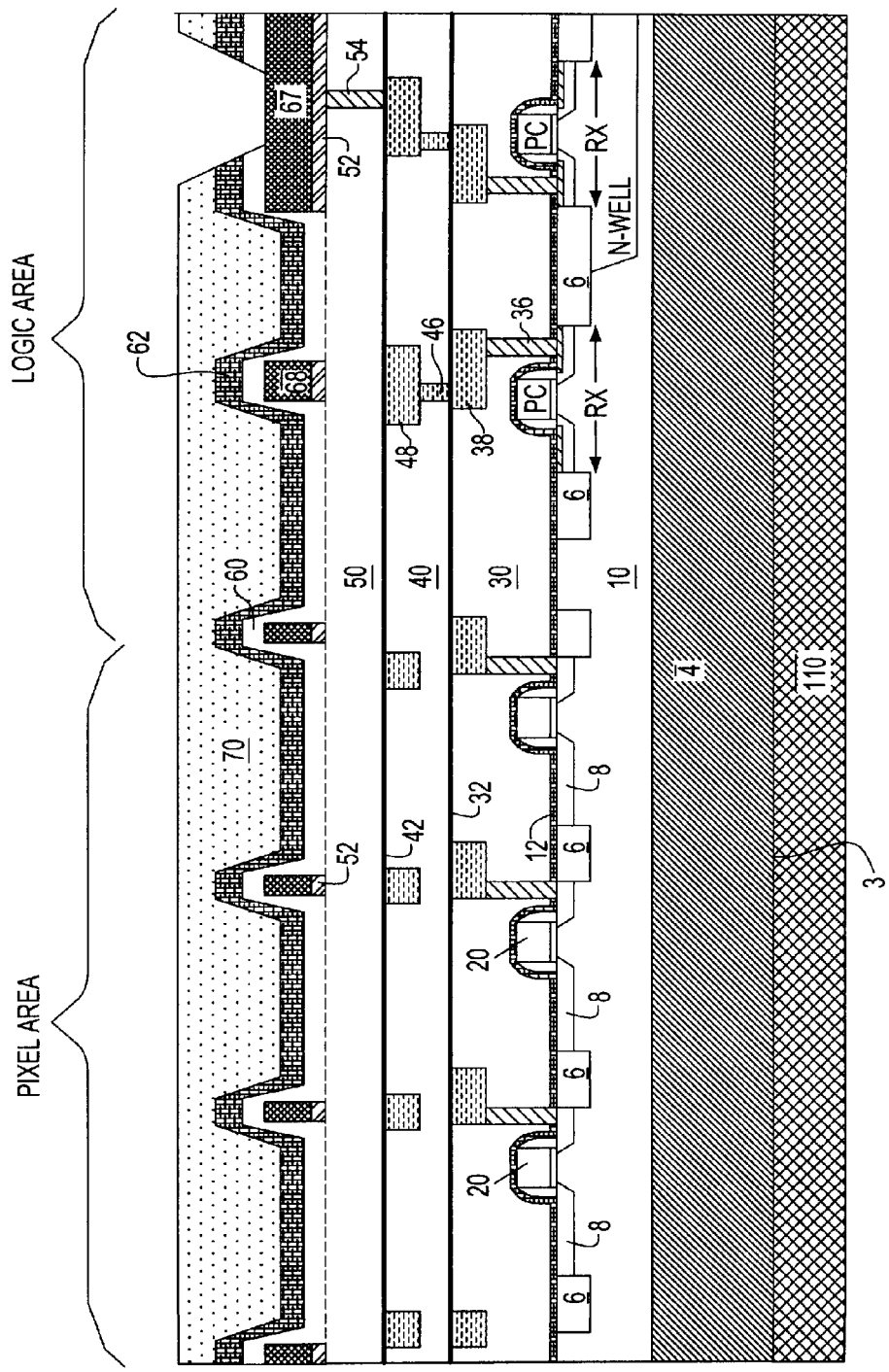

Referring to FIG. 3, a first exemplary semiconductor structure comprises semiconductor-on-insulator (SOI) substrate 9 and back-end-of-the-line (BEOL) structures 29. The SOI substrate 9 comprises a handle substrate 2, a buried insulator layer 4, and a semiconductor layer 10. The first exemplary semiconductor structure comprises a pixel area containing CMOS image sensor pixels and a logic area in which standard semiconductor devices comprising a logic circuitry that supports the operation of the CMOS image sensor pixels are located.

The first exemplary semiconductor structure comprises gate electrode structures 20, a contact array and first metal line (CA-M1) level dielectric layer 30, a second metal line (M2) level dielectric layer 40, a second via (V2) level dielectric layer 50, a third metal line (M3) level dielectric layer 60, and a dielectric passivation layer 70. Each of the gate electrode structures 20 in the pixel area form a transfer gate transistor of which the source is of integral construction with a photodiode 8.

In addition to the photodiodes 8, the semiconductor layer 10 also comprises shallow trench isolation structures 6, n-type wells ("N-well"), and/or p-type wells ("P-well," not shown). The area of the semiconductor layer 10 comprising a semiconductor material such as silicon or a silicon germanium alloy and surrounded by the shallow trench isolation structures 6 is referred to an RX area, in which source and drain regions of transistors may be formed by methods known in the art. Each of the gate electrode structures 20 comprises a gate dielectric, a gate conductor line, and a gate spacer surrounding the gate conductor, and may be formed by methods known in the art. A mobile ion diffusion barrier layer 12, comprising a dielectric material that is impervious to mobile ions such as silicon nitride, is formed over the semiconductor layer 10 and the gate electrode structures 20. The mobile ion diffusion barrier layer 12 prevents diffusion of mobile ions from the back-end-of-the-line (BEOL) structures 29 into the semiconductor layer 10 or the gate level structures 20.

The back-end-of-the-line (BEOL) structures 29 include the various metal interconnect structures located above the mobile ion diffusion barrier layer 12. The BEOL structures include a stack of the CA-M1 level dielectric layer 30, an M1 level dielectric cap layer 32, the second metal line (M2) level dielectric layer 40, an M2 level dielectric cap layer 42, the second via (V2) level dielectric layer 50, the third metal line (M3) level dielectric layer 60, the M3 level dielectric cap layer 62, and the dielectric passivation layer 70. The various dielectric layers and passivation layers may be formed by chemical vapor deposition or a spin-on coating.

Specifically, the CA-M1 level dielectric layer 30 is formed by chemical vapor deposition or by a spin-on coating. The CA-M1 level dielectric layer 30 may be formed as a single dielectric layer, or may be formed as multiple dielectric layers. The CA-M1 level dielectric layer 30 typically comprises silicon oxide, which has a refractive index of about 1.46. CA level contact vias 36 are formed in a lower portion of the CA-M1 level dielectric layer 30 to provide an electrical connection to a semiconductor device in the semiconductor layer 10 to an M1 line 38, which is formed in an upper portion of the CA-M1 level dielectric layer 30. Typically, the CA level contact vias 36 comprises W, and the M1 line 38 comprises Cu. The M1 level dielectric cap layer 32 is formed on a top surface of the CA-M1 level dielectric layer 30. The M1 level dielectric cap layer 32 typically comprises a material resistant to chemical mechanical polish so that it is effective as a stopping layer during a planarization process. Typical materials for the M1 level dielectric cap layer include silicon nitride and a barrier low-k dielectric material such as BLoK™ by Applied Materials Inc. that is suitable as a barrier/etch stop film for copper damascene applications. The M1 level dielectric cap layer 32 may be subsequently patterned so that the M1 level dielectric cap layer 32 is removed within the optical path of the pixels in the pixel area.

The M2 level dielectric layer 40 is formed over the M1 level dielectric cap layer 32 by methods known in the art. The M2 level dielectric layer 40 typically comprises silicon oxide. V1 vias 46 are formed in a lower portion of the M2 level dielectric layer 40 to provide an electrical connection between an underlying M1 line 38 and an M2 line 48, which is formed in an upper portion of the M2 level dielectric layer 40. Typically, the V1 vias 36 and the M2 lines 48 comprise Cu. The M2 level dielectric cap layer 42 is formed on a top surface of the M2 level dielectric layer 40. The M2 level dielectric cap layer 42 typically comprises a material resistant to chemical mechanical polish as the M1 level dielectric cap layer 32. The M2 level dielectric cap layer 42 may be subsequently patterned so that the M2 level dielectric cap layer 42 is removed within the optical path of the pixels in the pixel area. As many additional metal wiring levels including conductive vias and metal lines may be formed over the M2 level dielectric cap layer 42 as needed.

On top of a last wiring level containing conventional metal wiring structures, a last via level dielectric layer is deposited, in which last level conductive vias are formed. In the exemplary semiconductor structure of FIG. 1, the V2 level dielectric layer 50 is formed over the M2 level dielectric cap layer 42. Typically, the V2 level dielectric layer 50 comprises silicon oxide which has a refractive index of about 1.46. A second via level (V2) via 54 is formed by lithographic methods, an anisotropic etch, a metal fill, and planarization. The V2 via 54 comprises metal such as W.

The first exemplary semiconductor structure further comprises at least one aluminum structure such as an aluminum bond pad 67 and aluminum metal lines 68. Optionally, at least one metallic barrier structure 52 may be formed between the V2 level dielectric layer 50 and the at least one aluminum structure (67, 68). If the at least one metallic barrier structure 52 is present, the sidewalls of the at least one metallic barrier structure 52 and the sidewalls of the at least one aluminum structure (67, 68) are substantially vertically coincident since the same lithographic mask is employed to pattern the at least one metallic barrier structure 52 and the at least one aluminum structure (67, 68).

The M3 level dielectric layer 60 and the M3 level dielectric cap layer 62 are formed on the various aluminum structures (67, 68) and the V2 level dielectric layer 50 to provide passivation, or protection of the underlying structures from the ambient and ingress of moisture or contamination materials. A passivation layer 70 is formed over M3 level dielectric cap layer 62. A portion of the aluminum bonding pad 67 is exposed to enable bonding of external wires or C4 bonding.

Figure 4:
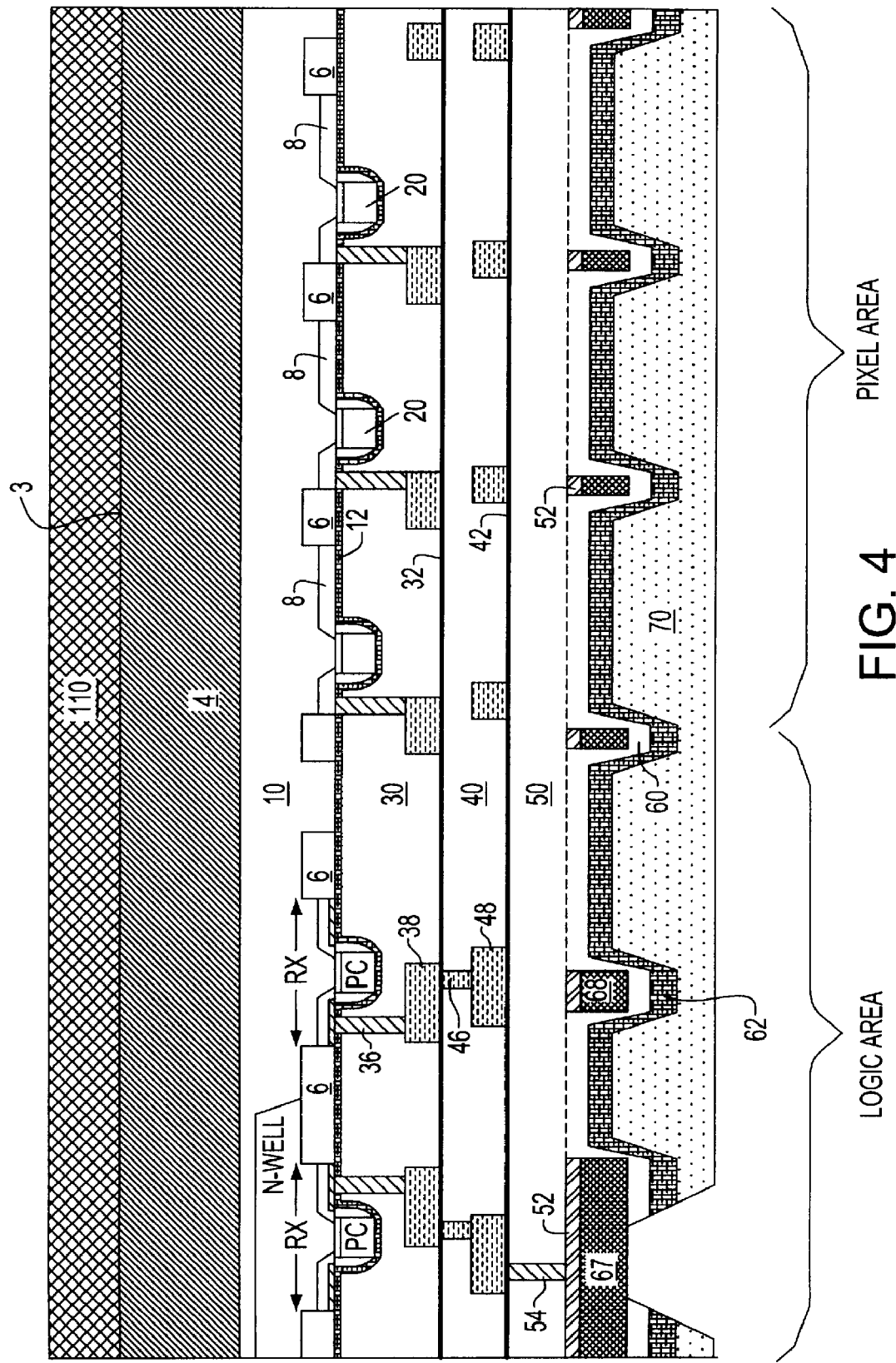

Referring to FIG. 4, the handle substrate 2 is removed from first exemplary semiconductor structure, for example, by cleaving, polishing, etching, or a combination thereof. A buried insulator layer bottom surface 3, which is a surface of the buried insulator layer 4 from which the handle substrate 2 is removed, is exposed. The first exemplary semiconductor structure is flipped upside down so that the buried insulator layer bottom surface 3 becomes an uppermost surface of the first exemplary semiconductor structure. The first exemplary semiconductor structure is positioned so that the buried insulator layer bottom surface 3 is substantially level.

A block copolymer layer 110 comprising self-assembling block copolymers that are capable of self-organizing into nanometer-scale patterns are applied over the buried insulator layer bottom surface 3. Under suitable conditions, the two or more immiscible polymeric block components separate into two or more different phases on a nanometer scale and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of the lithographic tools).

Exemplary materials for the block copolymer layer 110 are described in commonly-assigned, copending U.S. patent application Ser. No. 11/424,963, filed on Jun. 19, 2006, the contents of which are incorporated herein by reference. Specific examples of self-assembling block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). The self-assembling block copolymers are first dissolved in a suitable solvent system to form a block copolymer solution, which is then applied onto the surface of the exemplary metal interconnect structure to form a block copolymer layer 110.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The thickness of the block copolymer layer 110 may be from about 30 nm to about 600 nm, and preferably from about 60 nm to about 300 nm, although lesser and greater thicknesses are also explicitly contemplated herein.

Referring to FIGS. 5 and 5A, the first exemplary semiconductor structure is annealed at an elevated temperature to form a polymeric block matrix 112 and cylindrical polymeric blocks 111. FIG. 5 is a vertical cross-sectional view and FIG. 5A is a local top-down view, i.e., a top-down view of a portion of the first exemplary semiconductor structure of FIG. 5. Exemplary processes of annealing the self-assembling block copolymers in the block copolymer layer 110 to form two sets of polymer blocks are described in Nealey et al., "Self-assembling resists for nanolithography," IEDM Technical Digest, December 2005, Digital Object Identifier 10.1109/IEDM.2005.1609349, the contents of which are incorporated herein by reference. Further, methods of annealing described in the '963 Application may be employed. The anneal may be performed, for example, at a temperature from about 200° C. to about 300° C. for a duration from less than about 1 hour to about 100 hours.

The anneal induces self-aligned separation of a first polymeric block component, which constitutes the polymeric block matrix 112, and a second polymeric block component, which constitutes the cylindrical polymeric blocks 111. The first polymeric block component and the second polymeric block component are immiscible with each other, and thus, separate into the two distinct types of structures, i.e., the polymeric block matrix 112 and the cylindrical polymeric blocks 111 upon the anneal. The polymeric block matrix 112 may have a horizontal cross-sectional shape including cavities in the shape of a polygon, such as a hexagon, or a circle depending on the viscosity and composition of the components of the block copolymer layer 110. Typically, the polymeric block matrix 112 has a pattern of a regular periodic array, i.e., in an array structure having a two dimensional periodicity such as a hexagonal array structure.

Referring to FIGS. 6 and 6A, the cylindrical polymeric blocks 111 are removed selective to the polymeric block matrix 112 by an etch, which may be a dry etch or a wet etch. The etch may be an isotropic etch or an anisotropic etch. FIG. 6 is a vertical cross-sectional view and FIG. 6A is a local top-down view, i.e., a top-down view of a portion of the first exemplary semiconductor structure of FIG. 6. The etch removes the second polymeric block component selective to the first polymeric block component. The etch may, or may not, be selective to the buried dielectric layer 4. The sidewalls of the cavities in the polymeric block matrix 112 are exposed as well as portions of the buried insulator layer bottom surface 3 that do not underlie the polymeric block matrix 112.

Another etch that selectively removes the material of the buried insulator layer 4, which may comprise, for example, silicon oxide, silicon nitride, or aluminum oxide, selective to the polymeric block matrix 112 is performed. The remaining portion of the buried insulator layer 4 constitutes a constant thickness insulator portion 4' and an array of protuberances 5. The array of protuberances 5 is formed underneath the polymeric block matrix 112, and has the same structural characteristics as the exemplary array of protuberances 101 in FIGS. 1A and 1D-1H.

Preferably, a pitch of the protuberances is less than 270 nm. If the pitch of the pattern of the polymeric block matrix 112 is sublithographic, the pitch of the pattern of the protuberances is also sublithographic, i.e., may be less than 50 nm and may scale down to a dimension less than the lithographic minimum dimension with the pitch of the pattern of the polymeric block matrix 112. A height of the cone in each of the protuberances may be from about 40 nm to about 480 nm Alternately, an array of protuberances may be formed in the buried insulator layer 4 by lithographic methods. FIG. 6B is a vertical cross-sectional view of a variation of the first exemplary semiconductor structure, in which a photoresist 412 is applied over the buried insulator layer bottom surface 3 at a processing step corresponding to FIG. 4 instead of the block copolymer layer 110. FIG. 6C is local top-down view, i.e., a top-down view of a portion of the variation of the first exemplary semiconductor structure, of FIG. 6B. The photoresist 412 is patterned employing lithographic methods, and the buried insulator layer 4 is etched selective to the photoresist 412, which functions as an etch mask. In this case, all lateral dimensions, including the pitch, of the array of protuberances are lithographic dimensions.

Figure 7:
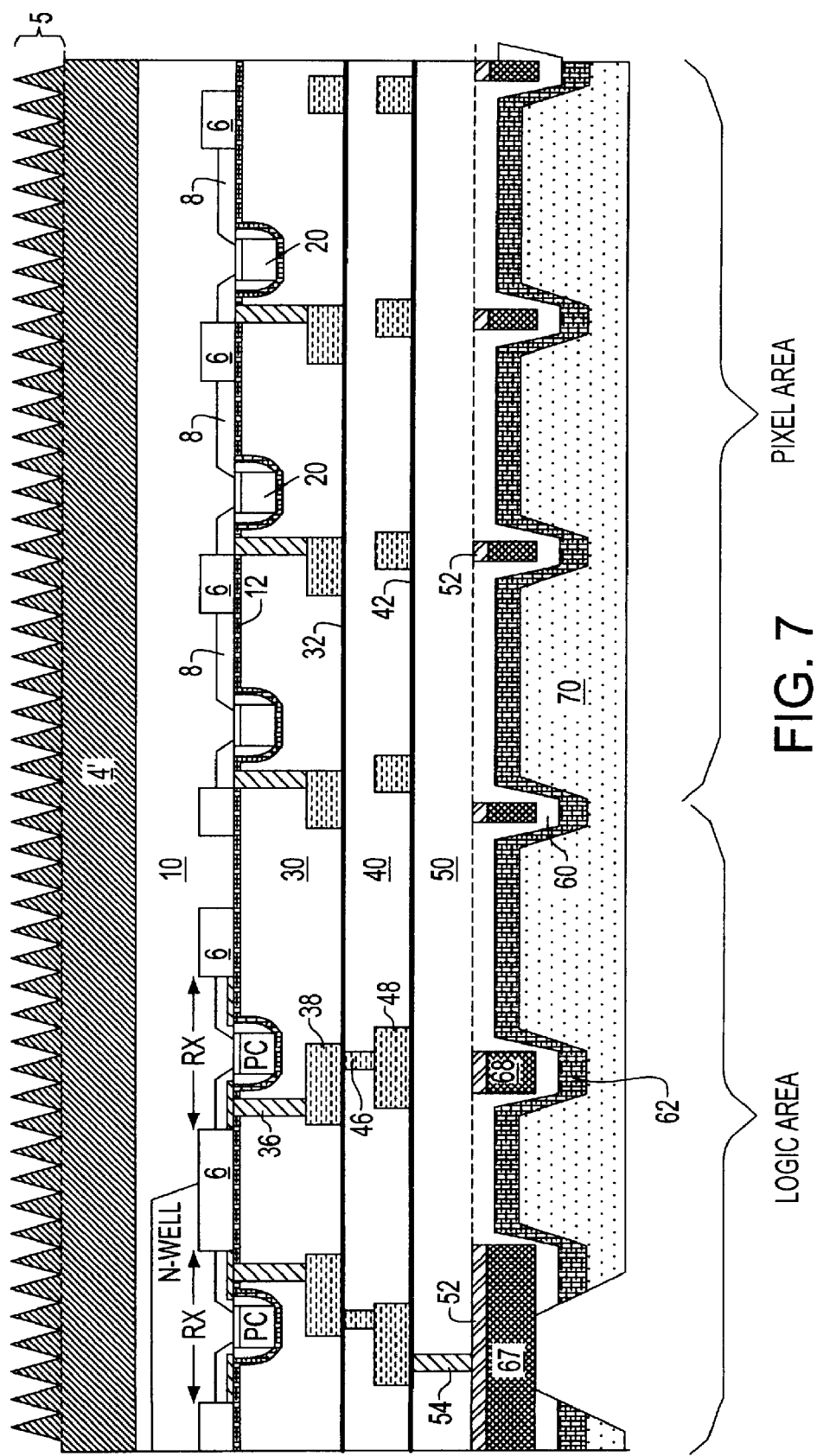

Referring to FIG. 7, the polymeric block matrix 112 or the photoresist 412 is removed from the first exemplary semiconductor structure selective to the material of the insulator layer (4', 5), which comprises the constant thickness insulator portion 4' and the array of protuberances 5. The first exemplary semiconductor structure comprises an insulator layer, which includes the constant thickness insulator portion 4' and the array of protuberances 5, having an interface with an ambient gas or vacuum. The array of protuberances 5 is located at the interface and enhances light transmission therethrough. The constant thickness insulator portion 4' is located directly on the semiconductor layer 10.

Embodiment of the present invention in which color filters and/or optical lenses are formed over the insulator layer (4', 5) is also contemplated herein. Further, the array of protuberances may be formed only within a limited area after removing the handle substrate 2 by patterning the block copolymer layer 110 to a limited area. Such variations are explicitly contemplated herein.

Figure 8:
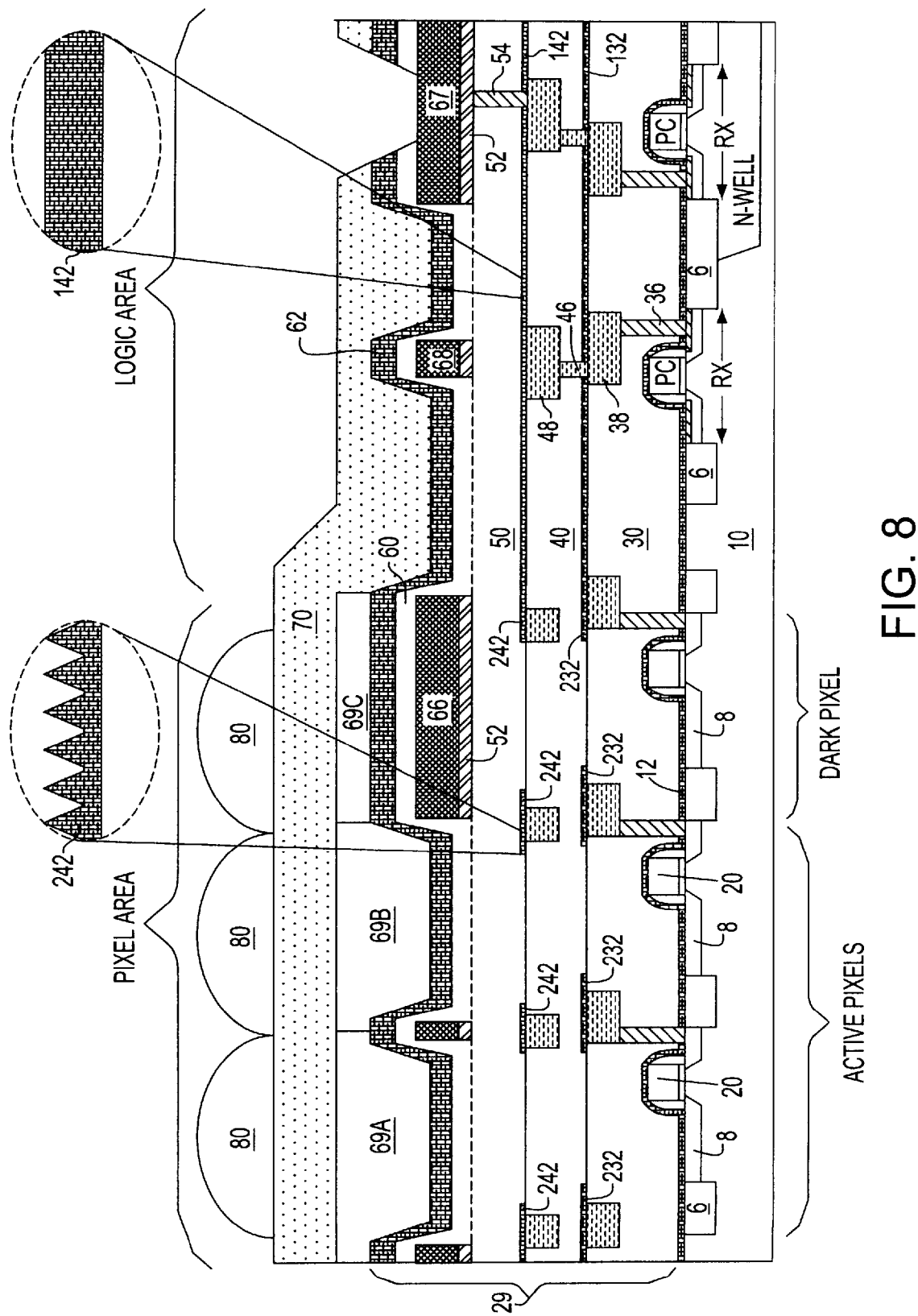
FIG. 8 is a vertical cross-sectional view of a second exemplary semiconductor structure according to a second embodiment of the present invention.

Referring to FIG. 8, a second exemplary semiconductor structure according to a second embodiment of the present invention comprises a semiconductor layer 10 and back-end-of-the-line (BEOL) structures 29 as in the first embodiment. The second exemplary semiconductor structure comprises an exemplary CMOS image sensor unit cell, which comprises a pixel area and a logic area. The pixel area includes active pixels and a dark pixel. The logic area includes semiconductor devices constituting logic circuitry for the active pixels and the dark pixel.

Each pixel may be an active pixel containing a combination of a photodiode 8, a composite lens system comprising an optical lens 80, which is configured to focus light on the photodiode 8, and a color filter (69A or 69B) containing a color filter material, i.e., a material that selectively absorbs specific wavelengths of light. To form the color filters (69A, 69B), filter materials are deposited and patterned in the pixel area to provide filtering of lights for each pixel. Multiple types of filter materials may be employed, or alternatively, one type of filter material may be deposited and patterned to have different thicknesses for each pixel type. Preferably, the pixel area also contains a dark pixel which comprises a photodiode 8, another convex-top flat-bottom upper lens 80, and an aluminum light shield 66 so that photons passing through the convex-top flat-bottom upper lens 80 above the aluminum light shield 66 is reflected by the aluminum light shield 66. The dark pixel provides a reference point for background current, or "dark current" that is generated within a photodiode 8 in the absence of any illumination, so that a logic circuitry amplifying the charge in a floating drain region may subtract the background level signal corresponding to no illumination from the signal from each active pixel. The dark pixel may comprise another color filter 69C.

The second exemplary semiconductor structure comprises at least one interconnect level dielectric layer, such as the CA-M1 level dielectric layer 30 and the second metal line (M2) level dielectric layer 40, and at least one dielectric layer formed directly on a top surface of the at least one interconnect level dielectric layer. The at least one dielectric layer may be an M1 level dielectric cap layer or an M2 level dielectric cap layer.

The M1 level dielectric cap layer comprises an M1 level flat dielectric portion 132 located in the logic area and an M1 level protuberance-containing dielectric portion 232 formed in the pixel area. The M2 level dielectric cap layer comprises an M2 level flat dielectric portion 142 located in the logic area and an M2 level protuberance-containing dielectric portion 242 formed in the pixel area. Additional metal interconnect levels may be formed in the BEOL structures. Each of the M1 level protuberance-containing dielectric portion 232 and the M2 level protuberance-containing dielectric portion 242 contains an array of protuberances having the same structure as the exemplary array of protuberances of FIGS. 1A and 1D-1H. Typically, the M1 level dielectric cap layer and the M2 level dielectric cap layer comprise a different material than the CA-M1 level dielectric layer 30, the M2 level dielectric layer 40, and the M3 level dielectric layer 50.

Method of forming such an array of protuberances in the M1 level protuberance-containing dielectric portion 232 and the M2 level protuberance-containing dielectric portion 242 are subsequently illustrated for formation of the M2 level protuberance-containing dielectric portion 242. The methods employed to form the M2 level protuberance-containing dielectric portion 242 may be employed, however, to form the M1 level protuberance-containing dielectric portion 232 and/or any additional protuberance-containing dielectric portions at different levels in the BEOL structures 29.

Figure 9:
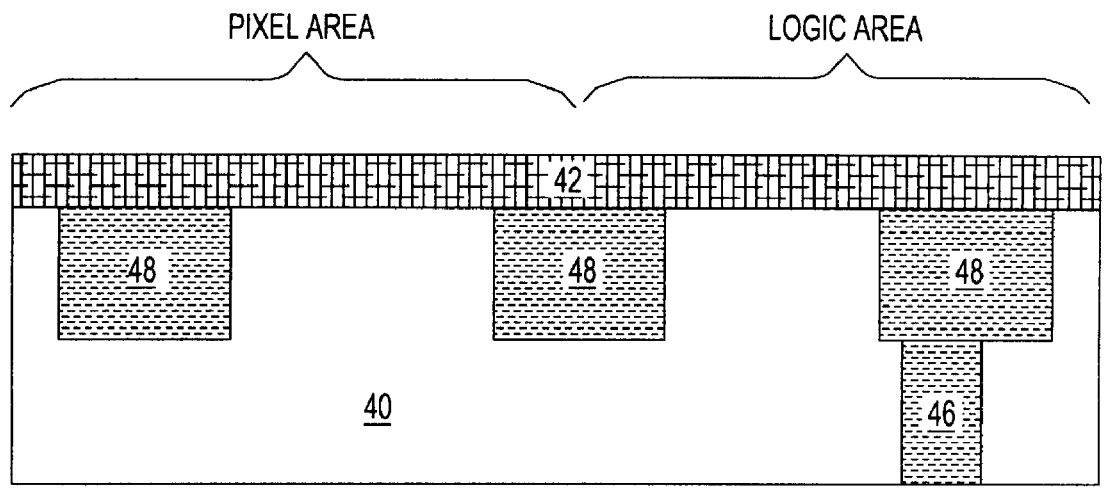
FIGS. 9-14 and 15 are sequential vertical cross-sectional views of an exemplary M2 level metal interconnect structure that may be employed to form the second exemplary semiconductor structure of FIG. 8.

Referring to FIG. 9, an exemplary M2 level metal interconnect structure according to the second embodiment of the present invention is shown. The exemplary M2 level metal interconnect structure may be incorporated into the second exemplary semiconductor structure of FIG. 8. The exemplary M2 level metal interconnect structure comprises second metal line (M2) level dielectric layer 40, a V1 via 46, M2 lines 48, and an M2 level dielectric cap layer 42. The V1 via and M2 lines comprise a conductive metal such as W, Cu, Al, etc. The M2 level dielectric layer 40 comprises a dielectric material such as doped or undoped silicon oxide, organosilicate glass, SiCOH dielectric material, a spin-on dielectric material such as SiLK™, etc. The thickness of the M2 level dielectric cap layer 42 may be from about 100 nm to about 2,000 nm, and typically from about 150 nm to about 600 nm, although lesser and greater thicknesses are contemplated herein also. The M2 level dielectric cap layer 42 comprises another dielectric material such as silicon oxide, silicon nitride, BLoK™, NBLoK™, etc. Preferably, the M2 level dielectric cap layer 42 may function as an etch stop layer to facilitate process integration during manufacturing. The thickness of the M2 level dielectric cap layer 42 may be from about 50 nm to about 600 nm, and typically from about 100 nm to about 300 nm, although lesser and greater thicknesses are contemplated herein also. The M2 level dielectric cap layer 42 has the same thickness in the pixel area and in the logic area.

Figure 10:
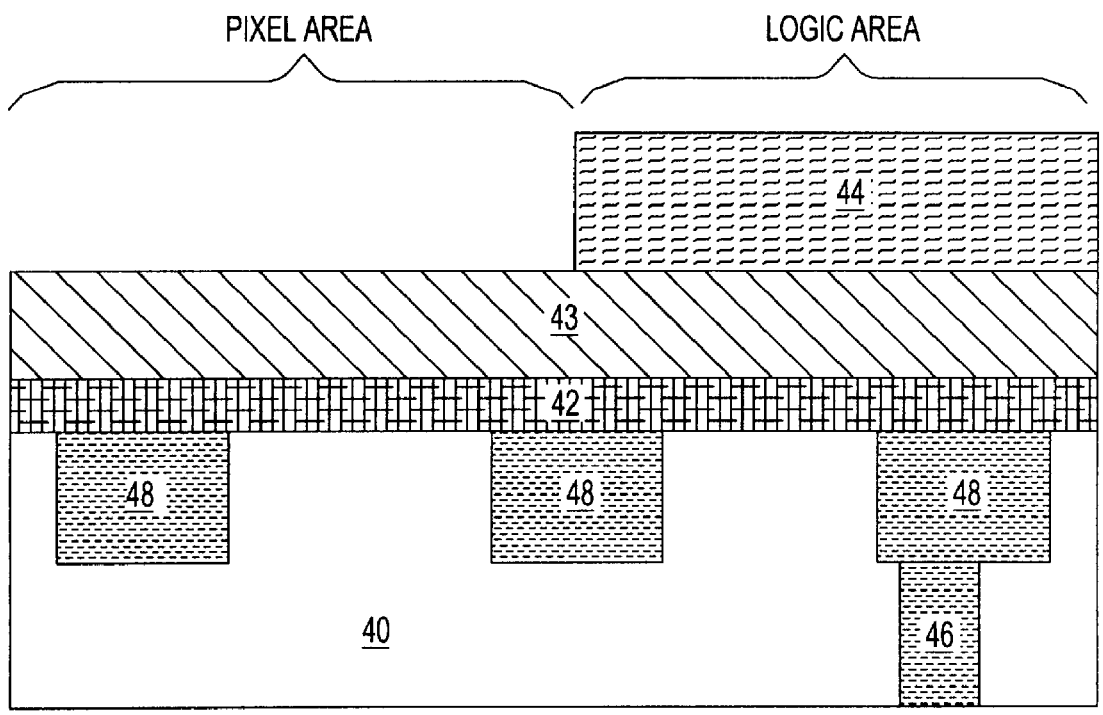

Referring to FIG. 10, a masking layer 43 is formed over the M2 level dielectric cap layer 42. The masking layer 43 may be a hard mask layer comprising a non-photosensitive dielectric material, a semiconductor material, or a metallic material. Alternately, the masking layer 43 may be a soft mask layer comprising a photoresist or a photosensitive dielectric material such as photosensitive polyimide. In case the masking layer 43 is a hard mask layer, a photoresist 44 is applied over the masking layer 43 and is lithographically patterned so that the logic area is covered by the photoresist 44, while the photoresist 44 is not present in the pixel area, i.e., a top surface of the masking layer 43 is exposed in the pixel area. In case the masking layer 43 comprises a soft mask layer, the masking layer 43 may be patterned directly. While the present invention is described for the case of a hard mask layer, variations of the present invention employing a soft mask layer is explicitly contemplated herein. The thickness of the masking layer 43 may be from about 40 nm to about 600 nm, and preferably from about 70 nm to about 300 nm, although lesser and greater thicknesses are explicitly contemplated herein also.

Figure 11:
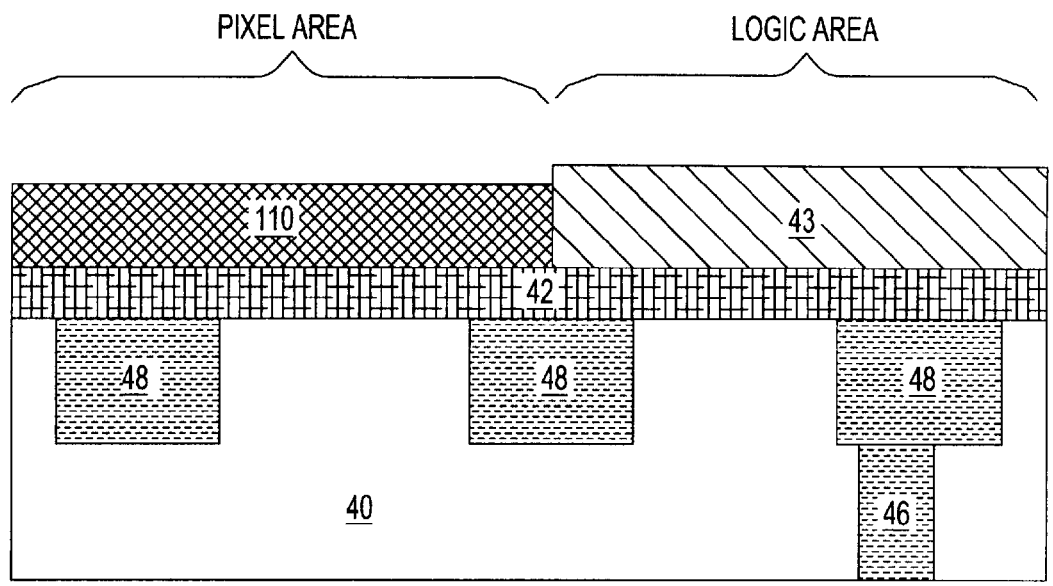

Referring to FIG. 11, the pattern in the photoresist 44 is transferred into the masking layer 43 by an etch, which may be a dry etch or a wet etch. The photoresist 44 is subsequently removed. After patterning, the masking layer 43 is present in the logic area and absent in the pixel area. A block copolymer layer 110 comprising self-assembling block copolymers that are capable of self-organizing into nanometer-scale patterns are applied over the M2 level dielectric cap layer 42. The same materials may be employed for the block copolymer layer 110 in the second embodiment as in the first embodiment. The thickness of the block copolymer layer 110 may be from about 30 nm to about 600 nm, and preferably from about 60 nm to about 300 nm, although lesser and greater thicknesses are explicitly contemplated herein also. Preferably, the thickness of the block copolymer layer 110 is less than the thickness of the masking layer 43 so that the block copolymer layer 110 is present in the pixel area, and is absent in the logic area.

Figure 12:
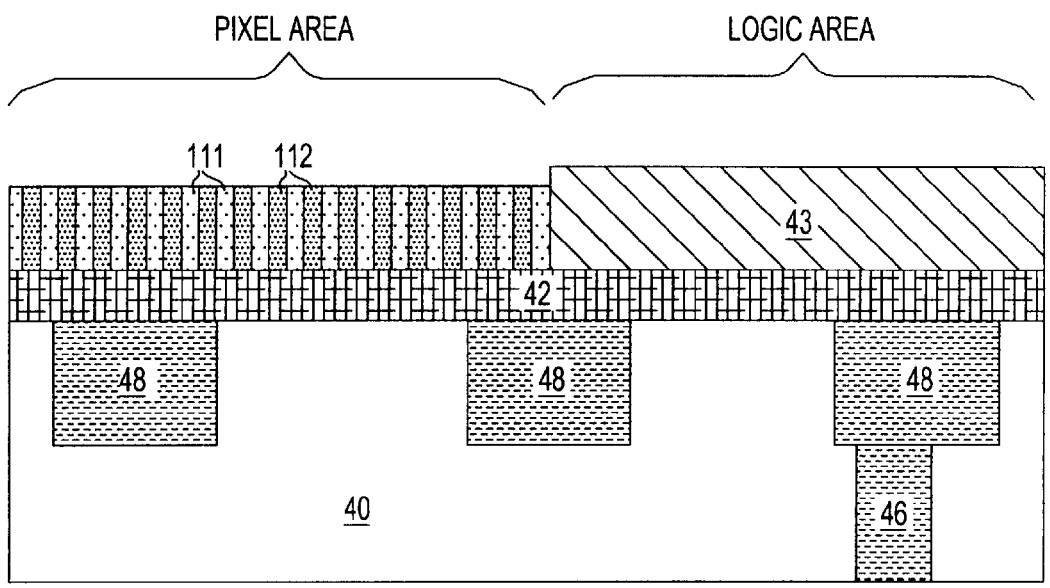

Referring to FIG. 12, the second exemplary semiconductor structure is annealed in the same manner as in the first embodiment. The anneal induces self-aligned separation of a first polymeric block component, which constitutes the polymeric block matrix 112, and a second polymeric block component, which constitutes the cylindrical polymeric blocks 111. The first polymeric block component and the second polymeric block component are immiscible with each other, and thus, separate into the two distinct types of structures, i.e., the polymeric block matrix 112 and the cylindrical polymeric blocks 111 upon the anneal. The polymeric block matrix 112 may have a horizontal cross-sectional shape including an array of cavities in the shape of a polygon, such as a hexagon, or a circle depending on the viscosity and composition of the components of the block copolymer layer 110. Typically, the polymeric block matrix 112 are arranged in a regular periodic array, i.e., in an array structure having a two dimensional periodicity such as a hexagonal array structure.

Figure 13:
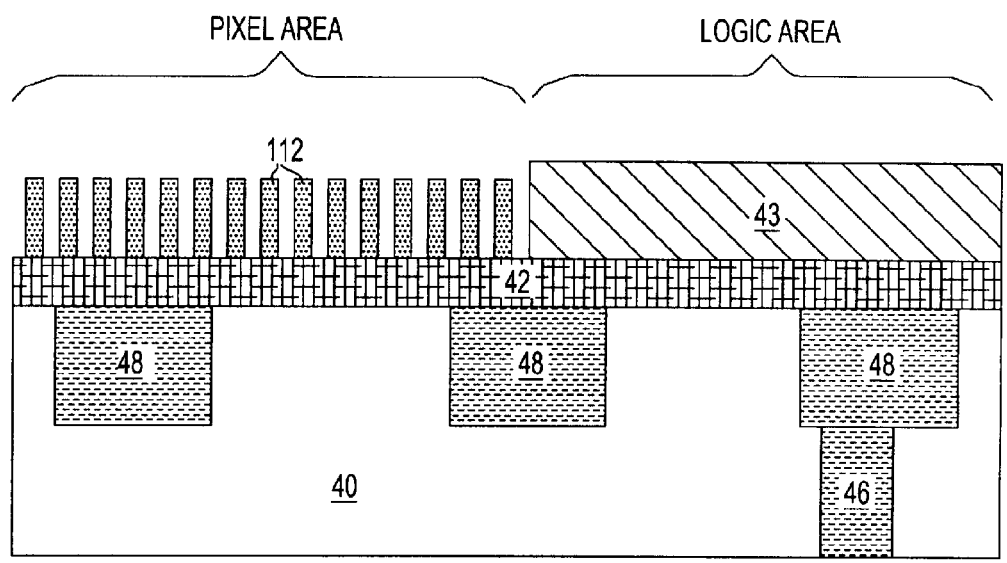

Referring to FIG. 13, the cylindrical polymeric blocks 111 is removed selective to the polymeric block matrix 112 by an etch, which may be a dry etch or a wet etch. The etch may be an isotropic etch or an anisotropic etch. The etch removes the second polymeric block component selective to the first polymeric block component. The etch may, or may not, be selective to the M2 level dielectric cap layer 42. The sidewalls of cavities in the polymeric block matrix 112 are exposed as well as portions of the M2 level dielectric cap layer 42 that do not underlie the polymeric block matrix 112.

Figure 14:
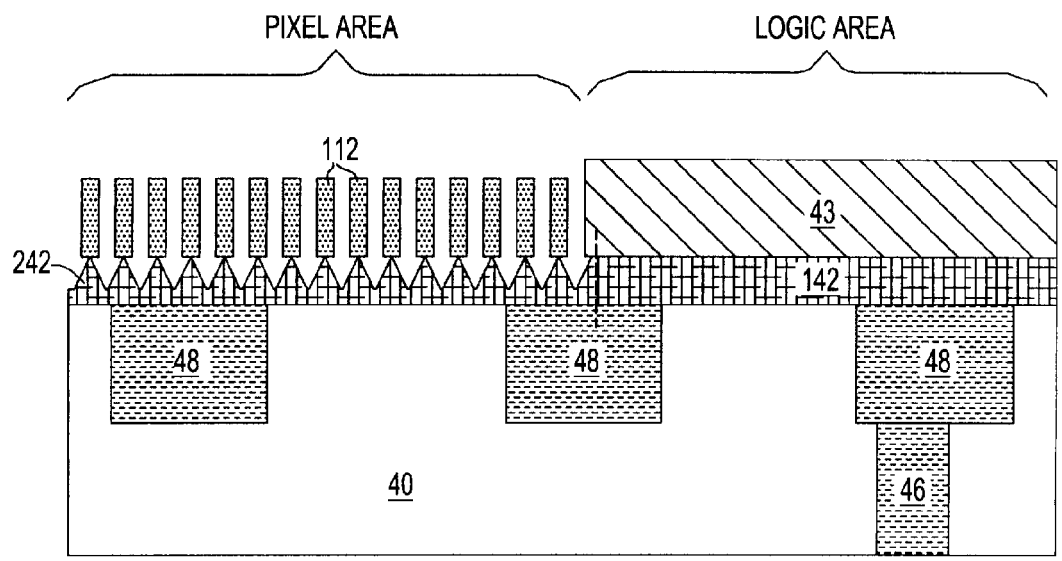

Referring to FIG. 14, another etch that selectively removes the material of the M2 level dielectric cap layer 42 selective to the polymeric block matrix 112 is performed. An array of protuberances is formed underneath the polymeric block matrix 112, and has the same structural characteristics as the exemplary array of protuberances 101 in FIGS. 1A and 1D-1H. The remaining portion of the M2 level dielectric cap layer 42 in the pixel area constitutes an M2 level protuberance-containing dielectric portion 242. The portion of the M2 level dielectric cap layer 42 within the logic area is herein referred to as an M2 level flat dielectric portion 142. The M2 level protuberance-containing dielectric portion 242 and the M2 level flat dielectric portion 142 collectively constitute the M2 level dielectric cap layer 42.

Preferably, a pitch of the protuberances is less than 270 nm. If the pitch of the pattern of the polymeric block matrix 112 is sublithographic, the pitch of the array of the protuberances is also sublithographic, i.e., may be less than 50 nm and may scale down to a dimension less than the lithographic minimum dimension with the pitch of the pattern of the polymeric block matrix 112. A height of the cone in each of the protuberances may be from about 40 nm to about 480 nm. Each protuberance in the array of protuberances may have a hexagonal symmetry with surfaces having a constant concave curvature. The array of protuberances has a shape of a block matrix with an array of cavities therein, in which each cavity has a shape of an inverted circular cone.

Figure 14A:
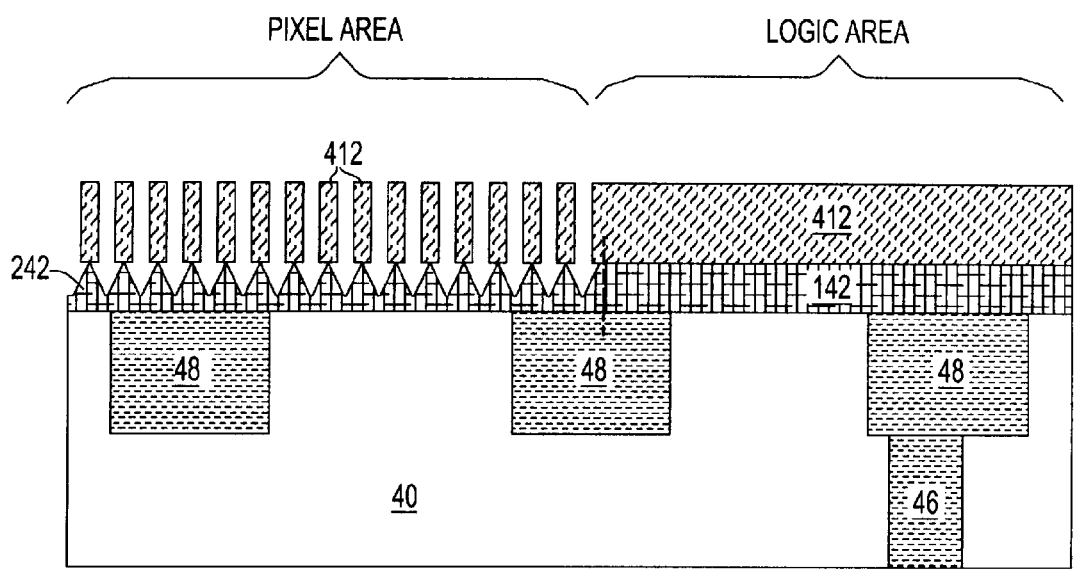
FIG. 14A is a vertical cross-sectional view of a variation of the exemplary M2 level metal interconnect structure.

Alternately, an array of protuberances may be formed in the M2 level dielectric cap layer 42 by lithographic methods. FIG. 14A is a vertical cross-sectional view of a variation of the second exemplary semiconductor structure, in which a photoresist 412 is applied over the M2 level dielectric cap layer 42 in the exemplary M2 level metal interconnect structure of FIG. 9. The photoresist 412 is patterned employing lithographic methods, and the M2 level dielectric cap layer 42 is etched selective to the photoresist 412, which functions as an etch mask. In this case, all lateral dimensions, including the pitch, of the array of protuberances are lithographic dimensions.

Figure 15:
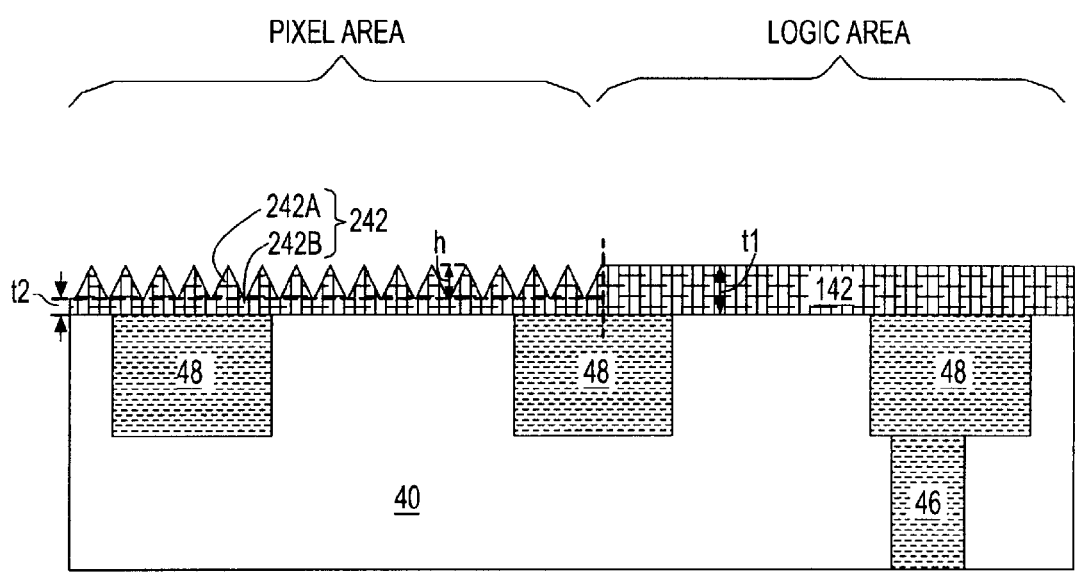

Referring to FIG. 15, the polymeric block matrix 112 or the photoresist 412 is removed from the exemplary M2 level metal interconnect structure selective to the material of the M2 level dielectric cap layer (142, 242), which comprises the M2 level flat dielectric portion 142 in the logic area and the M2 level protuberance-containing dielectric portion 242 in the pixel area. The M2 level protuberance-containing dielectric portion 242 comprises a constant thickness portion 242B and an array of protuberances 242A. The constant thickness portion 242B, the array of protuberances 242A, and the M2 level flat dielectric portion 142 may be of integral construction and have the same composition. The M2 level protuberance-containing dielectric portion 242 may contain an opening, or a hole, to let light through without an optical interface as shown in FIG. 8. The M2 level protuberance-containing dielectric portion 242 protects the underlying metal lines, i.e., the M2 lines 48 during subsequent processing.

The M2 level flat dielectric portion 142 has a first thickness t1. Each of the protuberances in the array of protuberances 242A has a height h from a base to an apex. The constant thickness portion 242B abuts each base of the array of protuberances 242A and has a second thickness t2. The first thickness t1 may be substantially equal to a sum of the second thickness t2 and the height h. The first thickness may be from about 50 nm to about 600 nm, although lesser and greater thickness are also contemplated herein.

The exemplary M2 level metal interconnect structure is incorporated into the second exemplary semiconductor structure, in which the array of protuberances 242A enhances light transmission between the M3 level dielectric layer 50 and the M2 level dielectric cap layer (142, 242). Equivalent metal interconnect structures may be formed and incorporated into the second exemplary semiconductor structure, in which each of the equivalent metal interconnect structures contains an array of protuberances having a structural equivalence with the array of protuberances 242A in the exemplary M2 level metal interconnect structure, a constant thickness portion having a structural equivalence with the constant thickness portion 242B in exemplary M2 level metal interconnect structure, and a flat dielectric portion having a structural equivalence with the M2 level flat dielectric portion 142 in exemplary M2 level metal interconnect structure. Thus, structures equivalent to the exemplary M2 level metal interconnect structure may be implemented at any metal interconnect level to enhance light transmission between the level above and the level containing a dielectric cap layer, which is a dielectric layer comprising a dielectric material and formed over an interconnect level dielectric layer embedding metal lines and/or metal vias.

Figure 16:
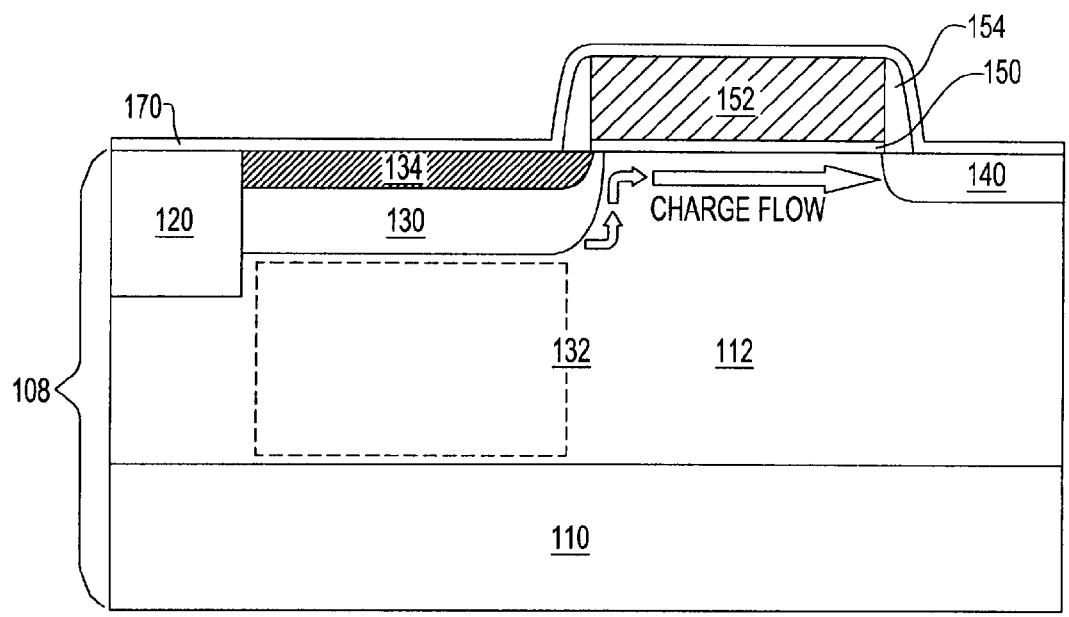
FIGS. 16-21 and 22 are sequential vertical cross-sectional views of a third exemplary semiconductor structure at various manufacturing stages according to a third embodiment of the present invention.

Referring to FIG. 16, a third exemplary semiconductor structure according to a third embodiment of the present invention comprises an exemplary device, which is a portion of a CMOS image sensor pixel. The exemplary device includes a semiconductor substrate 108 and a gate structure for a transfer gate transistor. The semiconductor substrate 108 comprises a p+ doped semiconductor layer 110, a p− doped semiconductor layer 112, and a shallow trench isolation structure 120. The semiconductor substrate 108 further comprises a photodiode and a surface pinning layer 134 having a p-type doping. The photodiode comprises an n-type charge collection well 130 located beneath the surface pinning layer 134 and a p-type well 132, which is a portion of the p− doped semiconductor layer 112 and vertically abuts the p+ doped semiconductor layer 110. The transfer gate transistor is integrally formed with the photodiode (130, 132) such that the n-type charge collection well 130, which comprises an n+ doped semiconductor material, is also a source of the transfer gate transistor. The transfer gate transistor further comprises a floating drain 140 located in the semiconductor substrate 108, a gate dielectric 150 located directly on a portion of the p− doped semiconductor layer that functions as a channel (corresponding to a straight arrow in FIG. 1), a gate electrode 152, and a gate spacer 154. Reversing of the conductivity types in the third exemplary semiconductor to form a polarity reversed exemplary semiconductor structure, in which a semiconductor substrate comprises an n− doped semiconductor layer and an n+ doped semiconductor layer located directly underneath and a photodiode comprises a p-type charge collection well and an n-type well formed in the n− doped semiconductor layer, is explicitly contemplated herein.

A p-n junction and a depletion region is formed between the p-type well 132 and the n-type charge collection well 130. A photon impinging on the photodiode (132, 130) generates an electron-hole pair if the photon interacts with the semiconductor material in the photodiode (132, 130). The energy of the photon that induces electron-hole pair generation depends on the type of the semiconductor material in the semiconductor substrate 108, but the wavelength range of photons for the photogeneration of an electron-hole pair is from about 190 nm to about 1,100 nm for silicon, from about 400 nm to about 1,700 nm for germanium, and from about 800 nm to about 2,600 nm for indium gallium arsenide, respectively.

If the electron-hole pair is generated within the depletion region of the photodiode, which comprises the p-type well 132 and the n-type charge collection well 130, the charge carriers (holes and electrons) drift apart due to the kinetic energy imparted to the charge carriers during the photogeneration process. If a minority carrier (a hole in the n-type charge collection well 130 or an electron in the p-type well 132) enters into the depletion region by drifting, the electric field inherent in the depletion region of the photodiode (132, 130) sweeps the carrier across the p-n junction, which then becomes a majority carrier, i.e., a hole in the p-type well 132 or an electron in the n-type charge collection well 130, upon crossing the p-n junction, and producing a photocurrent if the circuit is closed, or accumulates charges. Particularly, if the carrier is an electron, the carrier accumulates in the n-type charge collection well 132. The amount of charge that accumulates in the n-type charge collection well 130 is nearly linear to the number of incident photons (assuming the photons have the same energy distribution). If the minority carrier recombines with the majority carriers within the photodiode (132, 130) prior to entering the depletion region, the minority carrier is "lost" through recombination and no current or charge accumulation results.

During a read out of the charge from the photodiode (132, 130), electrons in the n-type charge collection well 130 are transferred through the body of the transistor to the floating drain 140 of the transfer transistor. The transfer of the charge needs to be complete to maximize the signal strength from the pixel and to avoid any image lag. If there is a potential barrier between the n-type charge collection well 130 and the channel of the transfer transistor, all of the charge may not be transferred during a read operation or a reset operation.

An optional intermediate dielectric layer 170 is formed over the top surface of the semiconductor substrate 108, the gate electrode 152, and the gate spacer 154. The optional intermediate dielectric layer 170 is optional, i.e., may, or may not be formed. The optional intermediate dielectric layer 170 comprises a dielectric material such as silicon oxide or silicon nitride. The optional intermediate dielectric layer 170 may be formed, for example, by low pressure chemical vapor deposition (LPCVD), plasma enhanced chemical vapor deposition (PECVD), high density plasma chemical vapor deposition (HDPCVD), etc. The thickness of the optional intermediate dielectric layer 170 may be from about 3 nm to about 100 nm, although lesser and greater thicknesses are contemplated herein also.

Figure 17:
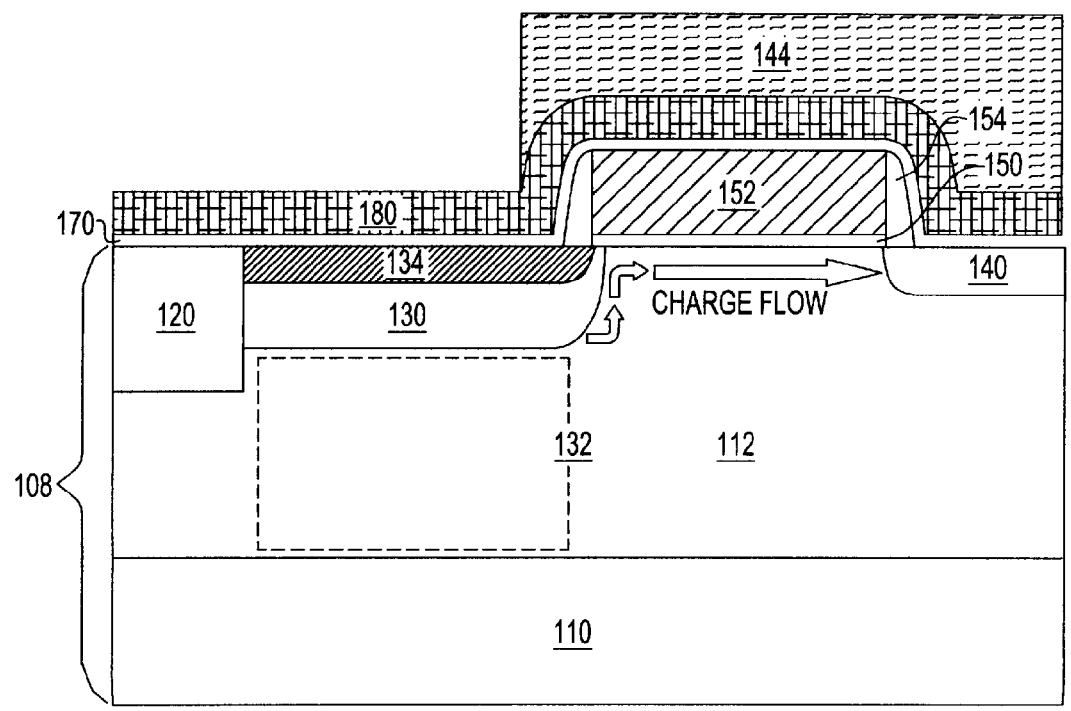

Referring to FIG. 17, a dielectric layer 180 is formed over the optional intermediate dielectric layer 170. The dielectric layer 180 comprises a dielectric material such as silicon nitride or silicon oxide. Preferably, the dielectric layer 180 comprises silicon nitride. Preferably, the dielectric layer 180 comprises a different material than the optional intermediate dielectric layer 170. For example, the dielectric layer 180 may comprise a first silicon nitride material and the optional intermediate dielectric layer 170 may comprise a second silicon nitride material that is different in composition or inherent stress level than the first silicon nitride material. The dielectric layer 180 may apply a tensile or compressive stress on the underlying structures.

A photoresist 144 is applied over the dielectric layer 180 and is lithographically patterned to cover the area of the gate electrode 152 and the floating drain. The portion of the dielectric layer 180 in the area over the photodiode (132, 130) is exposed after patterning of the photoresist 144.

Figure 18:
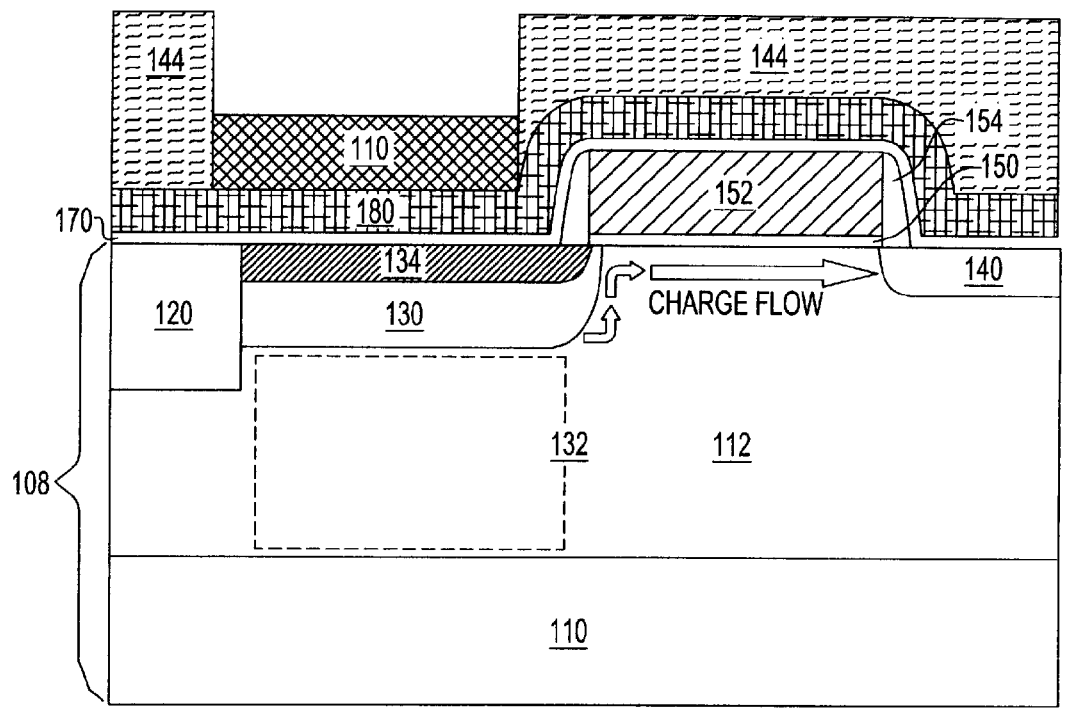

Referring to FIG. 18, a block copolymer layer 110 comprising self-assembling block copolymers that are capable of self-organizing into nanometer-scale patterns are applied over the exposed portions of the dielectric layer 180. The same materials may be employed for the block copolymer layer 110 in the second embodiment as in the first embodiment. The thickness of the block copolymer layer 110 may be from about 30 nm to about 600 nm, and preferably from about 60 nm to about 300 nm, although lesser and greater thicknesses are explicitly contemplated herein also. Preferably, the thickness of the block copolymer layer 110 is less than the height of the photoresist 144 so that the block copolymer layer 110 is not present over the photoresist 144.

Figure 19:
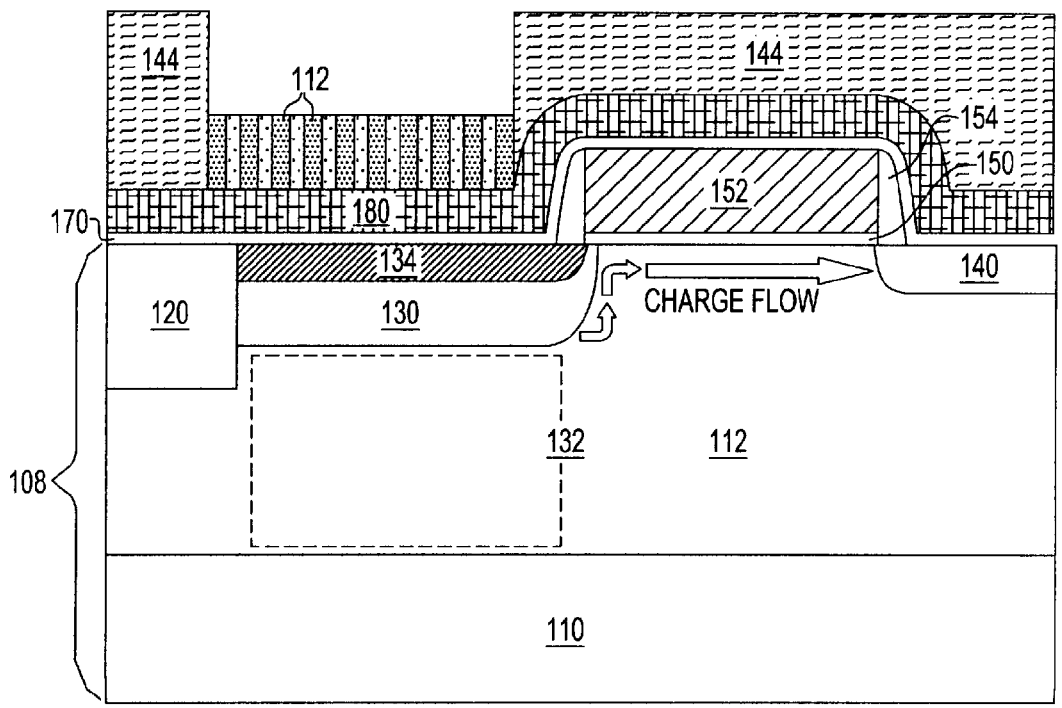

Referring to FIG. 19, the third exemplary semiconductor structure is annealed in the same manner as in the first embodiment. The anneal induces self-aligned separation of a first polymeric block component, which constitutes the polymeric block matrix 112, and a second polymeric block component, which constitutes the cylindrical polymeric blocks 111. The first polymeric block component and the second polymeric block component are immiscible with each other, and thus, separate into the two distinct types of structures, i.e., the polymeric block matrix 112 and the cylindrical polymeric blocks 111 upon the anneal. The polymeric block matrix 112 may have a horizontal cross-sectional shape of a polygon, such as a hexagon, or a circle depending on the viscosity and composition of the components of the block copolymer layer 110. Typically, the polymeric block matrix 112 are arranged in a regular periodic array, i.e., in an array structure having a two dimensional periodicity such as a hexagonal array structure.

Figure 20:
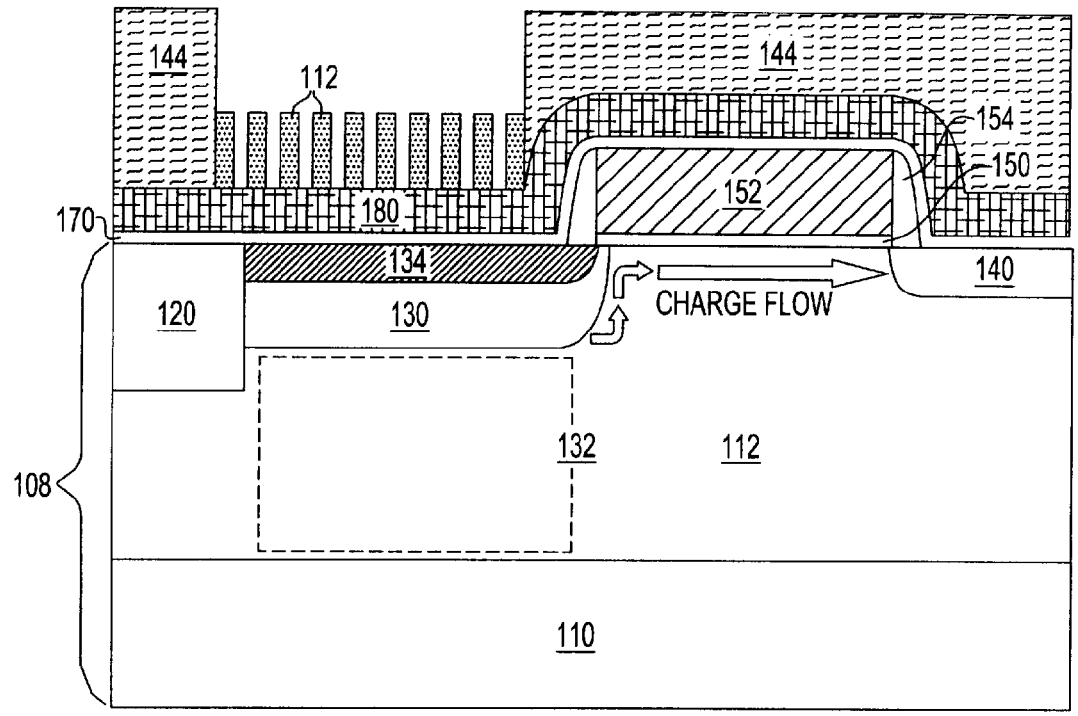

Referring to FIG. 20, the cylindrical polymeric blocks 111 is removed selective to the polymeric block matrix 112 and the photoresist 144 by an etch, which may be a dry etch or a wet etch. The etch may be an isotropic etch or an anisotropic etch. The etch removes the second polymeric block component selective to the first polymeric block component. The etch may, or may not, be selective to the dielectric layer 180. The sidewalls of cavities in the polymeric block matrix 112 are exposed as well as portions of the dielectric layer 180 that do not underlie the polymeric block matrix 112.

Figure 21:
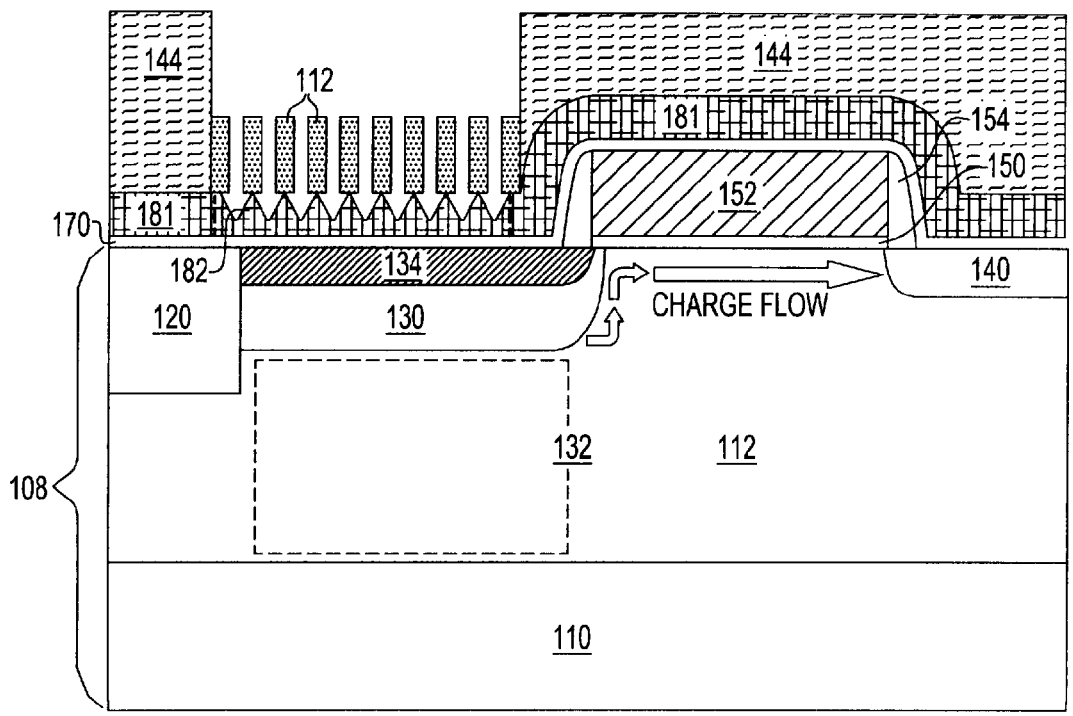

Referring to FIG. 21, another etch that selectively removes the material of the dielectric layer 180 selective to the polymeric block matrix 112 is performed. An array of protuberances is formed underneath the polymeric block matrix 112, and has the same structural characteristics as the exemplary array of protuberances 101 in FIGS. 1A and 1D-1H. The remaining portion of the dielectric layer 180 above the photodiode (132, 130) constitutes a protuberance-containing dielectric portion 182. The portion of the dielectric layer 180 within the logic area is herein referred to as a flat dielectric portion 181. The protuberance-containing dielectric portion 182 and the flat dielectric portion 181 collectively constitute the dielectric layer 180.

Preferably, a pitch of the protuberances is less than 270 nm. If the pitch of the pattern of the polymeric block matrix 112 is sublithographic, the pitch of the array of the protuberances is also sublithographic, i.e., may be less than 50 nm and may scale down to a dimension less than the lithographic minimum dimension with the pitch of the pattern of the polymeric block matrix 112. A height of the cone in each of the protuberances may be from about 40 nm to about 480 nm. Each protuberance in the array of protuberances may have a shape of a cone having a monotonically decreasing cross-sectional area as a function of a vertical distance from a base of the cone. The array of protuberances may have a hexagonal symmetry with surfaces having a constant concave curvature. The array of protuberances has a shape of a block matrix with an array of cavities therein, in which each cavity has a shape of an inverted circular cone.

Figure 21A:
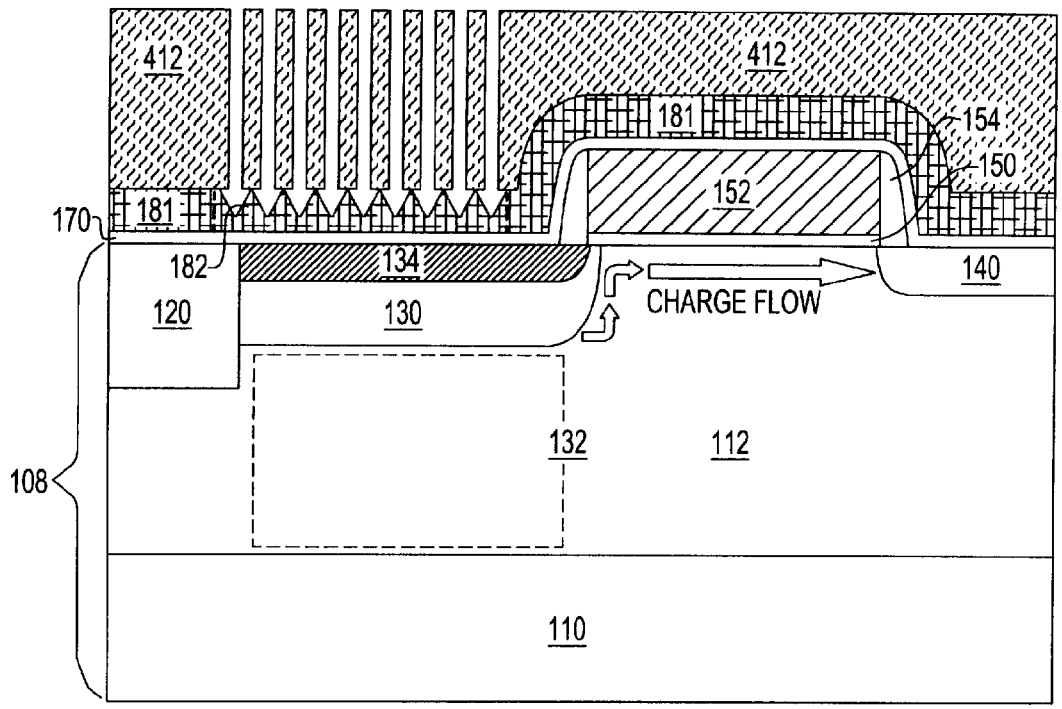
FIG. 21A is a first variation of the third exemplary semiconductor structure.

Alternately, an array of protuberances may be formed in the dielectric layer 180 by lithographic methods. FIG. 21A is a vertical cross-sectional view of a first variation of the third exemplary semiconductor structure, in which a photoresist 412 is applied over the dielectric layer 180 over the third exemplary semiconductor structure of FIG. 16 and lithographically patterned to cover the entirety of the area over the gate electrode 152 and the floating drain 140, while forming a pattern of an array of isolated cylinders over the photodiode (132, 130). The dielectric layer 180 is etched selective to the photoresist 412 to form a protuberance-containing dielectric portion 182, in which the photoresist 412 functions as an etch mask. In this case, all lateral dimensions, including the pitch, of the array of protuberances are lithographic dimensions.

Figure 22:
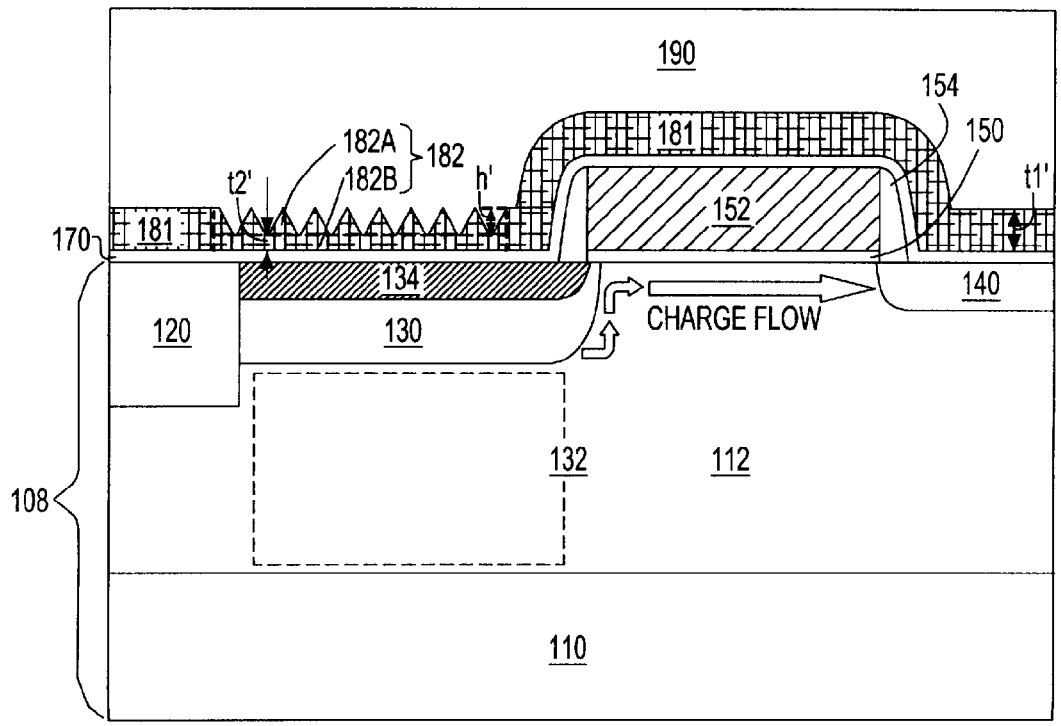

Referring to FIG. 22, the polymeric block matrix 112 or the photoresist 412 is removed from the third exemplary semiconductor structure selective to the material of the dielectric layer (181, 182), which comprises the flat dielectric portion 181, located over the gate electrode 152 and the floating drain 140, and the protuberance-containing dielectric portion 182 located above the photodiode (132, 130). The protuberance-containing dielectric portion 182 comprises a constant thickness portion 182B and an array of protuberances 182A. The constant thickness portion 182B, the array of protuberances 182A, and the flat dielectric portion 181 may be of integral construction and have the same composition. The flat dielectric portion 181 has a first thickness t1'. Each of the protuberances in the array of protuberances 182A has a height h' from a base to an apex. The constant thickness portion 182B abuts each base of the array of protuberances 182A and has a second thickness t2'. The first thickness t1' may be substantially equal to a sum of the second thickness t2' and the height h'. The first thickness t1' may be from about 50 nm to about 600 nm, although lesser and greater thickness are also contemplated herein.

A middle-of-line (MOL) dielectric layer 190 is deposited over the dielectric layer (181, 182). The MOL dielectric layer 190 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Alternately, the MOL dielectric layer may comprise organosilicate glass (OSG), a SiCOH dielectric material, a spin-on low-k dielectric material, etc. Various contact via holes (not shown) are formed in the MOL dielectric layer 190 and filled with metal to from various contact vias (not shown). The protuberance-containing dielectric portion 182 provides enhanced transmission between the MOL dielectric layer 190 and the photodiode (132, 130).

Figure 22A:
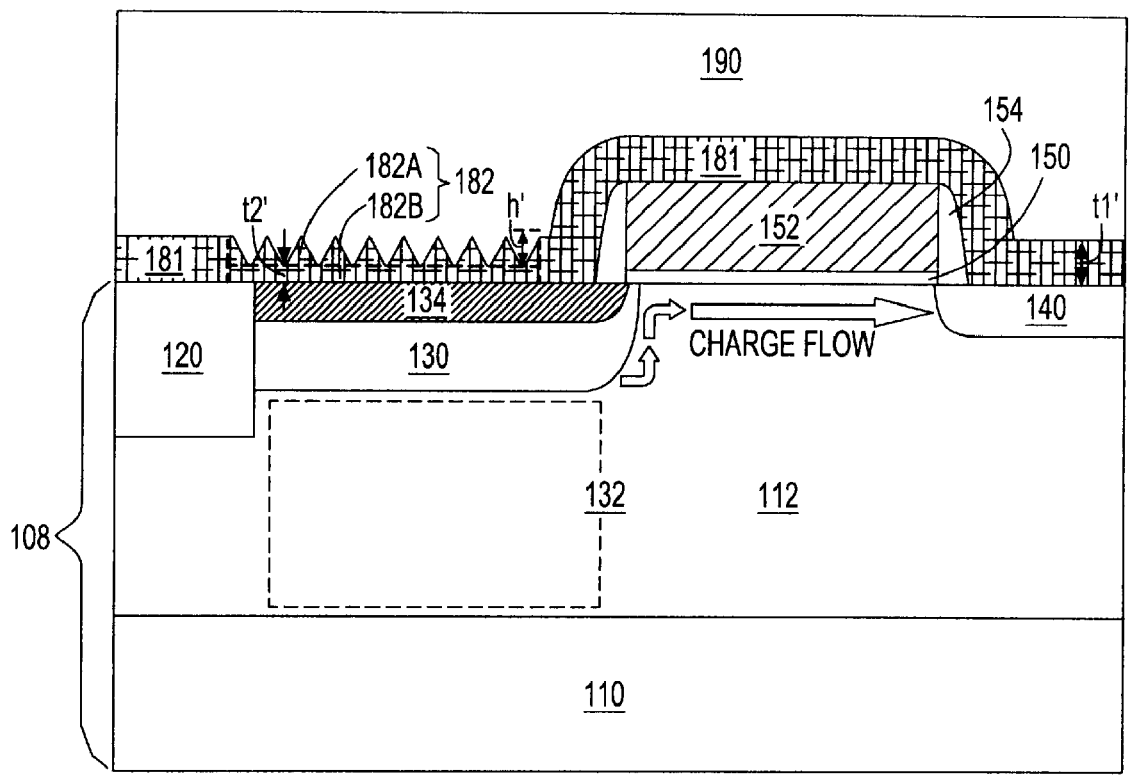
FIG. 22A is a second variation of the third exemplary semiconductor structure.

FIG. 22A is a second variation of the third exemplary semiconductor structure in which the optional intermediate dielectric layer 170 in FIG. 22 is omitted, so that the dielectric layer (181, 182) is formed directly on the surface pinning layer 134, the shallow trench isolation structure 120, the gate electrode 152, the gate spacer 154, and the floating drain 140. The area above the shallow trench isolation region 120 may have the protuberance-containing dielectric portion 182 or the flat dielectric portion 181. Preferably, the area above the shallow trench isolation region 120 has the flat dielectric portion 181.

Figure 23:
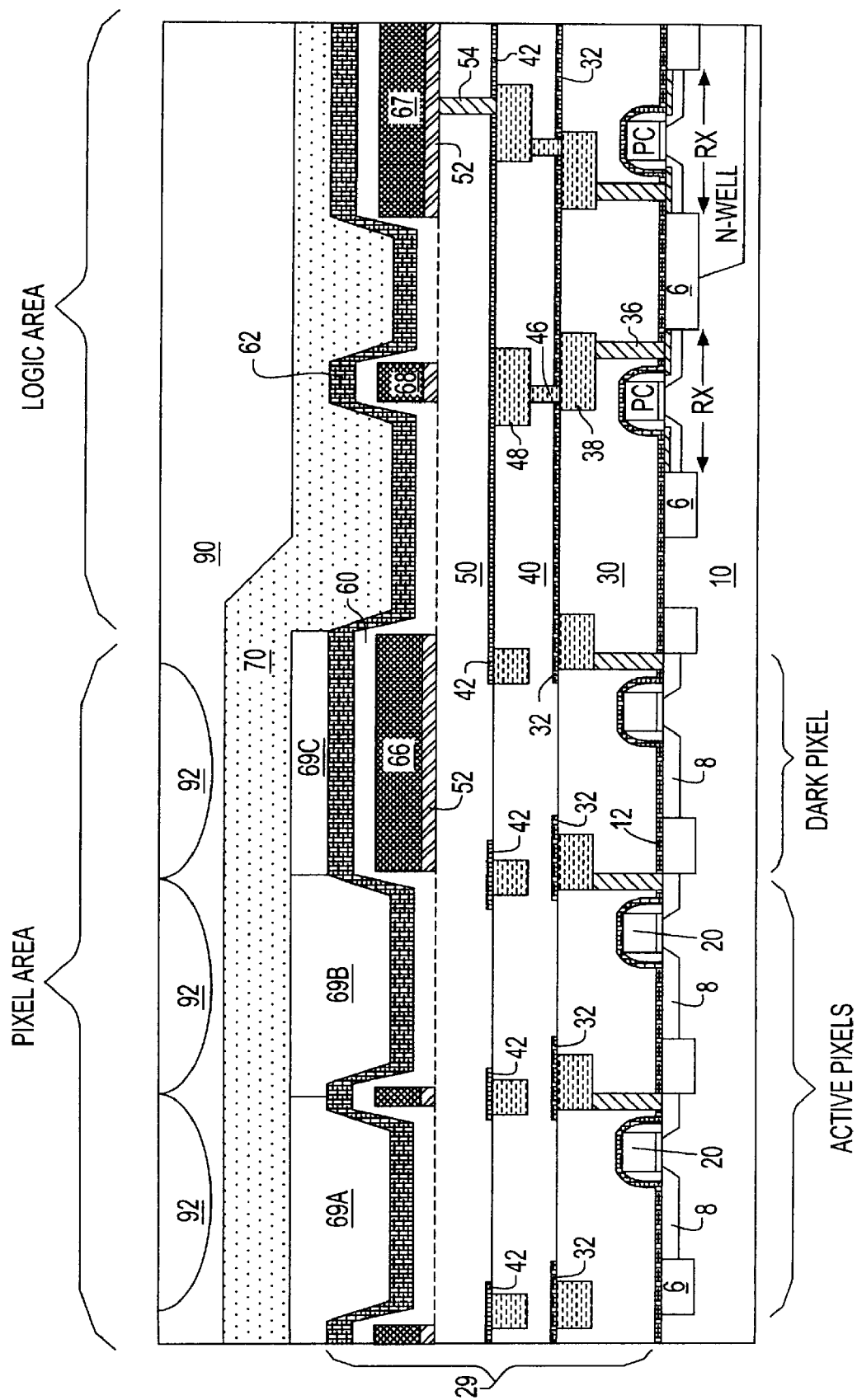
FIGS. 23-27 and 28 are sequential vertical cross-sectional views of a fourth exemplary semiconductor structure at various manufacturing stages according to a fourth embodiment of the present invention.

Referring to FIG. 23, a fourth exemplary semiconductor structure according to a fourth embodiment of the present invention comprises a semiconductor layer 10 and back-end-of-the-line (BEOL) structures 29 as in the first embodiment and/or the second embodiment. The fourth exemplary semiconductor structure comprises an exemplary CMOS image sensor unit cell, which comprises a pixel area and a logic area. The pixel area includes active pixels and a dark pixel. The logic area includes semiconductor devices constituting logic circuitry employed for the active pixels and the dark pixel. The structure of each pixel may be substantially the same as in the second embodiment with the difference being that the structure and the function of the optical lens 80, which is a convex-top flat-bottom lens located on a top surface of the dielectric passivation layer 70, are provided by an alternate lens system.

Specifically, a dielectric material layer 90 is formed over, or as an upper portion of, the dielectric passivation layer 70, and flat-top convex-bottom lenses 92 is formed embedded in the dielectric material layer 90 such that the flat top surfaces of the flat-top convex-bottom lenses 92 are substantially coplanar with the top surface of the dielectric material layer 90. The flat-top convex-bottom lenses 92 and the dielectric material layer 90 comprises an optically transparent dielectric material that may withstand the processing temperature employed during packaging, e.g., about 220° C. Non-limiting exemplary materials for the dielectric material layer 90 include acrylate, methacrylate, epoxy-acrylate, polyimide, and a combination thereof. Non-limiting exemplary materials for the flat-top convex-bottom lenses 92 include acrylate, methacrylate, epoxy-acrylate, polyimide, and a combination thereof. The combination of the materials for the dielectric material layer 90 and the flat-top convex-bottom lenses 92 is selected such that the refractive index of the flat-top convex-bottom lenses 92 is greater than the refractive index of the dielectric material layer 90. The dielectric material layer 90 has a planarized top surface, which may be effected by a spin-on coating or other planarization techniques.

Figure 24:
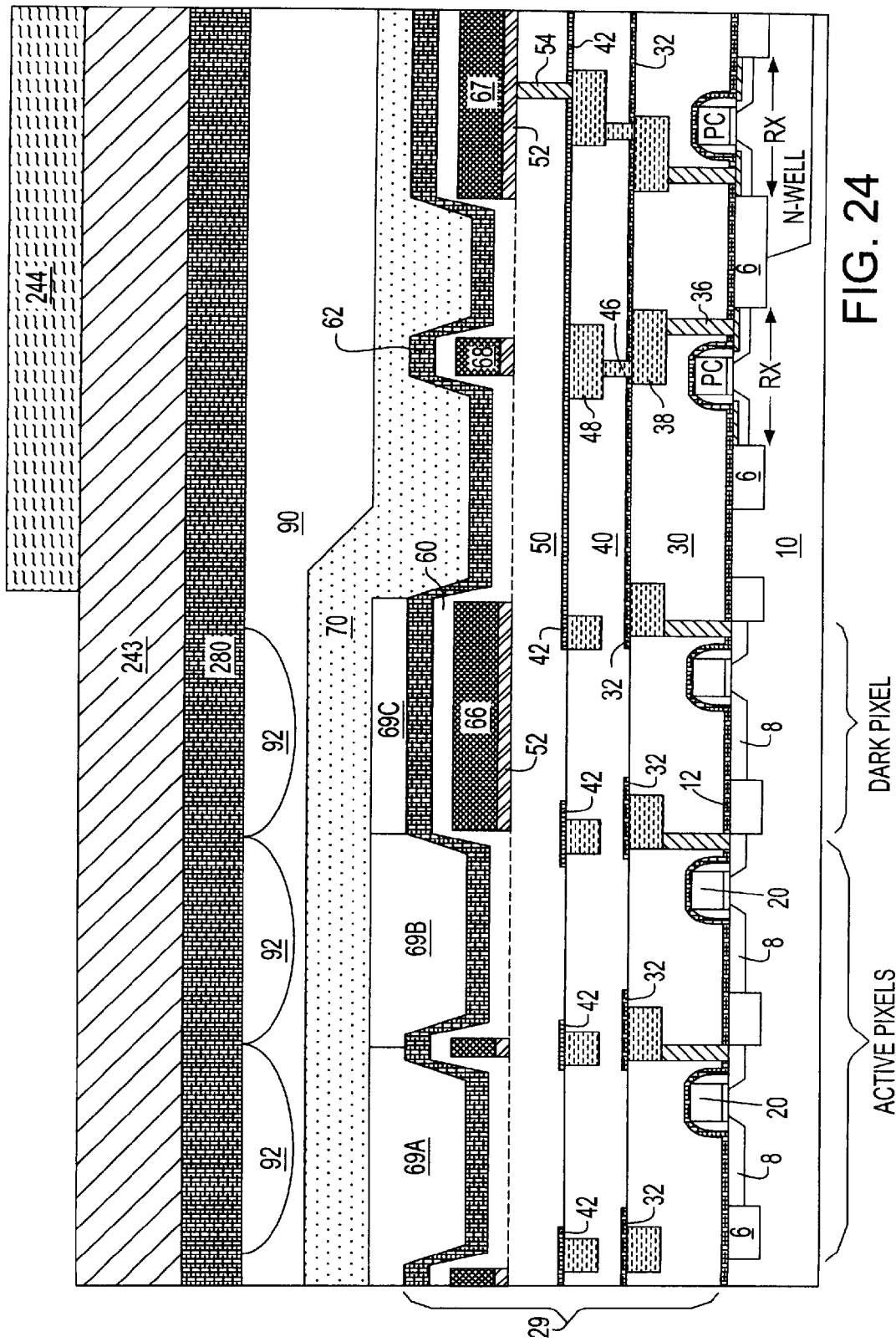

Referring to FIG. 24, a dielectric layer 280 is formed over the dielectric material layer 90. The dielectric layer 280 comprises an optically transparent dielectric material. Non-limiting exemplary materials for the dielectric layer 280 include acrylate, methacrylate, epoxy-acrylate, polyimide, and a combination thereof The thickness of the dielectric layer may be from about 40 nm to about 600 nm, although lesser and greater thickness are also contemplated herein.

A masking layer 243 is formed over the dielectric layer 280. The masking layer 43 may be a hard mask layer comprising a non-photosensitive dielectric material, a semiconductor material, or a metallic material. Alternately, the masking layer 243 may be a soft mask layer comprising a photoresist or a photosensitive dielectric material such as photosensitive polyimide. In case the masking layer 243 is a hard mask layer, a photoresist 244 is applied over the masking layer 243 and is lithographically patterned so that the logic area is covered by the photoresist 244, while the photoresist 244 is not present in the pixel area, i.e., a top surface of the masking layer 243 is exposed in the pixel area. In case the masking layer 243 comprises a soft mask layer, the masking layer 243 may be patterned directly. While the present invention is described for the case of a hard mask layer, variations of the present invention employing a soft mask layer is explicitly contemplated herein. The thickness of the masking layer 243 may be from about 40 nm to about 600 nm, and preferably from about 70 nm to about 300 nm, although lesser and greater thicknesses are also explicitly contemplated herein.

Figure 25:
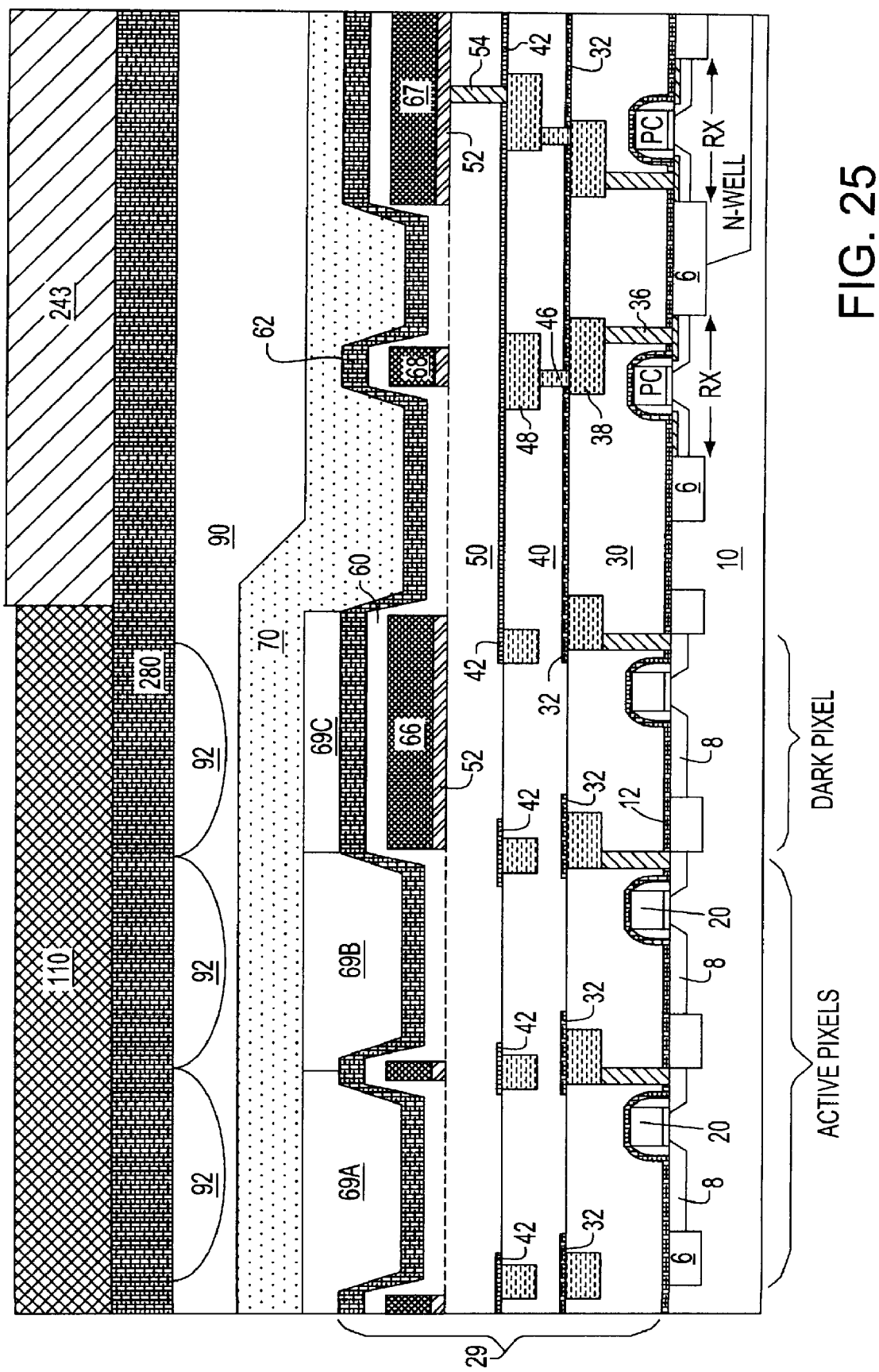

Referring to FIG. 25, the pattern in the photoresist 244 is transferred into the masking layer 243 by an etch, which may be a dry etch or a wet etch. The photoresist 244 is subsequently removed. After patterning, the masking layer 243 is present in the logic area and absent in the pixel area. A block copolymer layer 110 comprising self-assembling block copolymers that are capable of self-organizing into nanometer-scale patterns are applied over the exposed portions of the dielectric layer 280. The same materials may be employed for the block copolymer layer 110 in the second embodiment as in the first embodiment. The thickness of the block copolymer layer 110 may be from about 30 nm to about 600 nm, and preferably from about 60 nm to about 300 nm, although lesser and greater thicknesses are explicitly contemplated herein also. Preferably, the thickness of the block copolymer layer 110 is less than the thickness of the masking layer 43 so that the block copolymer layer 110 is present in the pixel area, and is absent in the logic area.

Figure 26:
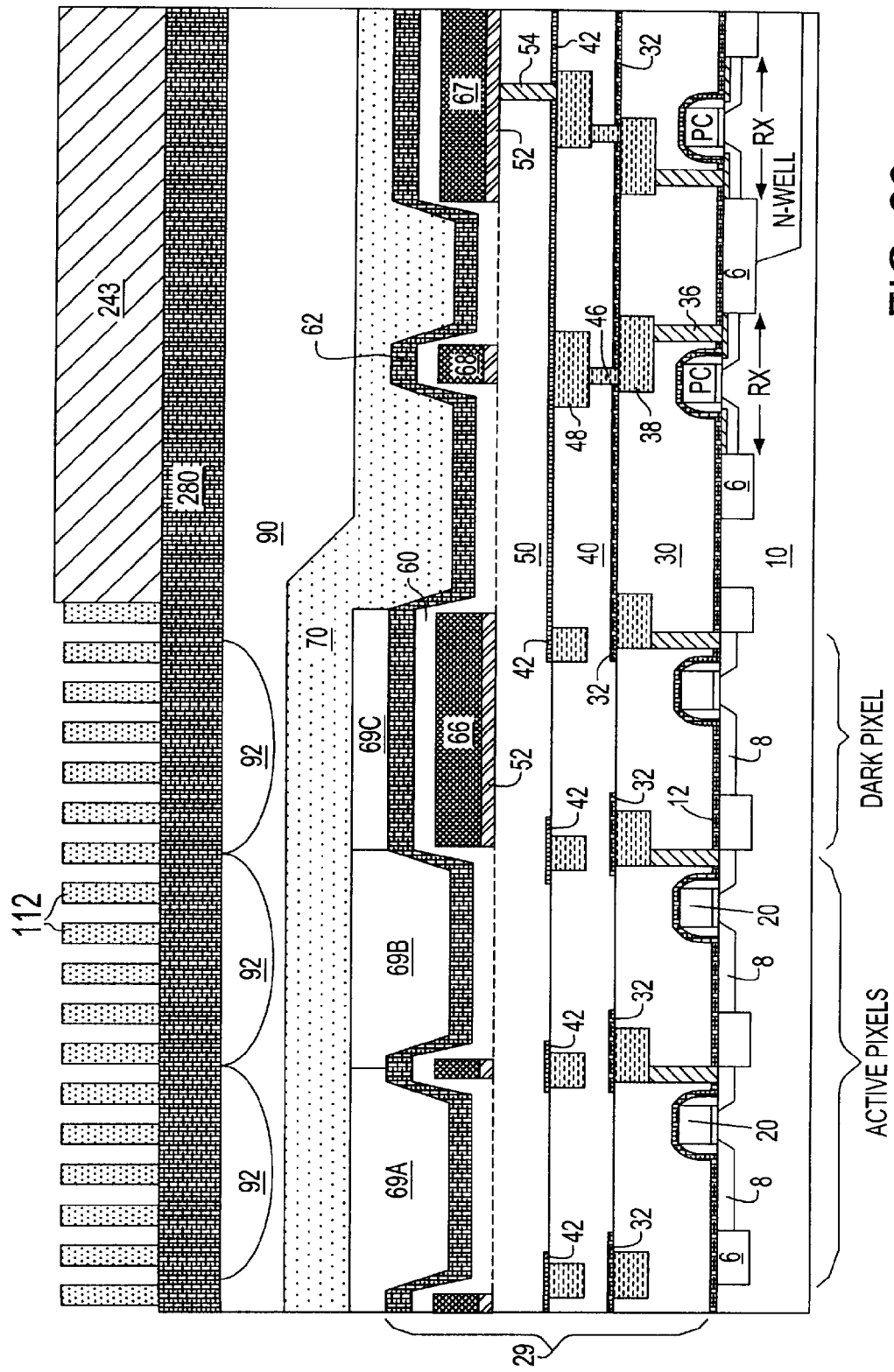

Referring to FIG. 26, the second exemplary semiconductor structure is annealed in the same manner as in the first embodiment. The anneal induces self-aligned separation of a first polymeric block component, which constitutes the polymeric block matrix 112, and a second polymeric block component, which constitutes the cylindrical polymeric blocks 111. The first polymeric block component and the second polymeric block component are immiscible with each other, and thus, separate into the two distinct types of structures, i.e., the polymeric block matrix 112 and the cylindrical polymeric blocks 111 upon the anneal. The polymeric block matrix 112 may have different horizontal cross-sectional shapes depending on the viscosity and composition of the components of the block copolymer layer 110. Typically, the polymeric block matrix 112 are arranged in a regular periodic array, i.e., in an array structure having a two dimensional periodicity such as a hexagonal array structure.

Figure 27:
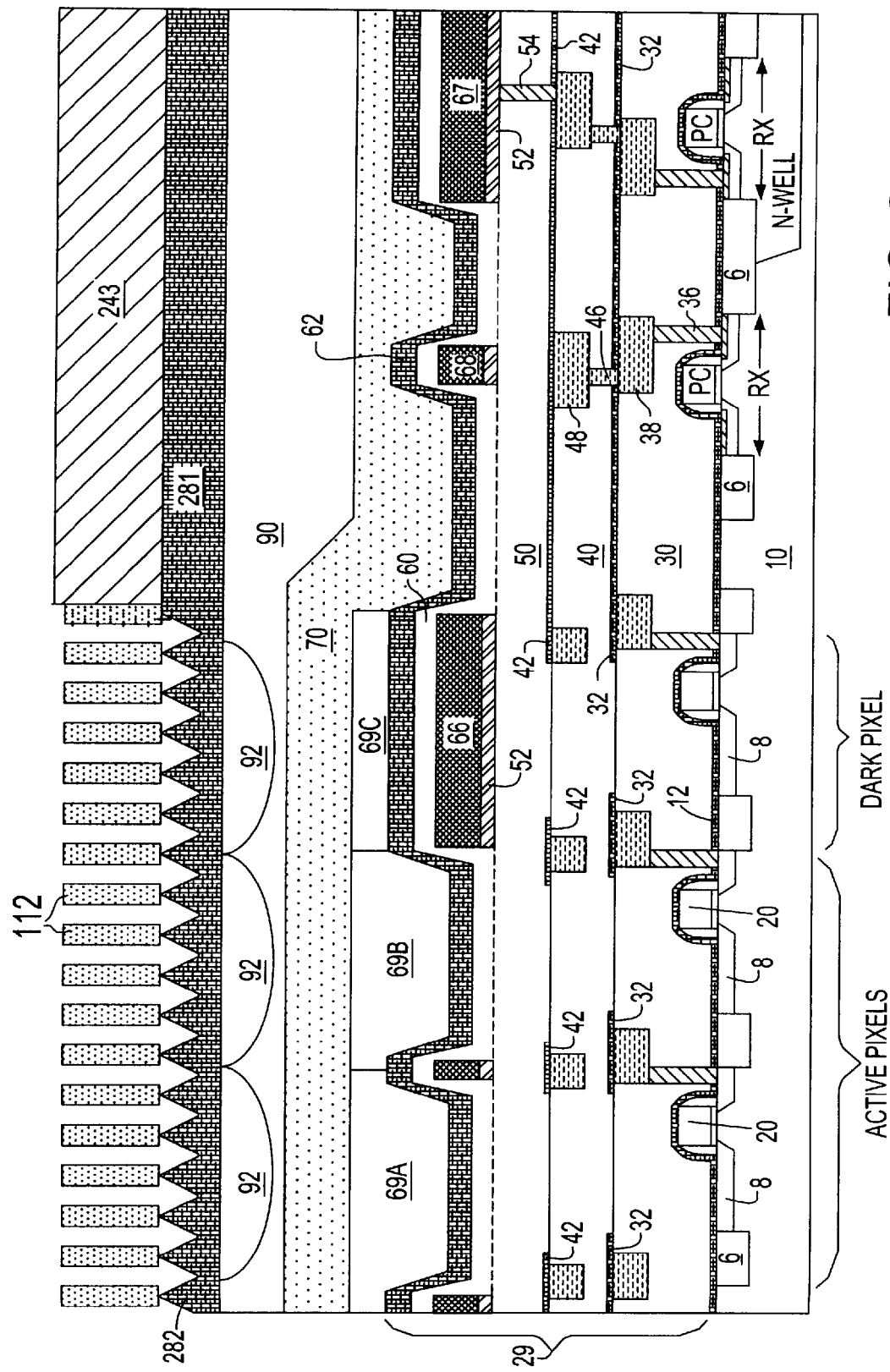

Referring to FIG. 27, the cylindrical polymeric blocks 111 is removed selective to the polymeric block matrix 112 by an etch, which may be a dry etch or a wet etch. The etch may be an isotropic etch or an anisotropic etch. The etch removes the second polymeric block component selective to the first polymeric block component. The etch may, or may not, be selective to the dielectric layer 280. The sidewalls of cavities in the polymeric block matrix 112 are exposed as well as portions of the dielectric layer 280 that do not underlie the polymeric block matrix 112.

Another etch that selectively removes the material of the dielectric layer 280 selective to the polymeric block matrix 112 is performed. An array of protuberances is formed underneath the polymeric block matrix 112, and has the same structural characteristics as the exemplary array of protuberances 101 in FIGS. 1A and 1D-1H. The remaining portion of the dielectric layer 280 in the pixel area constitutes a protuberance-containing dielectric portion 282. The portion of the dielectric layer 280 within the logic area is herein referred to as a flat dielectric portion 281. The protuberance-containing dielectric portion 282 and the flat dielectric portion 281 collectively constitute the dielectric layer 280.

Preferably, a pitch of the protuberances is less than 270 nm. If the pitch of the pattern of the polymeric block matrix 112 is sublithographic, the pitch of the array of the protuberances is also sublithographic, i.e., may be less than 50 nm and may scale down to a dimension less than the lithographic minimum dimension with the pitch of the pattern of the polymeric block matrix 112. A height of the cone in each of the protuberances may be from about 40 nm to about 480 nm. Each protuberance in the array of protuberances may have a shape of a cone having a monotonically decreasing cross-sectional area as a function of a vertical distance from a base of each protuberance. The array of protuberances may have a hexagonal symmetry with surfaces having a constant concave curvature. The array of protuberances has a shape of a block matrix with an array of cavities therein, in which each cavity has a shape of an inverted circular cone.

Figure 27A:
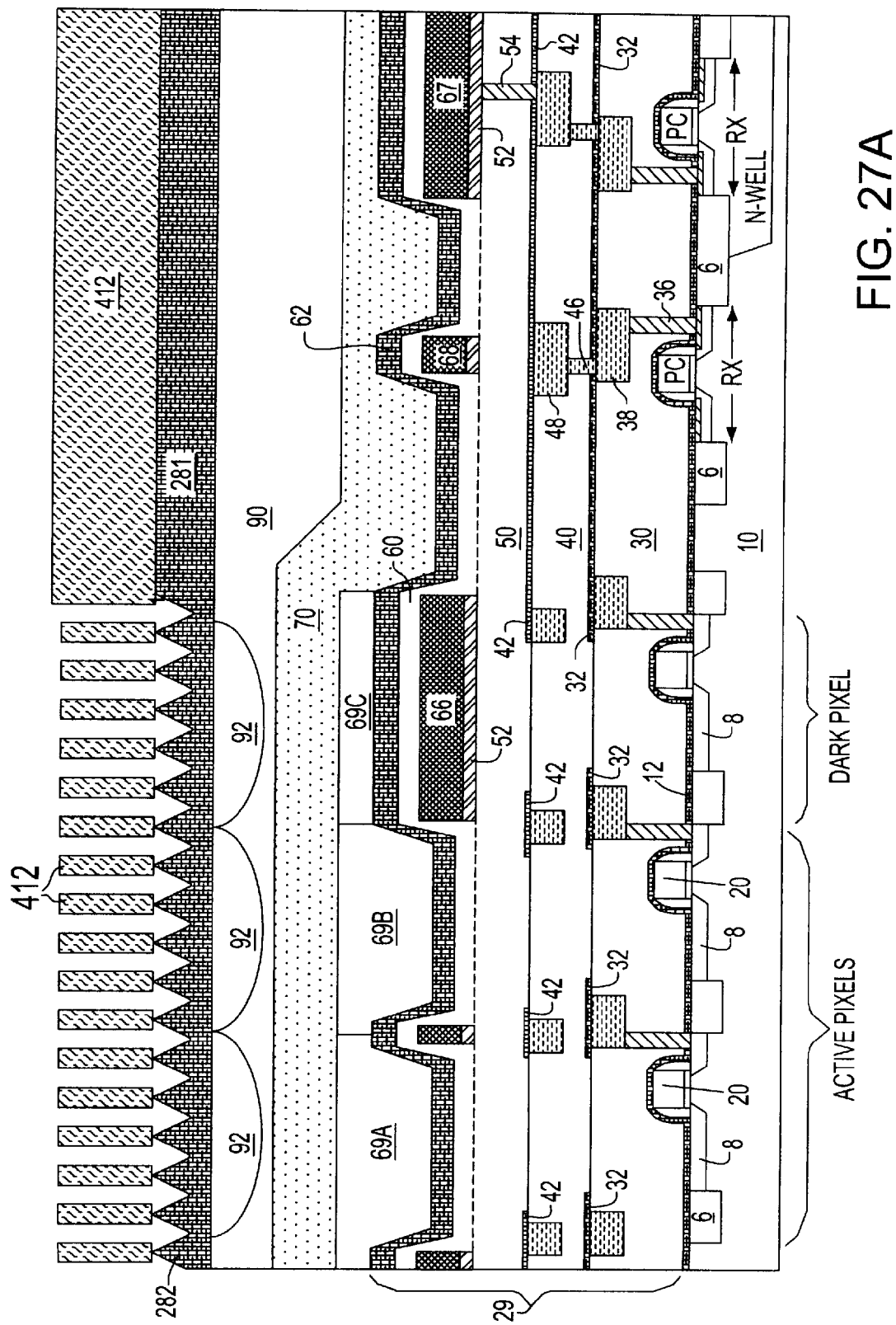
FIG. 27A is a first variation of the fourth exemplary semiconductor structure.

Alternately, an array of protuberances may be formed in the dielectric layer 280 by lithographic methods. FIG. 27A is a vertical cross-sectional view of a variation of the fourth exemplary semiconductor structure, in which a photoresist 412 is applied directly the dielectric layer 280 instead of a masking layer comprising a hard mask material. The photoresist 412 is patterned employing lithographic methods, and the dielectric layer 280 is etched selective to the photoresist 412, which functions as an etch mask. In this case, all lateral dimensions, including the pitch, of the array of protuberances are lithographic dimensions.

Figure 28:
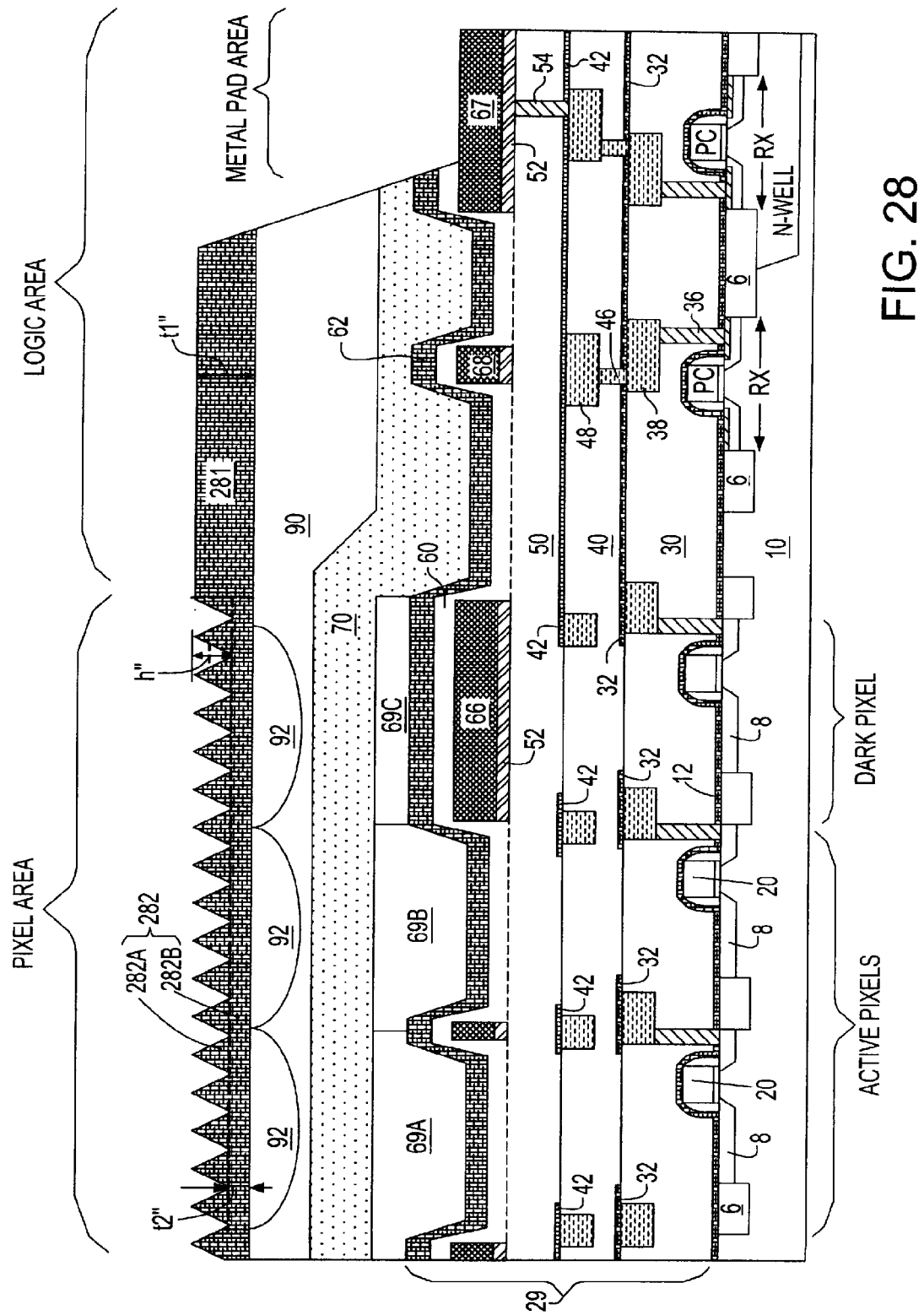

Referring to FIG. 28, the polymeric block matrix 112 or the photoresist 412 is removed selective to the material of the dielectric layer (281, 282), which comprises the flat dielectric portion 281 in the logic area and the protuberance-containing dielectric portion 282 in the pixel area. The protuberance-containing dielectric portion 282 comprises a constant thickness portion 282B and an array of protuberances 282A. The constant thickness portion 282B, the array of protuberances 282A, and the flat dielectric portion 281 may be of integral construction and have the same composition. The protuberance-containing dielectric portion 282 enhances transmission of light from the ambient, which the protuberance-containing dielectric portion 282 is exposed to and may be air or vacuum, to the dielectric material layer 90. The protuberance-containing dielectric portion 282 enhances transmission of light from the ambient to the flat-top convex-bottom lenses 92.

The flat dielectric portion 281 has a first thickness t1". Each of the protuberances in the array of protuberances 282A has a height h" from a base to an apex. The constant thickness portion 282B abuts each base of the array of protuberances 282A and has a second thickness t2". The first thickness t1" may be substantially equal to a sum of the second thickness t2" and the height h". The first thickness t1' may be from about 50 nm to about 600 nm, although lesser and greater thickness are also contemplated herein.

The transistors in the pixel area are of integral construction with the photodiode 8 as illustrated in the third exemplary semiconductor structure. The protuberance-containing dielectric portion 282 has an interface with an ambient gas or vacuum. The protuberance-containing dielectric portion 282 contains an array of protuberances having the same structure as the exemplary array of protuberances of FIGS. 1A and 1D-1H. A pitch of the array of protuberances may be less than 270 nm. The pitch may be a sub-lithographic dimension. The array may be a regular hexagonal array. The array of protuberances may have a hexagonal symmetry with surfaces having a constant concave curvature. The array of protuberances has a shape of a block matrix with an array of cavities therein, in which each cavity has a shape of an inverted circular cone. The height of the cone may be from about 40 nm to about 480 nm, and the first thickness may be from about 50 nm to about 600 nm.

An aluminum bond pad 67 is exposed in the logic area by removing the stack of the flat dielectric portion 281, the dielectric material layer 90, and the dielectric passivation layer 70, the M3 level dielectric cap layer 62, and the M3 level dielectric layer 60 within a metal pad area, i.e., an area including the aluminum metal pad 67. The aluminum metal pad 67 may be employed for wire bonding or C4 bonding.

Figure 28A:
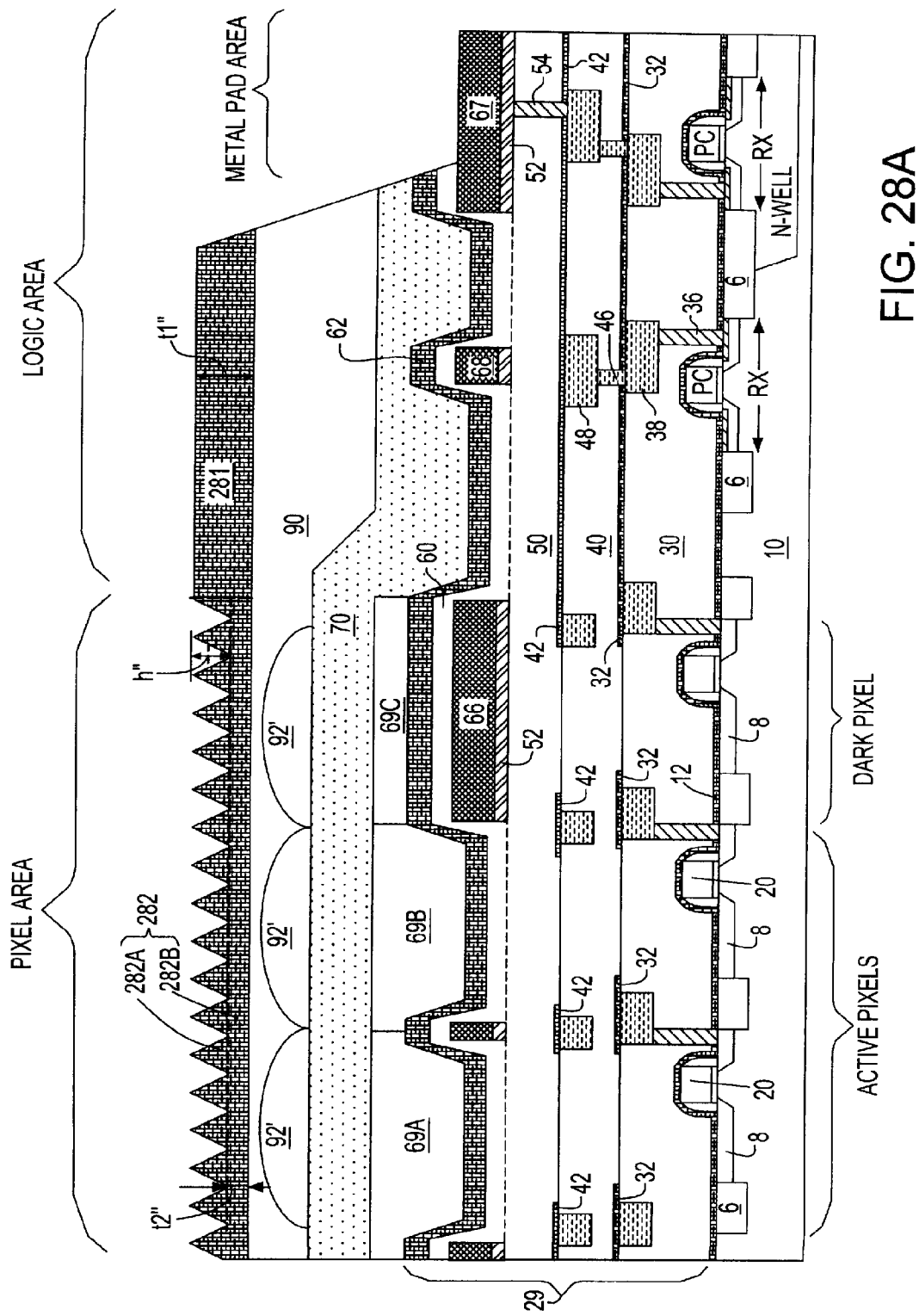
FIG. 28A is a second variation of the fourth exemplary semiconductor structure.

Referring to FIG. 28A, a second variation of the fourth exemplary semiconductor structure includes convex-top flat bottom lenses 92' instead of flat-top convex-bottom lenses 92 in FIG. 28. The flat bottom surfaces of the convex-top flat bottom lenses 92' vertically abut the top surfaces of the dielectric passivation layer 70. The convex-top flat bottom lenses 92' are separated from the dielectric layer (281, 282) by the dielectric material layer 90. The convex-top flat bottom lenses 92' provide the same function as the flat-top convex-bottom lenses 92 in FIG. 28, i.e., focusing incident light onto the photodiodes 8. The protuberance-containing dielectric portion 282 provides the same function as in the second exemplary semiconductor structure of FIG. 28, i.e., enhancing transmission of light between the ambient and the dielectric material layer 90.

Figure 29:
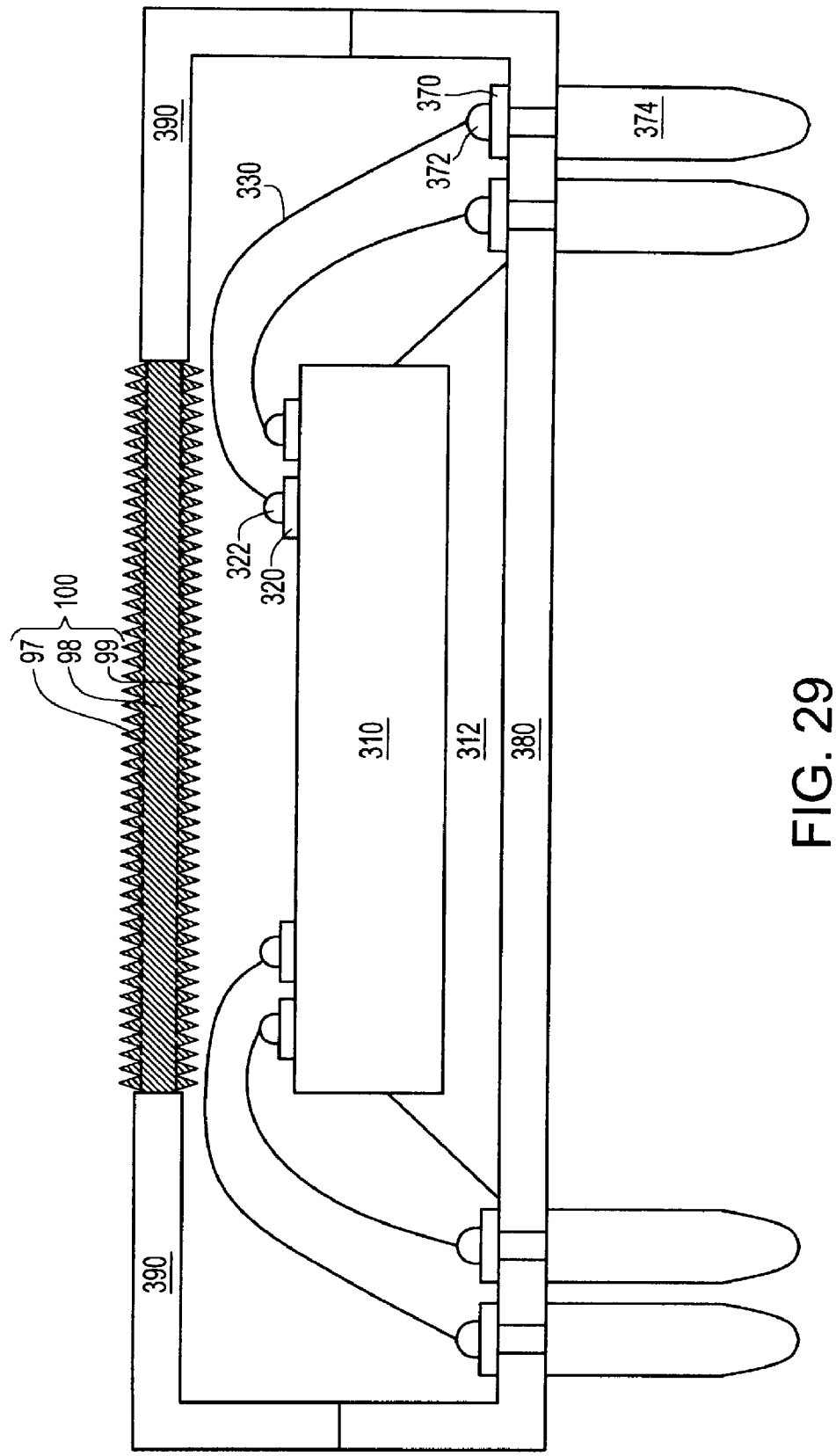
FIG. 29 is a vertical cross-sectional view of a fifth exemplary semiconductor structure according to the fifth embodiment of the present invention.

Referring to FIG. 29, a fifth exemplary semiconductor structure according to a fifth embodiment of the present invention comprises a semiconductor chip 310 mounted on a lower package housing 380 by an adhesive layer 312, which may comprise an epoxy. Package side bond pads 370 are located on the inside of the lower package housing 380, and package pins 374 are located on the outside of the lower package housing 380. Each of the package pins 374 is connected to one of the package side bond pads 370 through the lower package housing 380. One end of each of the bonding wires 330 is connected to one of the wire bond pads 320 through one of the ball bonds 322. The other end of each of the bonding wires 330 is connected to one of the package side bond pads 370 through a wedge bond 372, which tends to be larger than a ball bond 322. The wire bonding process employing a wedge bond 372 is called "wedge bonding." The bonding wires 330 are welded to the wedge bond 372 by a combination of heat, pressure, and/or ultrasonic energy as in ball bonding. The wire bond structures in the fifth exemplary semiconductor structure is for purposes of illustration only, and does not limit the scope of the present invention. The present invention may also be practiced in any other wire bond configuration employing different bonding technology.

An upper package housing comprises an upper package housing frame 390 and an optically transparent window 100 laterally surrounded by the upper package housing frame 390. The upper package housing frame 390, the optically transparent window 100, and the lower package housing 380 encapsulates the semiconductor chip 310 to provide protection from ambient environment and prevents oxidation or moisture ingress into the semiconductor chip 310. The chip package comprises the upper package housing frame 390, the optically transparent window 100, the lower package housing 380, the package side bond pads 370, and the package pins 374.

The optically transparent window 100 comprises a constant thickness portion 98, a first array of protuberances 97 located on a first surface of the constant thickness portion 98, and a second array of protuberances located on a second surface of the constant thickness portion 98. The constant thickness portion 98, the first array of protuberances 97, and the second array of protuberances are of integral construction, i.e., there is not any physically manifested interface between the constant thickness portion 98 and the first or second array of protuberances (97 or 99). The optically transparent window comprises an optically transparent material including, but not limited to, silicon oxide, silicon nitride, aluminum oxide, and any other optically transparent material.

Figure 30:
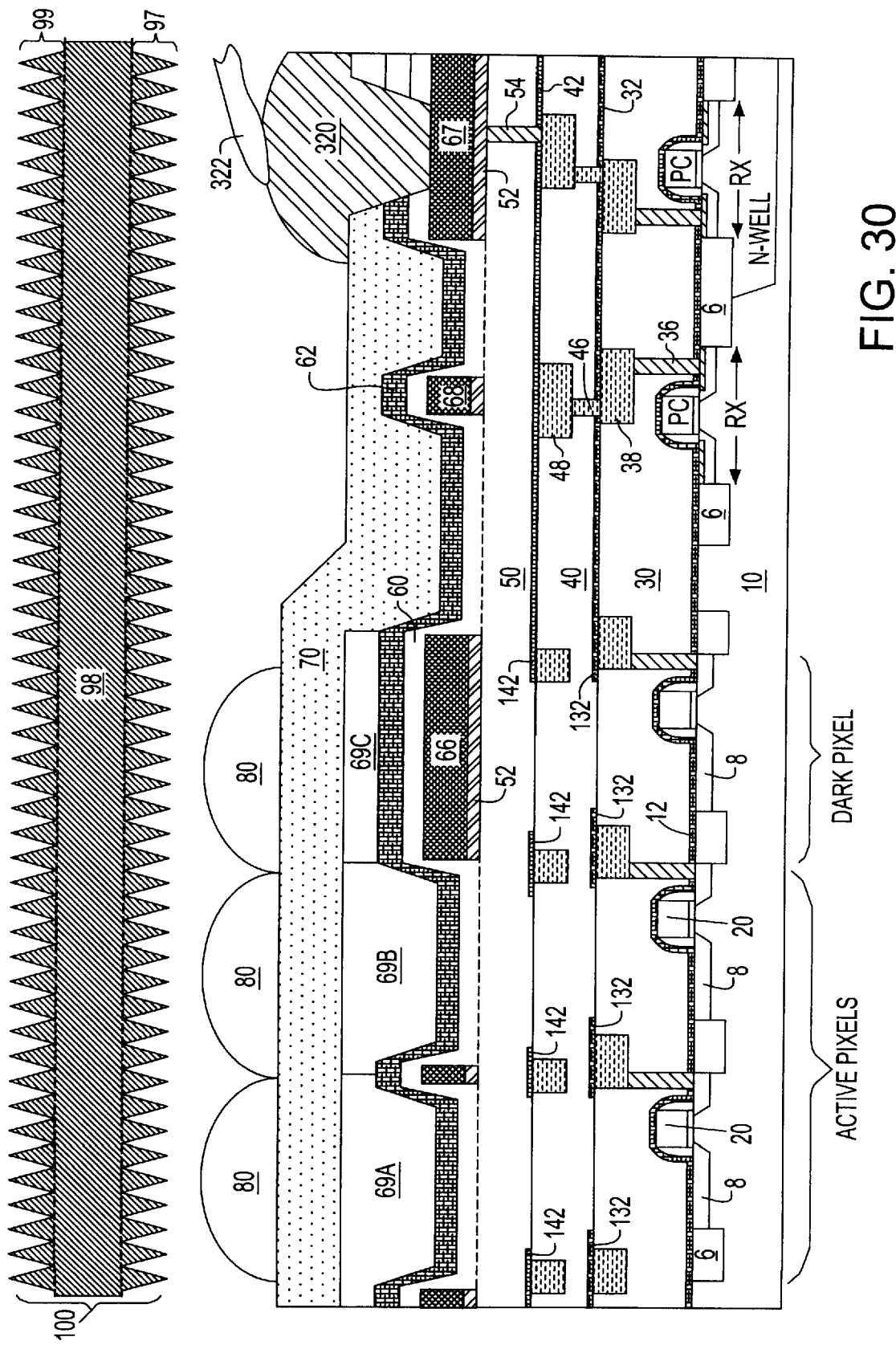
FIG. 30 is a magnified view of the fifth exemplary semiconductor structure.

FIG. 30 is a magnified view of the fifth exemplary semiconductor structure showing the elements contained in the semiconductor chip 310 and the optically transparent window 100. The semiconductor chip 310 may comprise any of the first through fourth exemplary semiconductor structure of the present invention described above.

Figure 31:
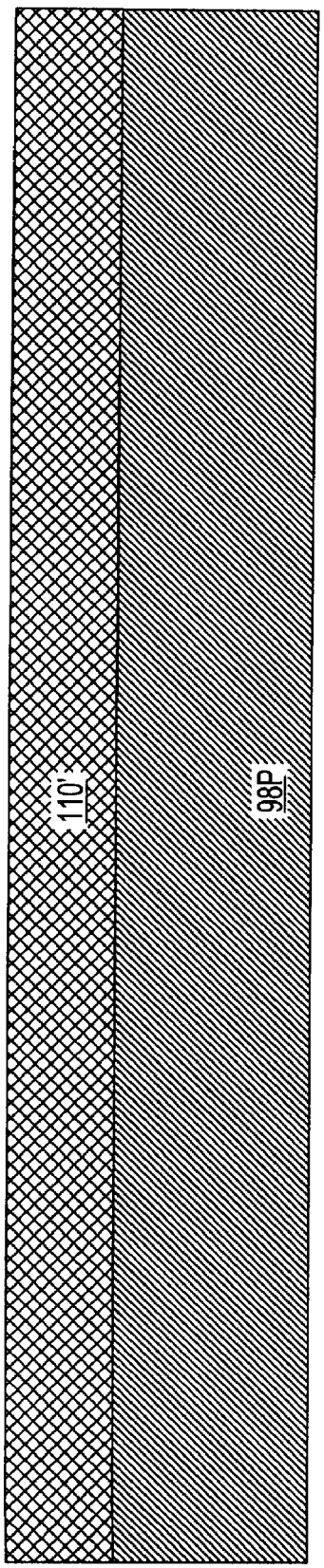
FIGS. 31-33, 34, 35, and 36 are sequential vertical cross-sectional views of an optically transparent window 100 according to the fifth embodiment of the present invention.

Referring to FIG. 31, an optically transparent window according to the present invention may be manufactured by applying a front side block copolymer layer 110' to an optically transparent layer 98P having a substantially constant thickness, a flat top surface, and a flat bottom surface. The front side block copolymer layer 110' comprises self-assembling block copolymers that are capable of self-organizing into nanometer-scale patterns are applied over the top surface of the optically transparent layer. The same materials may be employed for the front side block copolymer layer 110' in the fifth embodiment as in the block copolymer layer 110 in the first embodiment. The thickness of the front side block copolymer layer 110' may be from about 30 nm to about 600 nm, and preferably from about 60 nm to about 300 nm, although lesser and greater thicknesses are explicitly contemplated herein also.

Figure 32:
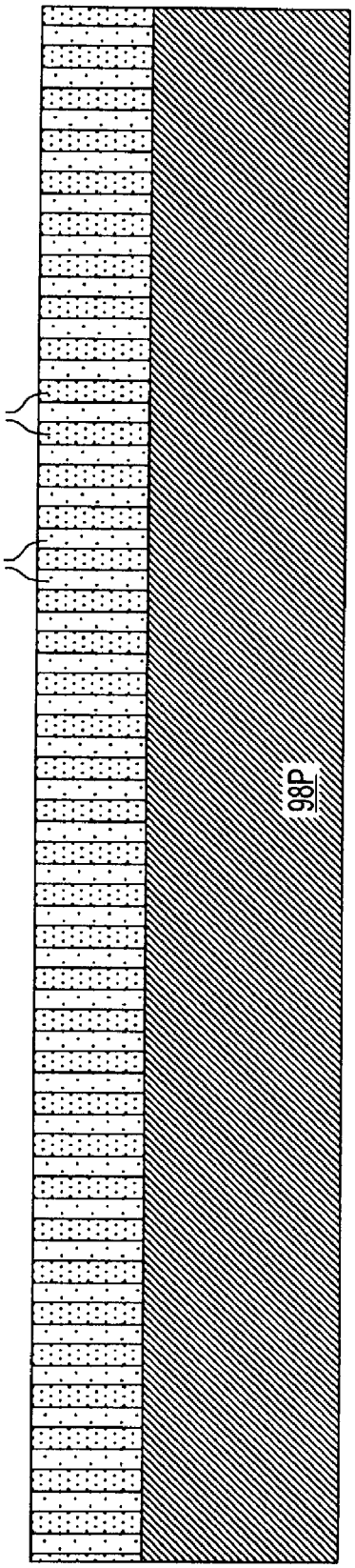

Referring to FIG. 32, the front side block copolymer layer 110' is annealed in the same manner as in the first embodiment. The anneal induces self-aligned separation of a first polymeric block component, which constitutes the polymeric block matrix 112', and a second polymeric block component, which constitutes the cylindrical polymeric blocks 111'. The first polymeric block component and the second polymeric block component are immiscible with each other, and thus, separate into the two distinct types of structures, i.e., the polymeric block matrix 112' and the cylindrical polymeric blocks 111' upon the anneal. The polymeric block matrix 112' may have different horizontal cross-sectional shapes depending on the viscosity and composition of the components of the block copolymer layer 110. Typically, the polymeric block matrix 112' are arranged in a regular periodic array, i.e., in an array structure having a two dimensional periodicity such as a hexagonal array structure.

Figure 33:
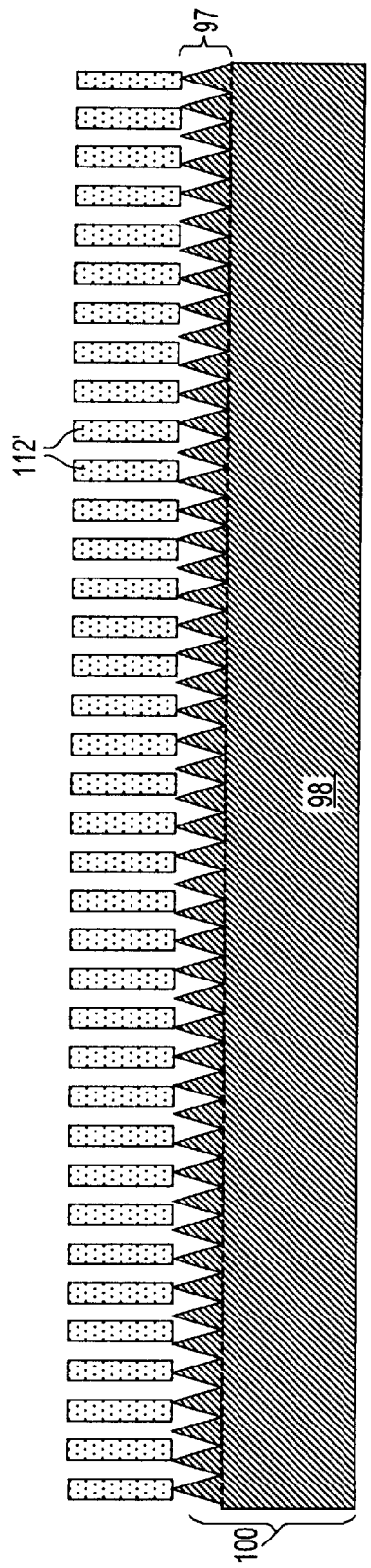

Referring to FIG. 33, the cylindrical polymeric blocks 111' is removed selective to the polymeric block matrix 112' by an etch, which may be a dry etch or a wet etch. The etch may be an isotropic etch or an anisotropic etch. The etch removes the second polymeric block component selective to the first polymeric block component. The etch may, or may not, be selective to the optically transparent layer 98P (See FIG. 32). The sidewalls of cavities in the polymeric block matrix 112' are exposed as well as portions of the optically transparent layer 98P that do not directly underlie the polymeric block matrix 112'.

Another etch that selectively removes the material of the optically transparent layer 98P, which may comprise, for example, silicon oxide, silicon nitride, or aluminum oxide, selective to the polymeric block matrix 112' is performed. The remaining portions of the optically transparent layer 98P constitute a constant thickness insulator portion 98 and a first array of protuberances 97. The remaining portions of the optically transparent layer 98P are herein collectively referred to as an optically transparent window 100. The first array of protuberances 97 is formed underneath the polymeric block matrix 112', and has the same structural characteristics as the exemplary array of protuberances 101 in FIGS. 1A and 1D-1H.

Figure 33A:
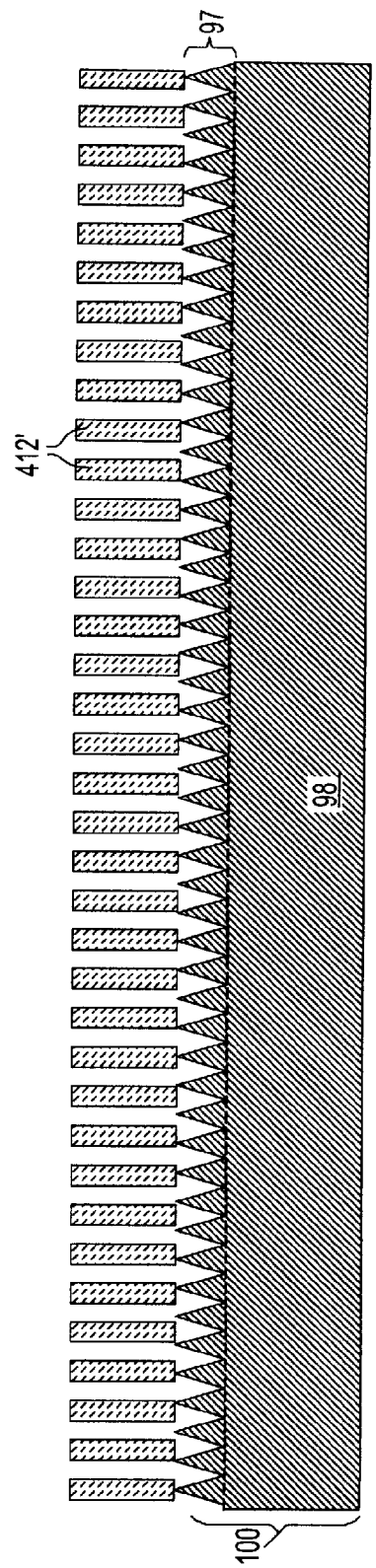
FIG. 33A shows a first variation of the fifth embodiment.

Preferably, a pitch of the first array of protuberances is less than 270 nm. If the pitch of the pattern of the polymeric block matrix 112' is sublithographic, the pitch of the array of the protuberances is also sublithographic, i.e., may be less than 50 nm and may scale down to a dimension less than the lithographic minimum dimension with the pitch of the pattern of the polymeric block matrix 112'. A height of the cone in each of the protuberances may be from about 40 nm to about 480 nm Alternately, a first array of protuberances may be formed in the optically transparent layer 98P by lithographic methods. FIG. 33A is a vertical cross-sectional view of a first variation of the fifth embodiment, in which a photoresist 412 is applied over the optically transparent layer 98P at a processing step corresponding to FIG. 31 instead of the front side block copolymer layer 110'. The photoresist 412 is patterned employing lithographic methods, and the optically transparent layer 98P is etched selective to the photoresist 412, which functions as an etch mask. In this case, all lateral dimensions, including the pitch, of the array of protuberances are lithographic dimensions.

Figure 34:
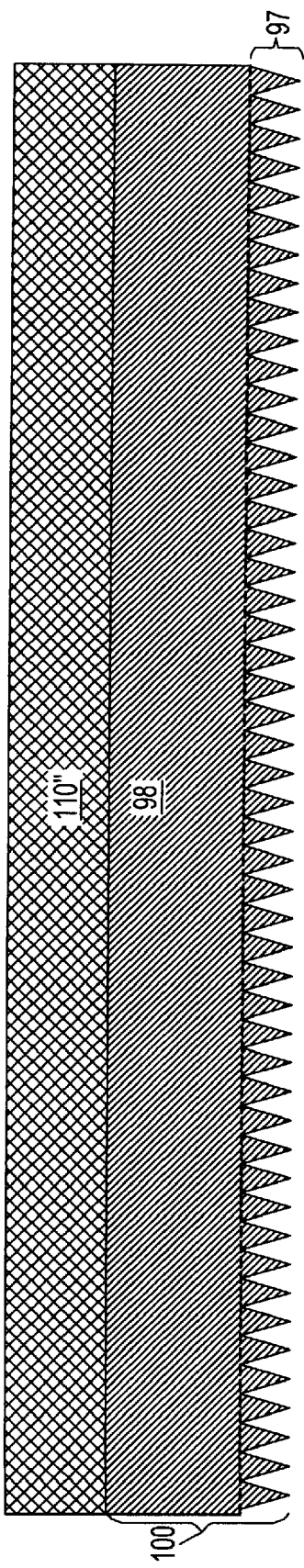

Referring to FIG. 34, the polymeric block matrix 112' or the photoresist 412 is removed selective to the material of the optically transparent window 100. The optically transparent window 100 is flipped around so that the back side surface, which is a flat surface, of the optically transparent window 100 faces upward, and is substantially level. A back side block copolymer layer 110" is applied to the back side surface of the optically transparent window 100. The back side block copolymer layer 110" comprises self-assembling block copolymers that are capable of self-organizing into nanometer-scale patterns are applied over the top surface of the optically transparent layer. The same materials may be employed for the back side block copolymer layer 110" in the fifth embodiment as in the block copolymer layer 110 in the first embodiment. The thickness of the back side block copolymer layer 110" may be from about 30 nm to about 600 nm, and preferably from about 60 nm to about 300 nm, although lesser and greater thicknesses are also explicitly contemplated herein.

Figure 35:
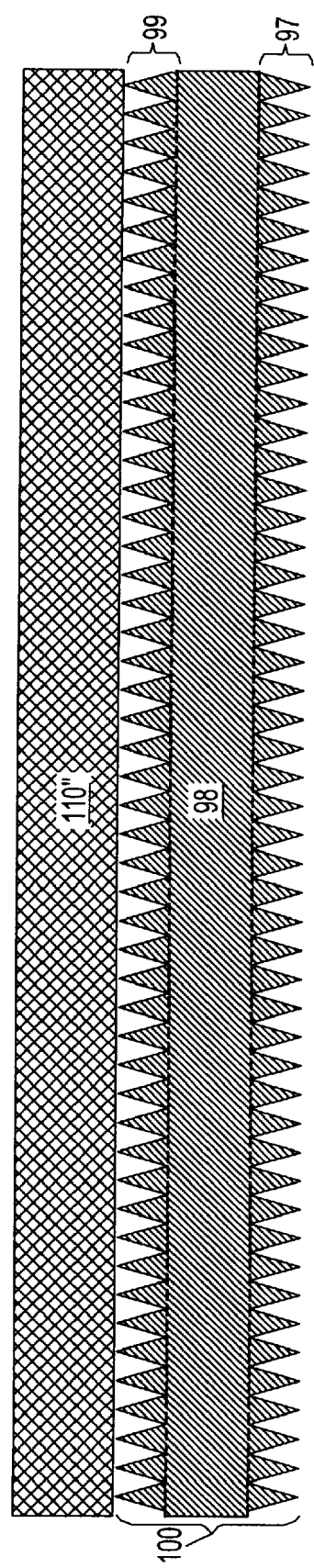

Referring to FIG. 35, the same processing steps may be employed as the processing steps corresponding to FIGS. 32 and 33 so that the sidewalls of the polymeric block matrix 112" are exposed by an etch that removes cylindrical polymeric blocks (not shown). The polymeric block matrix 112" are formed from the back side block copolymer layer 110". Portions of the back side surface of the optically transparent window 100 that do not underlie the polymeric block matrix 112 are also exposed.

Another etch that selectively removes the material of the optically transparent window 100 selective to the polymeric block matrix 112" is performed. A sub-portion of the constant thickness portion 98 becomes a second array of protuberances 99, which underlie the polymeric block matrix 112". The second array of protuberances 99 has the same structural characteristics as the exemplary array of protuberances 101 in FIGS. 1A and 1D-1H.

Figure 35A:
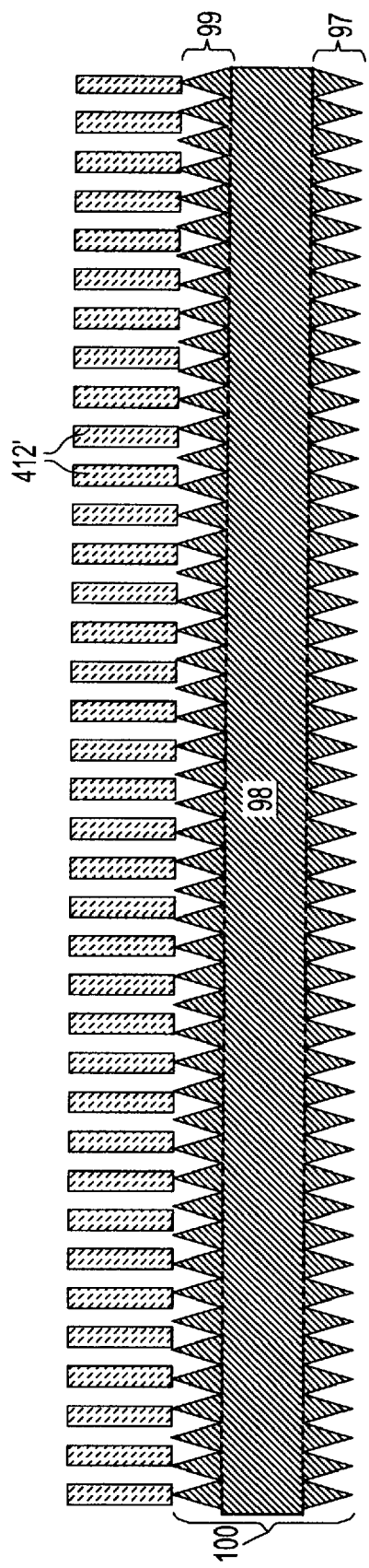
FIG. 35A shows a second variation of the fifth embodiment.

Preferably, a pitch of the second array of protuberances is less than 270 nm. If the pitch of the pattern of the polymeric block matrix 112" is sublithographic, the pitch of the array of the protuberances is also sublithographic, i.e., may be less than 50 nm and may scale down to a dimension less than the lithographic minimum dimension with the pitch of the pattern of the polymeric block matrix 112". A height of the cone in each of the protuberances may be from about 40 nm to about 480 nm Alternately, a second array of protuberances may be formed in the optically transparent layer 98P by lithographic methods. FIG. 35A is a vertical cross-sectional view of a second variation of the fifth embodiment, in which a photoresist 412' is applied over the back side surface of the optically transparent window 100 at a processing step corresponding to FIG. 34 instead of the back side block copolymer layer 110'. The photoresist 412' is patterned employing lithographic methods, and the back side surface of the optically transparent window 100 is etched selective to the photoresist 412', which functions as an etch mask. In this case, all lateral dimensions, including the pitch, of the array of protuberances are lithographic dimensions.

Figure 36:
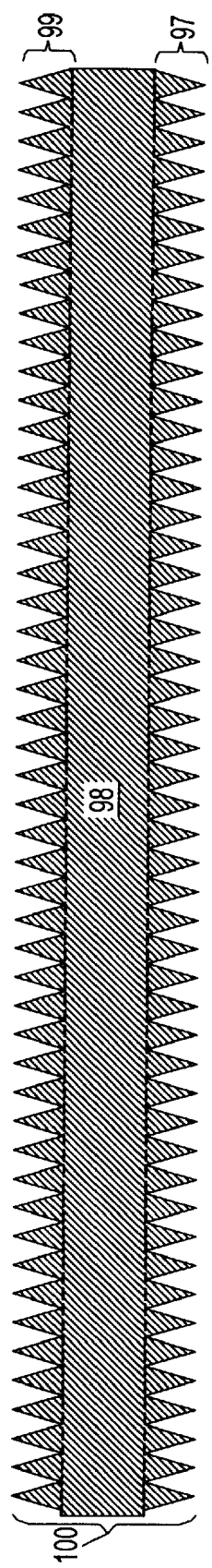

Referring to FIG. 36, the polymeric block matrix 112" or the photoresist 412' is removed selective to the material of the optically transparent window 100. The optically transparent window 100 comprises the constant thickness portion 98, the first array of protuberances 97, and the second array of protuberances 99. The optically transparent window 100 is mounted on a package housing to form the fifth exemplary semiconductor structure of FIG. 29. The first and second arrays of protuberance (97, 99) provide high transmission through the optically transparent window 100. In case the optically transparent window 100 comprises silicon oxide, the transmission coefficient at the interface between the optically transparent window 100 of the present invention may exceed 99% at each interface with air, whereas a conventional window comprising silicon oxide has a transmission coefficient of about 96.5% at each interface with the air.

Figure 37:
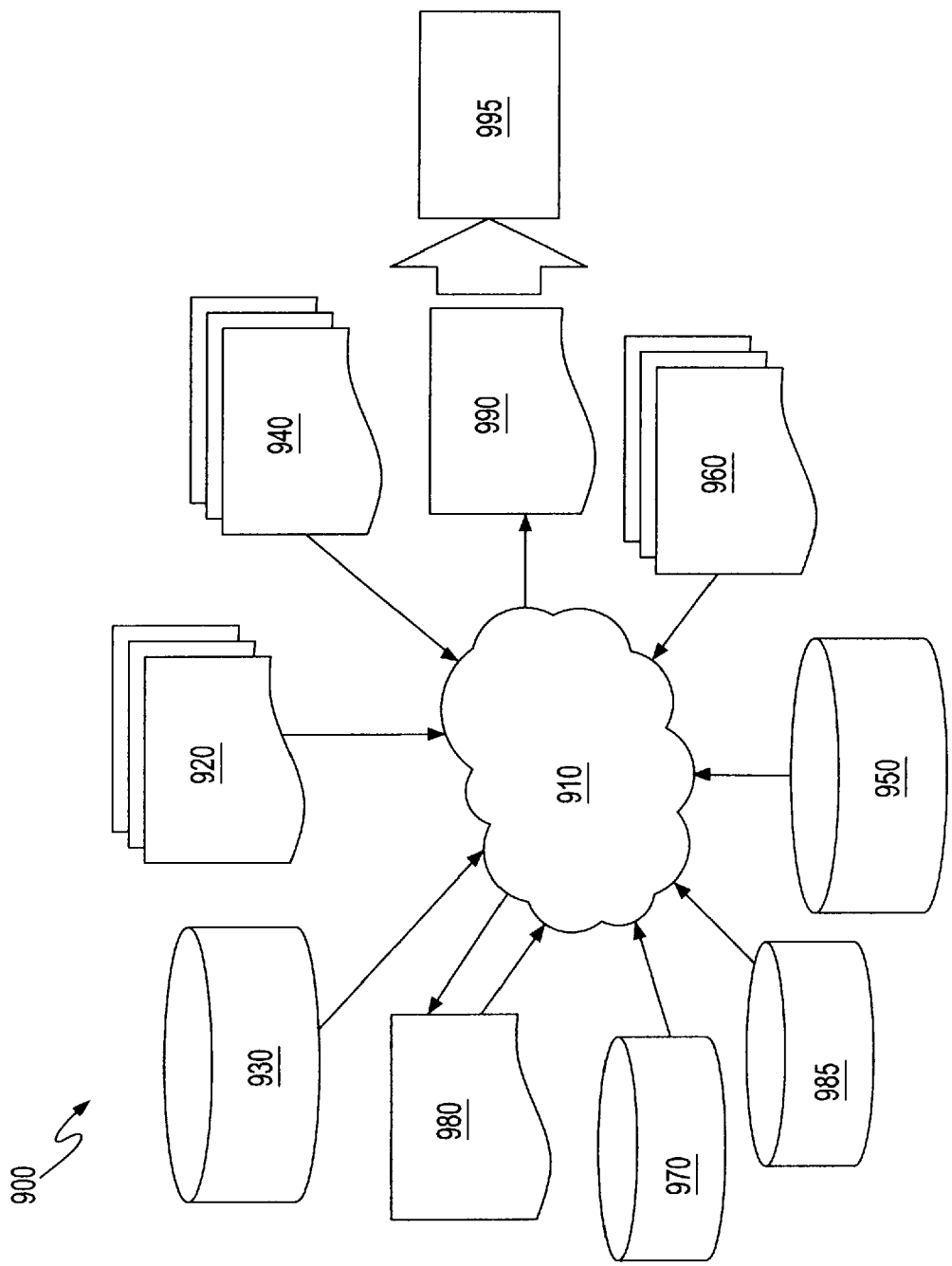
FIG. 37 is a flow diagram of a design process used in semiconductor design and manufacture according to the present invention.

The first through fourth embodiments of the present invention may be incorporated into a semiconductor design by specifying the area in which an array of protuberances is to be formed. FIG. 37 shows a block diagram of an exemplary design flow 900 used for example, in semiconductor design and manufacturing. Design flow 900 may vary depending on the type of IC being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention, i.e., one of first through fourth embodiments or a combination thereof, in the form of schematics or HDL, hardware description language (e.g. Verilog, VHDL, C, etc.) The design structure 920 may be contained on one or more machine readable medium. For example, design structure 920 may be a text file or a graphical representation of an embodiment of the invention that specifies an area in which an array of protuberances is to be formed.

Design process 910 preferably synthesizes (or translates) an embodiment of the invention into a netlist 980, where the netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIG. 2, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 comprises information specifying an area in which an array of protuberances of the present invention is to be formed. Design structure 990 may further comprise information such as, for example, symbolic data, map files, test data files, design content files, manufacturing data, layout parameters, wires, levels of metal, vias, shapes, data for routing though the manufacturing line, and any other data required by a semiconductor manufacturer to produce an embodiment of the invention. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a photodiode located on a first surface of a semiconductor layer;
   a metal interconnect layer located on said first surface of said semiconductor layer; and
   an insulator layer located on a second surface of said semiconductor layer, wherein said second surface is located on an opposite side of said first surface, and wherein said insulator layer includes an array of protuberances at an interface with an ambient gas or vacuum, wherein a pitch of said protuberances is less than 270 nm.

2. The semiconductor structure of claim 1, wherein said pitch is a sub-lithographic dimension.

3. The semiconductor structure of claim 1, wherein said array is a regular hexagonal array.

4. The semiconductor structure of claim 1, further comprising:
   a transistor located directly on said first surface of said semiconductor layer, wherein a source of said transistor is of integral construction with said photodiode; and
   a shallow trench isolation region abutting said first surface of said semiconductor layer.

5. The semiconductor structure of claim 1, wherein each of said array of protuberances has a shape of a cone having a monotonically decreasing cross-sectional area as a function of a vertical distance from a base of said cone, and wherein a height of said cone is from about 40 nm to about 480 nm.

6. The semiconductor structure of claim 1, wherein said semiconductor layer comprises silicon and said insulator layer comprise silicon oxide, and wherein a total height of said insulator layer including said array of protuberances is from about 100 nm to about 2,000 nm.

7. A semiconductor structure comprising:
   a photodiode located on a first surface of a semiconductor layer;
   a metal interconnect layer located on said first surface of said semiconductor layer; and
   an insulator layer located on a second surface of said semiconductor layer, wherein said second surface is located on an opposite side of said first surface, said insulator layer includes an array of protuberances at an interface with an ambient gas or vacuum, and said array is a regular hexagonal array.

8. The semiconductor structure of claim 7, wherein a pitch of said protuberances is a sub-lithographic dimension.

9. The semiconductor structure of claim 7, further comprising:
   a transistor located directly on said first surface of said semiconductor layer, wherein a source of said transistor is of integral construction with said photodiode; and
   a shallow trench isolation region abutting said first surface of said semiconductor layer.

10. The semiconductor structure of claim 7, wherein each of said array of protuberances has a shape of a cone having a monotonically decreasing cross-sectional area as a function of a vertical distance from a base of said cone, and wherein a height of said cone is from about 40 nm to about 480 nm.

11. The semiconductor structure of claim 7, wherein said semiconductor layer comprises silicon and said insulator layer comprise silicon oxide, and wherein a total height of said insulator layer including said array of protuberances is from about 100 nm to about 2,000 nm.

12. A semiconductor structure comprising:
   a photodiode located on a first surface of a semiconductor layer;
   a metal interconnect layer located on said first surface of said semiconductor layer; and
   an insulator layer located on a second surface of said semiconductor layer, wherein said second surface is located on an opposite side of said first surface, said insulator layer includes an array of protuberances at an interface with an ambient gas or vacuum, and wherein each of said array of protuberances has a shape of a cone having a monotonically decreasing cross-sectional area as a function of a vertical distance from a base of said cone, and said cone has a height from about 40 nm to about 480 nm.

13. The semiconductor structure of claim 12, wherein a pitch of said protuberances is a sub-lithographic dimension.

14. The semiconductor structure of claim 12, wherein said array is a regular hexagonal array.

15. The semiconductor structure of claim 12, further comprising:
   a transistor located directly on said first surface of said semiconductor layer, wherein a source of said transistor is of integral construction with said photodiode; and
   a shallow trench isolation region abutting said first surface of said semiconductor layer.

16. The semiconductor structure of claim 12, wherein said semiconductor layer comprises silicon and said insulator layer comprise silicon oxide, and wherein a total height of said insulator layer including said array of protuberances is from about 100 nm to about 2,000 nm.

\* \* \* \* \*